(12) United States Patent
Lin et al.

(10) Patent No.: US 12,096,681 B2
(45) Date of Patent: *Sep. 17, 2024

(54) ORGANIC ELECTROLUMINESCENT MATERIALS AND DEVICES

(71) Applicant: UNIVERSAL DISPLAY CORPORATION, Ewing, NJ (US)

(72) Inventors: Chun Lin, Yardley, PA (US); Nicholas J. Thompson, Trenton, NJ (US); Jerald Feldman, Wilmington, DE (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/359,557

(22) Filed: Jul. 26, 2023

(65) Prior Publication Data

US 2023/0389410 A1  Nov. 30, 2023

Related U.S. Application Data

(63) Continuation of application No. 16/774,654, filed on Jan. 28, 2020, now Pat. No. 11,765,970, which is a
(Continued)

(51) Int. Cl.
*H10K 85/30* (2023.01)
*C09K 11/06* (2006.01)
(Continued)

(52) U.S. Cl.
CPC ............ *H10K 85/346* (2023.02); *C09K 11/06* (2013.01); *H10K 85/30* (2023.02); *H10K 85/342* (2023.02);
(Continued)

(58) Field of Classification Search
None
See application file for complete search history.

(56) References Cited

U.S. PATENT DOCUMENTS 4,769,292 A   9/1988 Tang et al.
5,061,569 A   10/1991 VanSlyke et al.
(Continued)

FOREIGN PATENT DOCUMENTS

CN   105895820   8/2016
EP   0650955   5/1995
(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).
(Continued)

*Primary Examiner* — Jay Yang
(74) *Attorney, Agent, or Firm* — DUANE MORRIS LLP

(57) ABSTRACT

An OLED is disclosed whose emissive layer has a first host and an emitter, where the emitter is a phosphorescent metal complex or a delayed fluorescent emitter, where $E_{H1T}$, the $T_1$ triplet energy of the first host, is higher than $E_{ET}$, the $T_1$ triplet energy of the emitter, where $E_{ET}$ is at least 2.50 eV, where the LUMO energy of the first host is higher than the HOMO energy of the emitter, where the absolute value of the difference between the HOMO energy of the emitter and the LUMO energy of the first host is $\Delta E1$, where $a \leq \Delta E1 - E_{ET} \leq b$; and where $a \geq 0.05$ eV, and $b \leq 0.60$ eV.

20 Claims, 15 Drawing Sheets

Related U.S. Application Data continuation-in-part of application No. 16/037,167, filed on Jul. 17, 2018, now Pat. No. 11,228,010.

(60) Provisional application No. 62/537,029, filed on Jul. 26, 2017.

(51) Int. Cl.
*H10K 85/40* (2023.01)
*H10K 85/60* (2023.01)
*H10K 50/11* (2023.01)
*H10K 101/00* (2023.01)
*H10K 101/10* (2023.01)
*H10K 101/30* (2023.01)

(52) U.S. Cl.
CPC ........... *H10K 85/40* (2023.02); *H10K 85/626* (2023.02); *H10K 85/631* (2023.02); *H10K 85/654* (2023.02); *H10K 85/657* (2023.02); *H10K 85/6572* (2023.02); *H10K 85/6576* (2023.02); *C09K 2211/1077* (2013.01); *C09K 2211/185* (2013.01); *H10K 50/11* (2023.02); *H10K 2101/10* (2023.02); *H10K 2101/30* (2023.02); *H10K 2101/90* (2023.02)

(56) References Cited

U.S. PATENT DOCUMENTS

| | | |
|---|---|---|
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,528,187 B1 | 3/2003 | Okada |
| 6,687,266 B1 | 2/2004 | Ma et al. |
| 6,835,469 B2 | 12/2004 | Kwong et al. |
| 6,921,915 B2 | 7/2005 | Takiguchi et al. |
| 7,087,321 B2 | 8/2006 | Kwong et al. |
| 7,090,928 B2 | 8/2006 | Thompson et al. |
| 7,154,114 B2 | 12/2006 | Brooks et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 10,147,898 B2 | 12/2018 | Tang |
| 11,765,970 B2 * | 9/2023 | Lin .................... H10K 85/631 |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0015006 A1 | 7/2007 | Lee |
| 2007/0190359 A1 | 8/2007 | Knowles et al. |
| 2007/0278937 A1 | 12/2007 | Forrest |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0091253 A1 | 4/2009 | Yasukawa |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2009/0191427 A1 | 7/2009 | Liao |
| 2009/0200925 A1 | 8/2009 | Naito |
| 2010/0187984 A1 | 7/2010 | Lin |
| 2012/0001158 A1 | 1/2012 | Asari |
| 2012/0223634 A1 | 9/2012 | Xia |
| 2012/0248968 A1 * | 10/2012 | Ogiwara ............... H10K 50/11 313/504 |
| 2012/0292601 A1 | 11/2012 | Kottas |
| 2013/0075716 A1 | 3/2013 | Nishimura |
| 2014/0008633 A1 | 1/2014 | Kato |
| 2015/0295197 A1 | 10/2015 | Adamovich |
| 2015/0380666 A1 | 12/2015 | Szigethy |
| 2017/0025615 A1 | 1/2017 | Seo |
| 2017/0092890 A1 | 3/2017 | Seo et al. |
| 2020/0287143 A1 | 9/2020 | Kim |

FOREIGN PATENT DOCUMENTS

| | | |
|---|---|---|
| EP | 1725079 | 11/2006 |
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| JP | 2017-019761 | 1/2017 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |

(56) References Cited

FOREIGN PATENT DOCUMENTS

| WO | 2007002683 | 1/2007 |
|---|---|---|
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2012128298 A1 | 9/2012 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinoline-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1)162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota, Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91: 209-215 (1997).

Shirota, Yasuhiko et al., "Starburst Molecules Based on pi-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing N^C^N-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergård et al., "Langmuir-Blodgett Light-Emitting Diodes of Poly(3-Hexylthiophene) Electro-Optical Characteristics Related to Structure," Synthetic Metals, 88:171-177 (1997).

(56) References Cited

OTHER PUBLICATIONS

Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Udagawa, Kazuo et al., "Low-Driving-Voltage Blue Phosphorescent Organic Light-Emitting Devices with External Quantum Efficiency of 30%," Advanced Materials, Jun. 27, 2014, vol. 26, pp. 5062-5066.
You, C., et al., "Probing Triplet Excited States and Managing Blue Light Emission of Neutral Tetradentate Platinum(II) Complexes," J. Phys. Chem. Lett., Apr. 17, 2018, vol. 9, pp. 2285-2292.
Extended European Search Report issued on Apr. 11, 2019 for corresponding EP Application No. 18185496.9.

\* cited by examiner

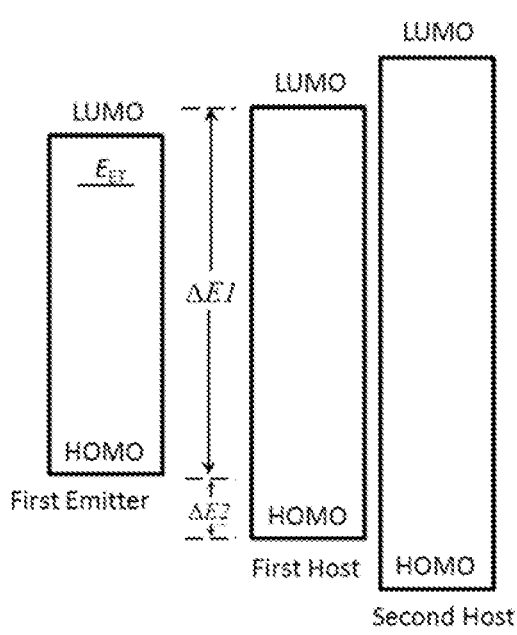
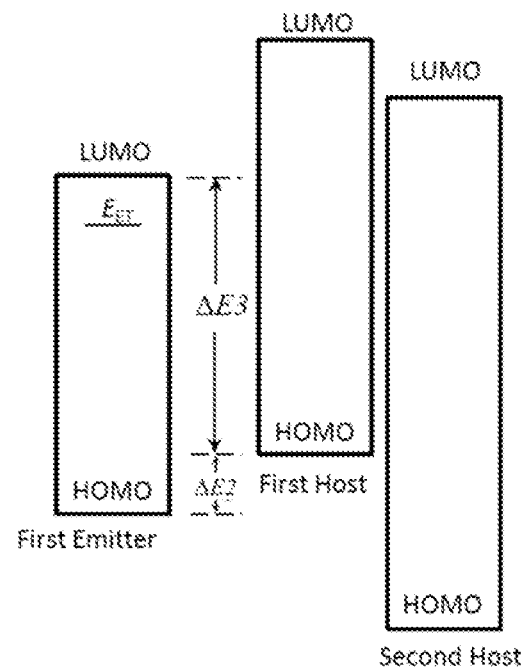
FIG. 6A                               FIG. 6B

ORGANIC ELECTROLUMINESCENT MATERIALS AND DEVICES

CROSS-REFERENCE TO RELATED APPLICATIONS

This application is a continuation of U.S. application Ser. No. 16/774,654, filed Jan. 28, 2020, which is a continuation-in-part of U.S. application Ser. No. 16/037,167, filed Jul. 17, 2018, now U.S. Pat. No. 11,228,010, which claims priority to U.S. Provisional Application Ser. No. 62/537,029, filed Jul. 26, 2017, the entire contents of which is incorporated herein by reference.

FIELD

The present invention relates to a novel device structure for an organic light emitting device that emits light in blue spectrum region with an electron transporting host and/or hole transporting host having specific energy levels.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted Ir(ppy)$_3$, which has the following structure:

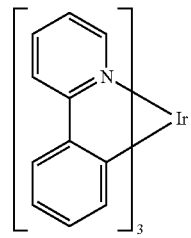

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

There continues to be a great challenge in the OLED industry to achieve commercial high performance blue light emitting devices, i.e., devices emitting blue color (maximum wavelengths of the emission spectra less than about 500 nm) (hereinafter "blue device"), with high efficiency and longer device lifetime. In the past, blue light emitting devices mainly used either a wide bandgap host material or a hole-transporting host material in the emissive layer. In this disclosure, inventors disclose novel devices that utilize an electron-transporting host (e-host) material and/or a hole-transporting host (h-host) material with specific energy requirements. These new devices can significantly improve overall device performance.

An OLED is disclosed wherein the OLED comprises an anode, a cathode, and an organic emissive layer disposed between the anode and the cathode. The organic emissive layer comprises a first host and an emitter. The first host and the emitter each being of a material having a HOMO energy, a LUMO energy, and a $T_1$ triplet energy. The emitter is selected from the group consisting of a phosphorescent metal complex, and a delayed fluorescent emitter. $E_{H1T}$, the $T_1$ triplet energy of the first host, is higher than $E_{ET}$, the $T_1$ triplet energy of the emitter, wherein $E_{ET}$ is at least 2.50 eV. The LUMO energy level of the first host is higher than the HOMO energy level of the emitter. The absolute value of the difference between the HOMO of the emitter and the LUMO of the first host is represented by $\Delta E1$, wherein $a \leq \Delta E1 - E_{ET} \leq b$, where $a \geq 0.005$ eV, and $b \leq 0.60$ eV.

In some embodiments, an OLED is disclosed wherein the OLED comprises an anode, a cathode, and an organic emissive layer disposed between the anode and the cathode. The organic emissive layer comprises a first host, a second host, and an emitter. The first host, the second host, and the emitter each being of a material having a HOMO energy, a LUMO energy, and a $T_1$ triplet energy. The emitter is selected from the group consisting of a phosphorescent metal complex, and a delayed fluorescent emitter. $E_{H1T}$, the $T_1$ triplet energy of the first host, is higher than $E_{ET}$, the $T_1$ triplet energy of the emitter, wherein $E_{ET}$ is at least 2.50 eV. The HOMO energy level of the first host is higher than the HOMO energy level of the second host, and the absolute value of the difference between the HOMO of the emitter and the HOMO of the first host is represented by $\Delta E2$, wherein $\Delta E2 \leq d$, wherein d is 1.2 eV. The absolute value of the difference between the LUMO of the emitter and the HOMO of the first host is represented by $\Delta E3$, wherein $a \leq \Delta E3 - E_{ET} \leq b$, wherein $a \geq 0.05$ eV, and $b \leq 0.60$ eV.

In some embodiments, an OLED is disclosed wherein the OLED comprises an anode, a cathode, and an organic emissive layer disposed between the anode and the cathode. The organic emissive layer comprises a first host having a HOMO energy, a LUMO energy, and a $T_1$ triplet energy; a second host having a HOMO energy, a LUMO energy, and a $T_1$ triplet energy; a third host having a HOMO energy, a LUMO energy, and a $T_1$ triplet energy; and an emitter having a HOMO energy, a LUMO energy, and a $T_1$ triplet energy. The emitter is a phosphorescent metal complex having $E_{ET}$, $T_1$ triplet energy, of at least 2.50 eV. The LUMO energy of the first host is higher than the HOMO energy of the emitter, where the absolute value of the difference between the HOMO energy of the emitter and the LUMO energy of the first host is $\Delta E1$. The HOMO energy of the second host is lower than the HOMO energy of the emitter, where the absolute value of the difference between the HOMO energy of the emitter and the HOMO energy of the second host is $\Delta E4$. In this embodiment, $a \leq \Delta E1 - E_{ET} \leq b$, wherein $a \geq 0.005$ eV and $b \leq 0.60$ eV; where $\Delta E4 \leq d$, wherein d is 1.2 eV; and where the HOMO energy of the third host is lower than the HOMO energy of the second host.

In some embodiments, an OLED is disclosed wherein the OLED comprises an anode, a cathode, and an organic emissive layer disposed between the anode and the cathode. The organic emissive layer comprises a first host having a HOMO energy, a LUMO energy, and a $T_1$ triplet energy; a second host having a HOMO energy, a LUMO energy, and a $T_1$ triplet energy; and a third host having a HOMO energy, a LUMO energy, and a $T_1$ triplet energy; and an emitter having a HOMO energy, a LUMO energy, and a $T_1$ triplet energy. The emitter is a phosphorescent metal complex having $E_{ET}$, the $T_1$ triplet energy, of at least 2.50 eV. The LUMO energy of the first host is higher than the HOMO energy of the emitter. The absolute value of the difference between the HOMO energy level of the second host and the LUMO energy of the first host is $\Delta E5$. The HOMO energy of the second host is higher than the HOMO energy of the emitter, where the absolute value of the difference between the HOMO energy level of the emitter and the HOMO energy of the second host is $\Delta E4$. In this embodiment, $a \leq \Delta E5 - E_{ET} \leq b$, where $a \geq 0.005$ eV, and $b \leq 0.60$ eV, and where $\Delta E4 \leq d$; and wherein d is 1.2 eV.

According to yet another embodiment, a consumer product comprising one or more of the OLEDs disclosed herein is provided.

BRIEF DESCRIPTION OF THE DRAWINGS

FIG. 6A shows the relative HOMO and LUMO energy levels of the first emitter, the first host, and the second host in a one emitter, two hosts system device according to some embodiments. The HOMO of the first host is deeper than the HOMO of the first emitter by $\Delta E_2$.

FIG. 6B shows the relative HOMO and LUMO energy levels of the first emitter, the first host, and the second host in a one emitter, two hosts system device according to some embodiments. The HOMO level of the first host shallower than the HOMO level of the first emitter by $\Delta E_2$.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
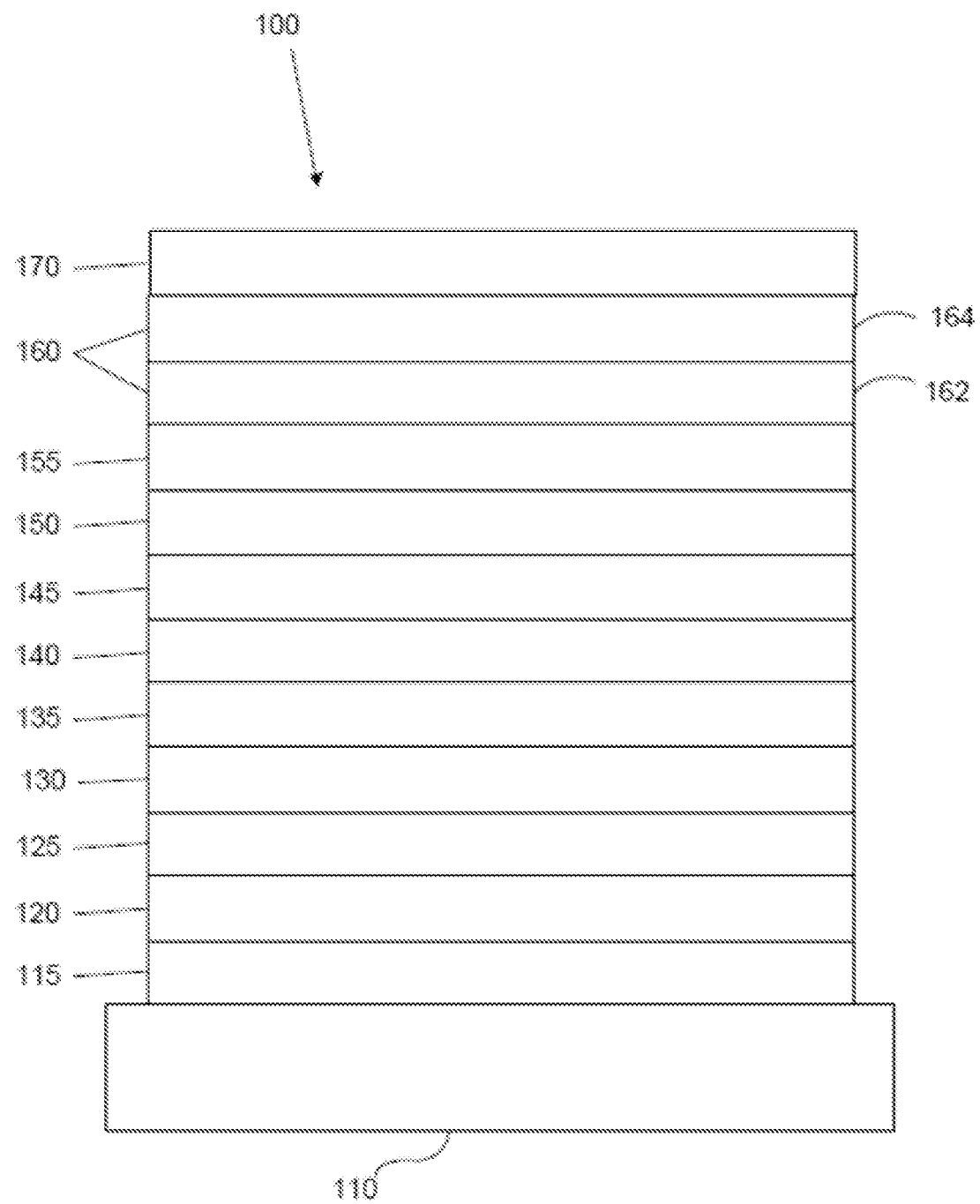
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
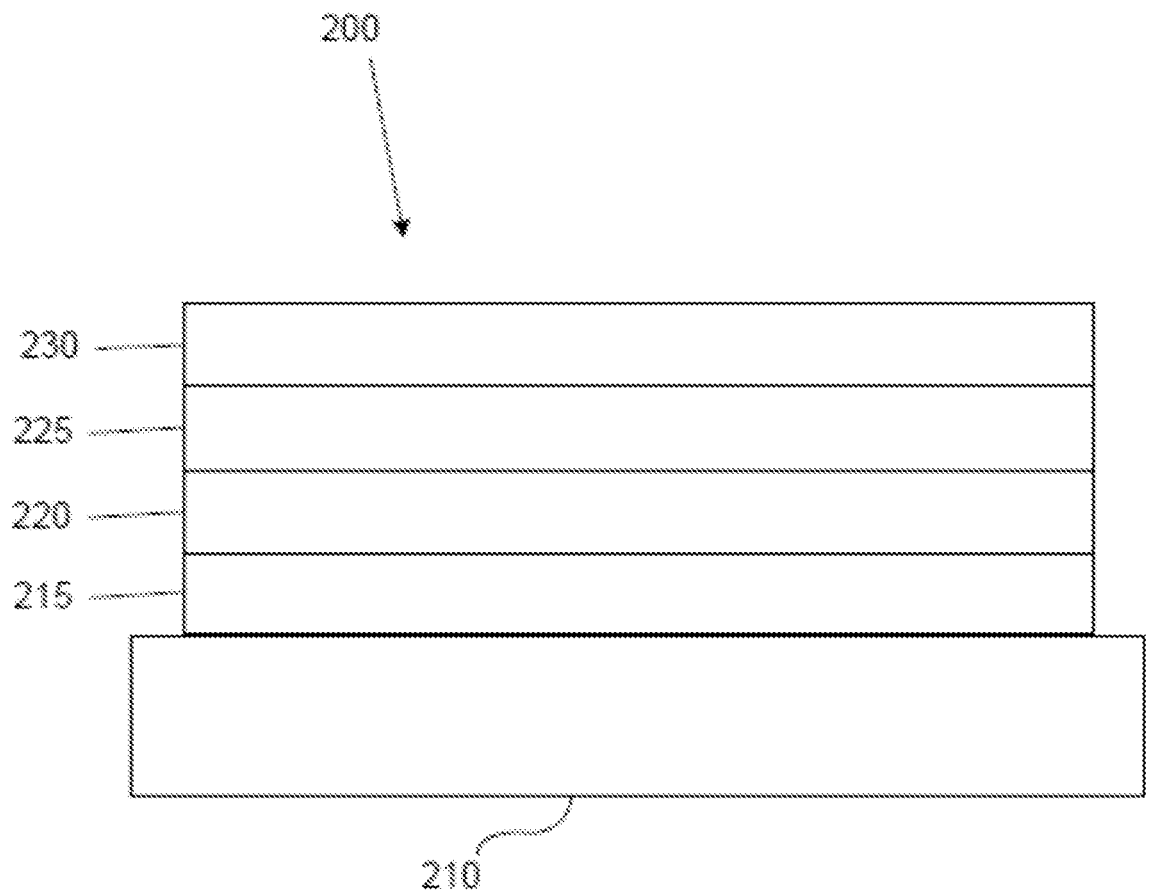
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —O$R_s$ radical.

The terms "sulfanyl" or "thio-ether" are used interchangeably and refer to a —S$R_s$ radical.

The term "sulfinyl" refers to a —S(O)—$R_s$ radical.

The term "sulfonyl" refers to a —SO$_2$—$R_s$ radical.

The term "phosphino" refers to a —P($R_s$)$_3$ radical, wherein each $R_s$ can be same or different.

The term "silyl" refers to a —Si($R_s$)$_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring hetero-aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted or substituted with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The term "substituted" refers to a substituent other than H that is bonded to the relevant position, e.g., a carbon. For example, where $R^1$ represents mono-substituted, then one $R^1$ must be other than H Similarly, where $R^1$ represents di-substituted, then two of $R^1$ must be other than H. Similarly, where $R^1$ is unsubstituted, $R^1$ is hydrogen for all available positions. The maximum number of substitutions possible in a structure (for example, a particular ring or fused ring system) will depend on the number of atoms with available valencies.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed. (Reviews)* 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

Figure 3:
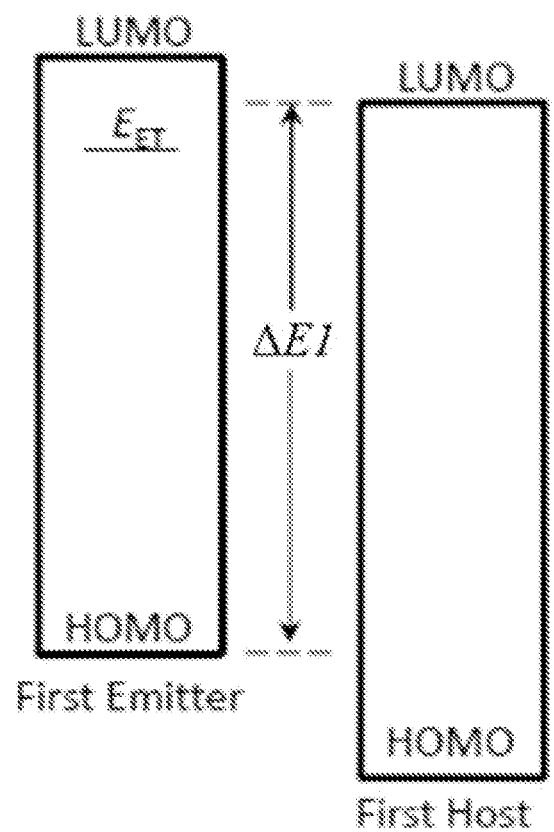
FIG. 3 illustrates the relative HOMO and LUMO energy levels of the first emitter and the first host in a one host, one emitter system device according to some embodiments.

An OLED is disclosed wherein the OLED comprises an anode, a cathode, and an organic emissive layer disposed between the anode and the cathode. The organic emissive layer comprises a first host and an emitter, wherein the emitter is selected from the group consisting of a phosphorescent metal complex, and a delayed fluorescent emitter. $E_{H1T}$, the $T_1$ triplet energy of the first host, is higher than $E_{ET}$, the $T_1$ triplet energy of the emitter, wherein $E_{ET}$ is at least 2.50 eV. The LUMO energy level of the first host is higher than the HOMO energy level of the emitter. The absolute value of the difference between the HOMO of the emitter and the LUMO of the first host is represented by $\Delta E1$ and wherein $a \leq \Delta E1 - E_{ET} \leq b$, where $a \geq 0.05$ eV, and $b \leq 0.60$ eV. This energy configuration is illustrated in FIG. 3.

In some embodiments, the relationship $a \leq \Delta E1 - E_{ET} \leq b$ is maintained where a is 0.10 eV. In some embodiments a is 0.15 eV. In some embodiments, a is 0.20 eV. In some embodiments, b is 0.50 eV. In some embodiments, b is 0.40 eV. In some embodiments, b is 0.30 eV. In some embodiments, b is 0.25 eV. In some embodiments, $E_{ET}$ is at least 2.60 eV. In some embodiments, $E_{ET}$ is at least 2.70 eV. In some embodiments, $E_{ET}$ is at least 2.75 eV. In some embodiments, $E_{ET}$ is at least 2.80 eV.

In some embodiments of the OLED, the emitter is a phosphorescent metal complex. In some embodiments of the OLED, the emitter is a delayed fluorescent emitter.

In some embodiments of the OLED, the first host is an e-host.

In some embodiments of the OLED, the absolute value of the difference between the highest HOMO energy and the lowest LUMO energy among all components in the emissive layer is larger than $E_{ET}$ by at least a.

Figure 4:
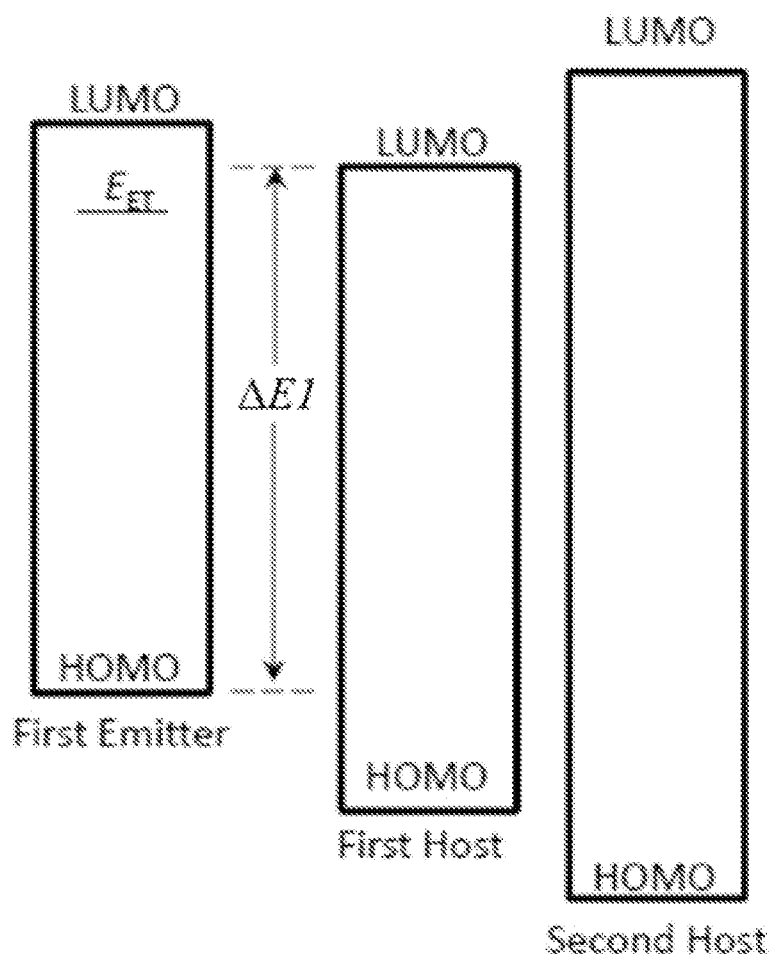
FIG. 4 illustrates the relative HOMO and LUMO energy levels of the first emitter, the first host, and the second host in a one emitter, two hosts system device according to some embodiments.
Figure 5:
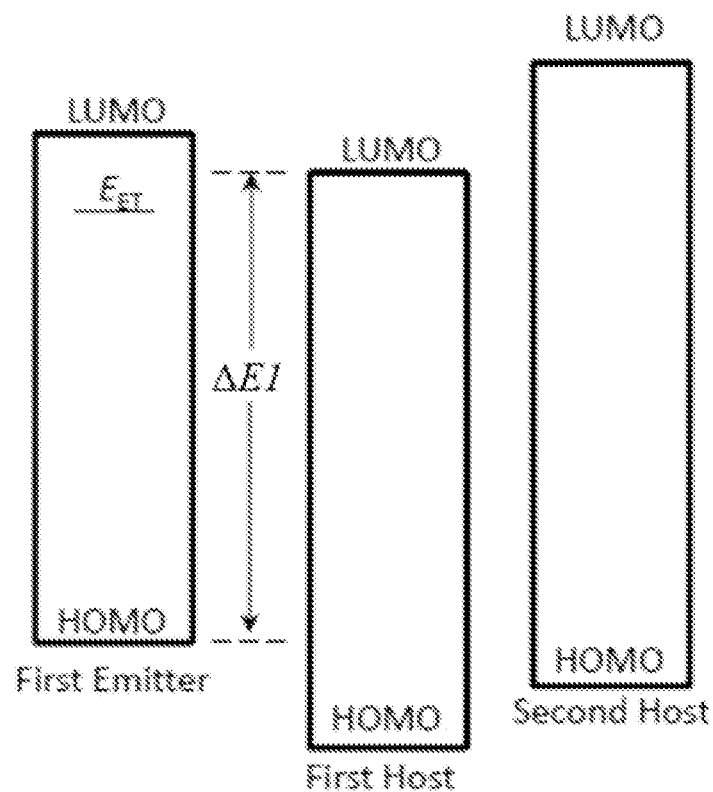
FIG. 5 illustrates the relative HOMO and LUMO energy levels of the first emitter, the first host, and the second host in a one emitter, two hosts system device according to some embodiments.

Referring to FIGS. 4 and 5, in some embodiments of the OLED, the OLED further comprises a second host and $E_{H2T}$, the $T_1$ triplet energy of the second host, is higher than $E_{ET}$. As illustrated in FIG. 4, in some embodiments, the HOMO energy of the second host is lower than the HOMO energy of the first host, and the LUMO energy of the second host is higher than the LUMO energy of the first host. As illustrated in FIG. 5, in some embodiments, the HOMO energy of the second host is higher than the HOMO energy of the first host, and the LUMO energy of the second host is higher than the LUMO energy of the first host.

In some embodiments, the difference between the HOMO energy levels of the first host and the second host is from 0.1 to 0.6 eV. As disclosed herein, when energy levels are referred to as being from aa to bb eV, it includes the end values aa and bb. In some embodiments, the difference between the HOMO energy levels between the first host and the second host is from 0.1 to 0.3 eV. In some embodiments, the difference between the HOMO energy levels between the first host and the second host is from 0.1 to 0.2 eV. In some embodiments, the difference between the HOMO energy levels between the first host and the second host is from 0.1 to 0.15 eV. In some embodiments, the difference between the LUMO energy levels between the first host and the second host is from 0.1 to 0.50 eV. In some embodiments, the difference between the LUMO energy levels between the first host and the second host is from 0.1 to 0.35 eV. In some embodiments, the difference between the LUMO energy levels between the first and the second host is from 0.1 to 0.20 eV. In some embodiments, the first host, the second host, and the emitter are the only components in the emissive layer.

In some embodiments, the second host is a hole transporting host.

In some embodiments of the OLED, the OLED has an operating voltage of less than 6.0 V at 10 mA/cm². In some embodiments, the OLED has an operating voltage of less than 5.0 V at 10 mA/cm². In some embodiments, the OLED has an operating voltage of less than 4.0 V at 10 mA/cm².

In some embodiments of the OLED, the first host comprises at least one chemical group selected from the group consisting of pyridine, pyrimidine, pyrazine, triazine, imidazole, aza-triphenylene, aza-carbazole, aza-dibenzothiophene, aza-dibenzofuran, and aza-dibenzoselenophene.

In some embodiments of the OLED, the emitter is a phosphorescent blue emitter.

In some embodiments of the OLED, the emitter has the formula of $M(L^1)_x(L^2)_y(L^3)_z$; where $L^1$, $L^2$ and $L^3$ can be the same or different; where x is 1, 2, or 3; where y is 0, 1, or 2; where z is 0, 1, or 2; where x+y+z is the oxidation state of the metal M; where $L^1$, $L^2$ and $L^3$ are each independently selected from the group consisting of:

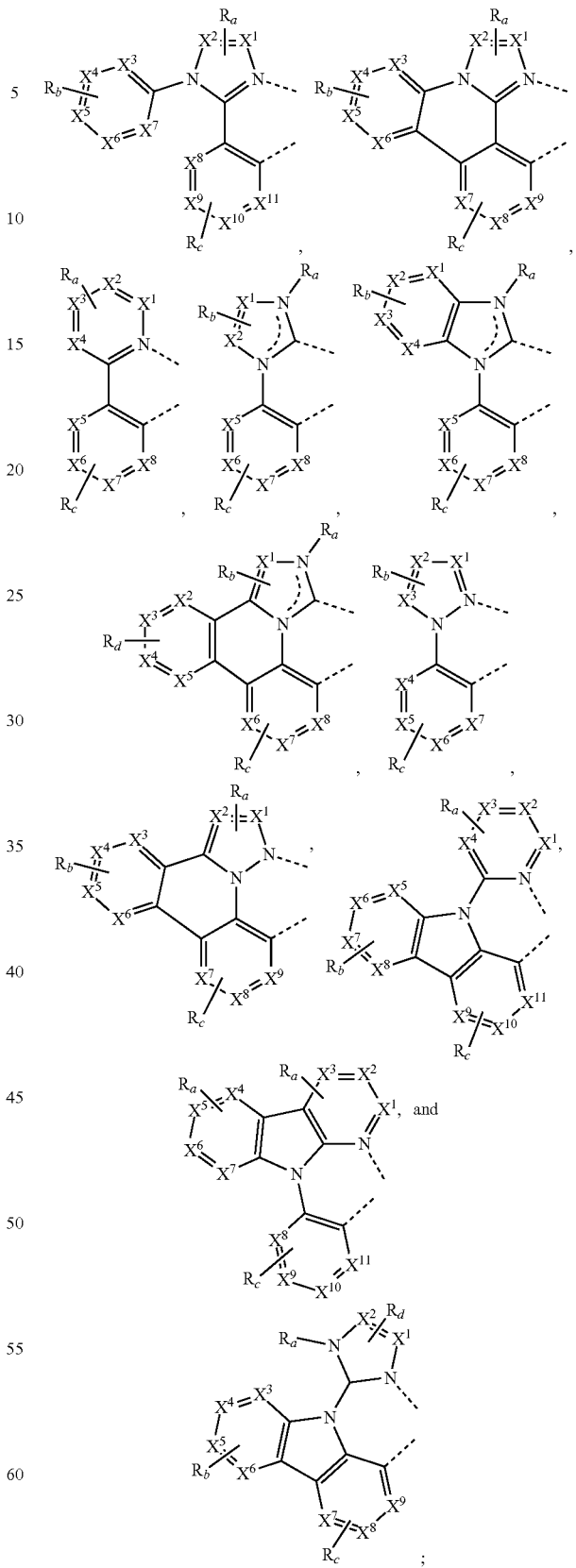

where each $X^1$ to $X^{17}$ are independently selected from the group consisting of carbon and nitrogen; where X is selected from the group consisting of BR', NR', PR', O, S, Se, C=O, S=O, SO$_2$, CR'R", SiR'R", and GeR'R"; where R' and R" are optionally fused or joined to form a ring; where each $R_a$, $R_b$, $R_c$, and $R_d$ may represent from mono substitution to the possible maximum number of substitution, or no substitution; where R', R", $R_a$, $R_b$, $R_c$, and $R_d$ are each independently selected from the group consisting of hydrogen, deuterium, halogen, alkyl, cycloalkyl, heteroalkyl, heterocycloalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof; and wherein any two $R_a$, $R_b$, $R_c$, and $R_d$ are optionally fused or joined to form a ring or form a multidentate ligand.

In some embodiments of the OLED where the emitter has the formula of $M(L^1)_x(L^2)_y(L^3)_z$, R', R", $R_a$, $R_b$, $R_c$, and $R_d$ are each independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some embodiments of the OLED where the emitter has the formula of $M(L^1)_x(L^2)_y(L^3)_z$, the compound has the formula selected from the group consisting of $Ir(L^1)(L^2)(L^3)$, $Ir(L^1)_2(L^2)$, and $Ir(L^1)_3$; wherein $L^1$, $L^2$ and $L^3$ are different and each independently selected from the group consisting of:

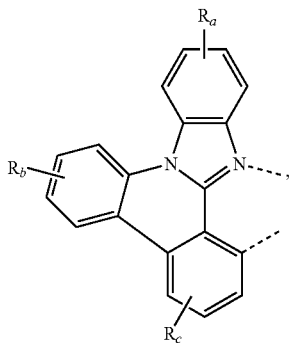

-continued

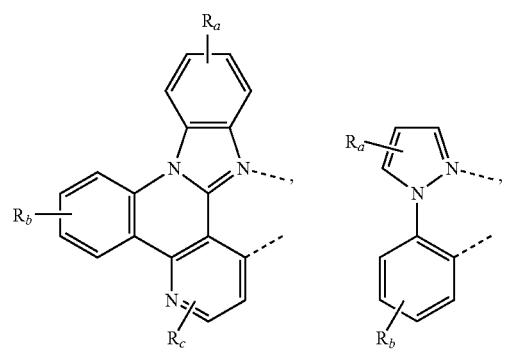

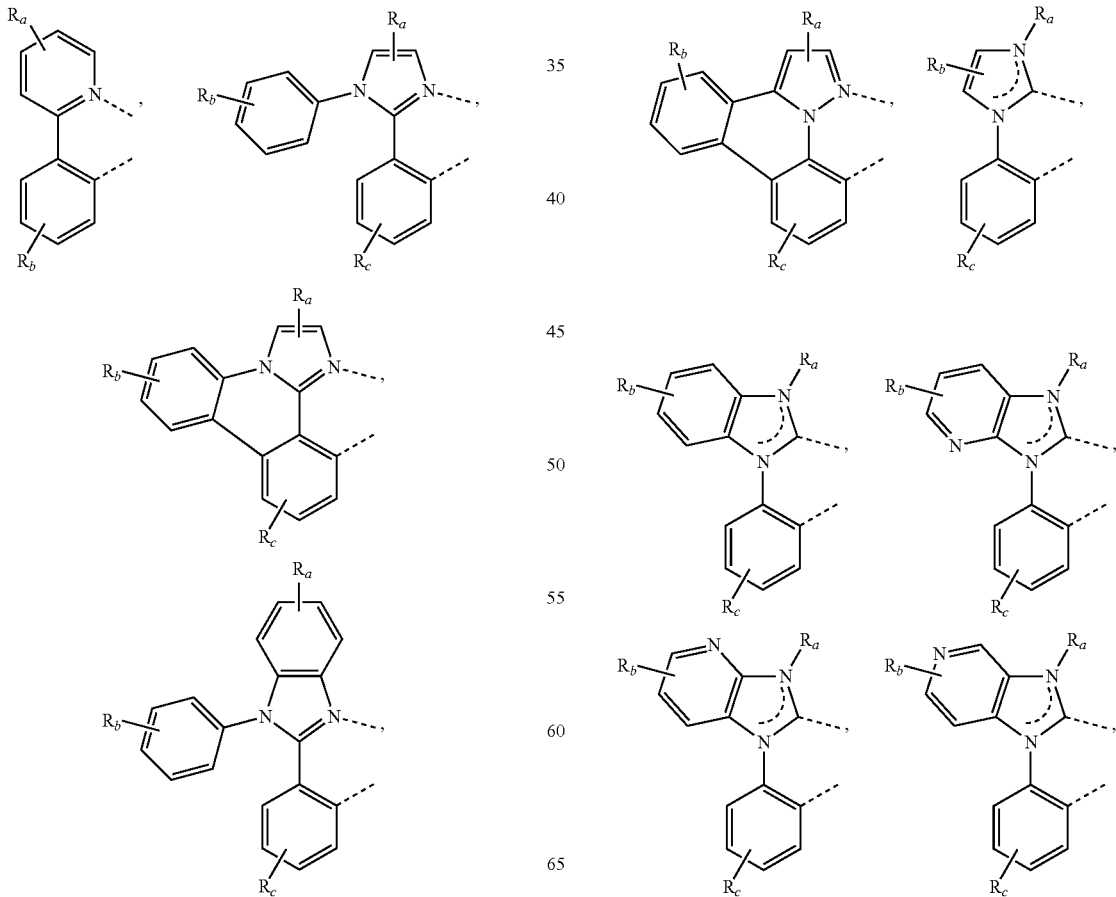

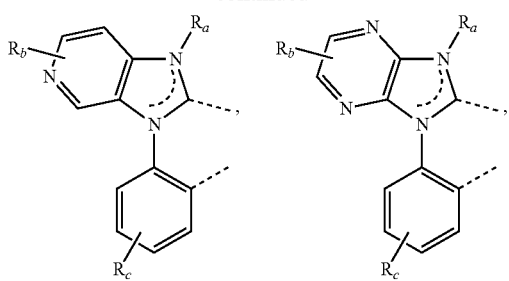
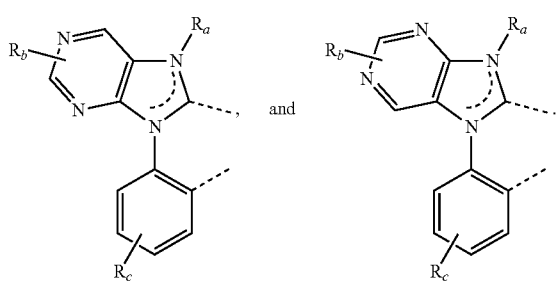

In some embodiments of the OLED where the emitter has the formula of $M(L^1)_x(L^2)_y(L^3)_z$, the compound has the formula of $Pt(L^1)_2$ or $Pt(L^1)(L^2)$. In some embodiments, $L^1$ is connected to the other $L^1$ or $L^2$ to form a tetradentate ligand.

In some embodiments of the OLED where the emitter has the formula of $M(L^1)_x(L^2)_y(L^3)_z$, the compound has the formula of $M(L^1)_2$ or $M(L^1)(L^2)$; wherein M is Ir, Rh, Re, Ru, or Os, $L^1$ and $L^2$ are each a different tridentate ligand. In some embodiments, $L^1$, is selected from the group consisting of:

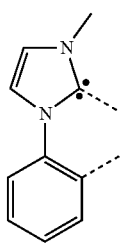

$L_{B1}$

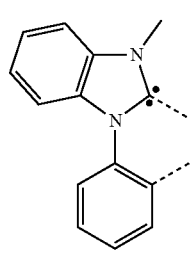

$L_{B2}$

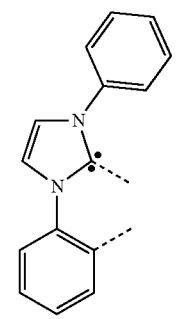

$L_{B3}$

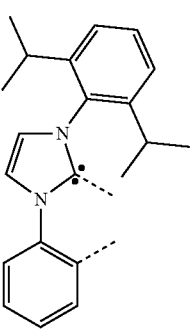

$L_{B4}$

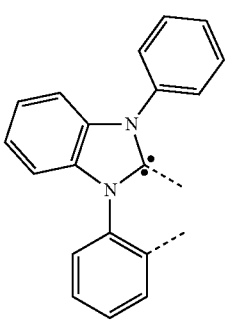

$L_{B5}$

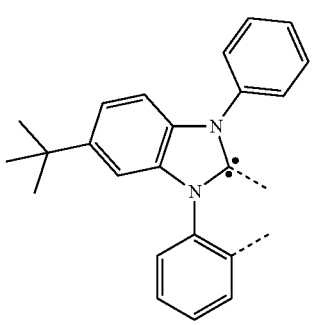

$L_{B6}$

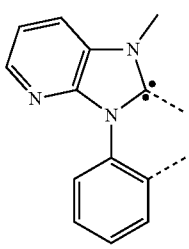

$L_{B7}$

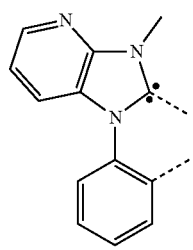 L_{B8}
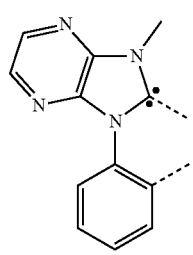 L_{B9}
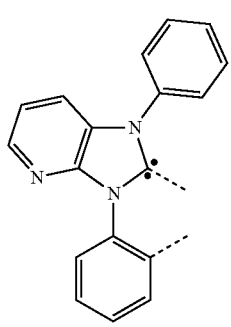 L_{B10}
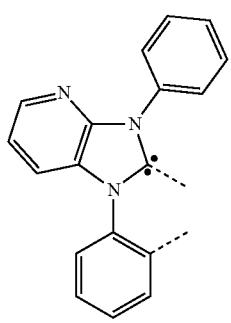 L_{B11}
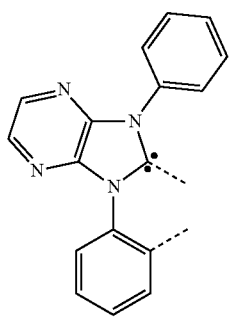 L_{B12}
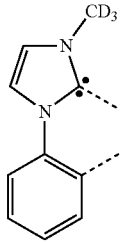 L_{B13}
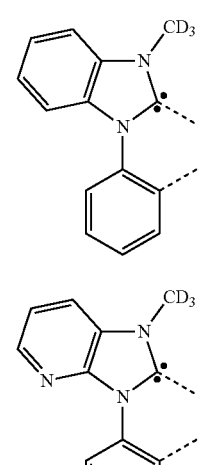 L_{B14}
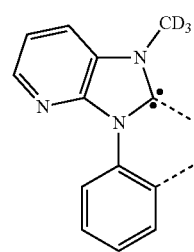 L_{B15}
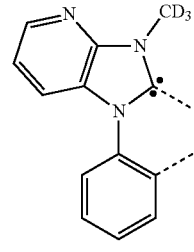 L_{B16}
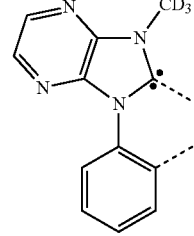 L_{B17}
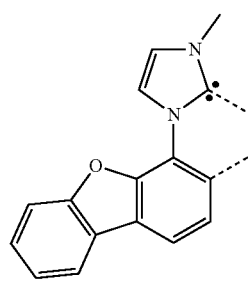 L_{B18}

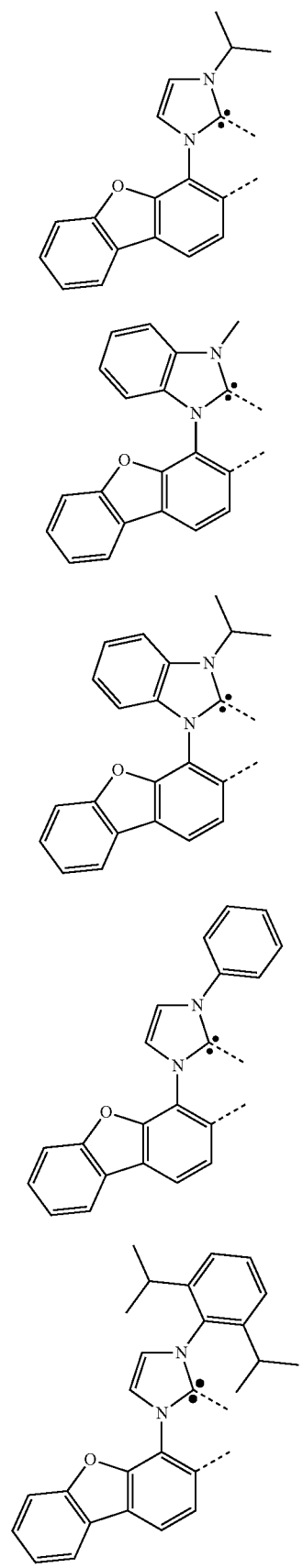
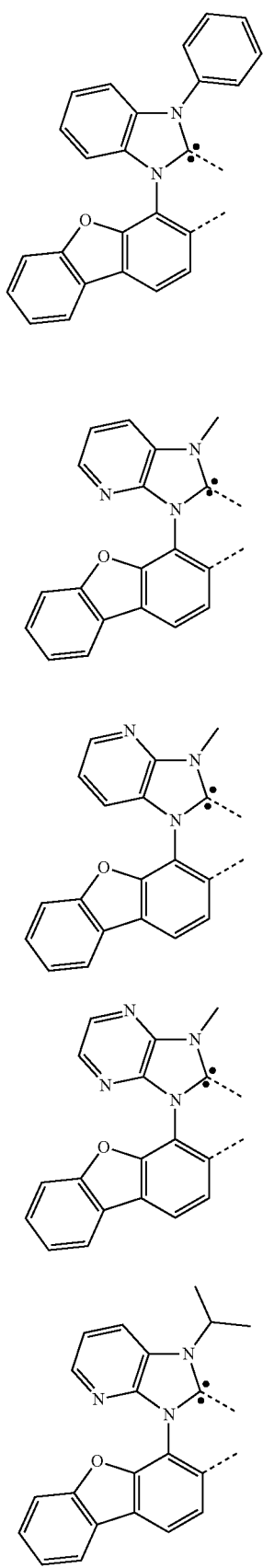

L<sub>B29</sub>
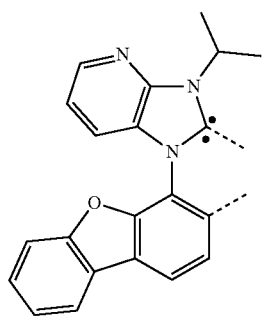
L<sub>B30</sub>
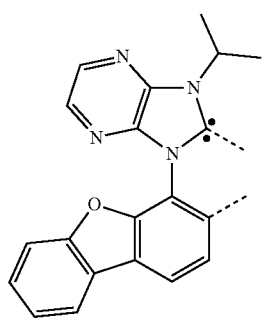
L<sub>B31</sub>
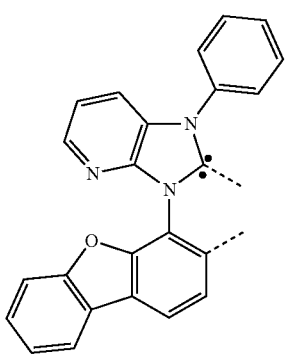
L<sub>B32</sub>
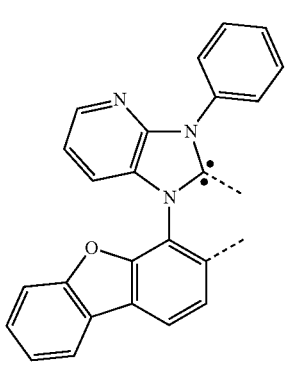
L<sub>B33</sub>
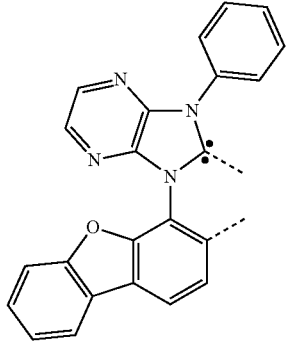
L<sub>B34</sub>
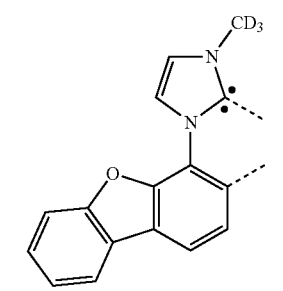
L<sub>B35</sub>
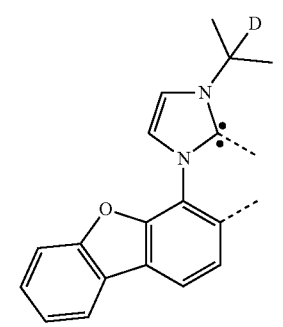
L<sub>B36</sub>
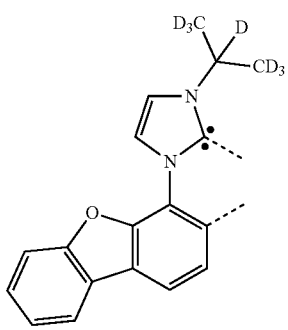
L<sub>B37</sub>
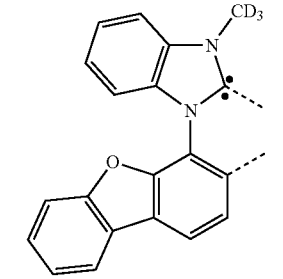

L<sub>B38</sub>
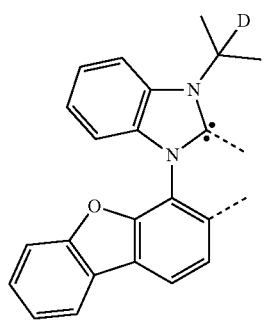
L<sub>B39</sub>
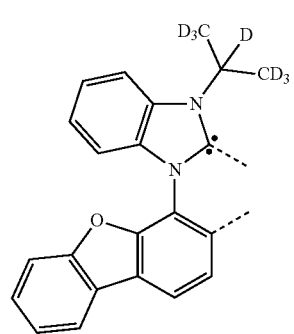
L<sub>B40</sub>
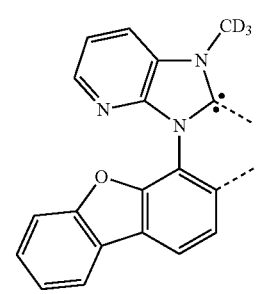
L<sub>B41</sub>
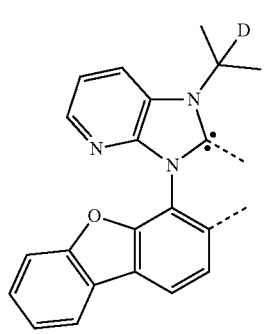
L<sub>B42</sub>
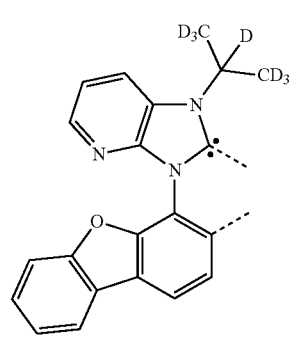
L<sub>B43</sub>
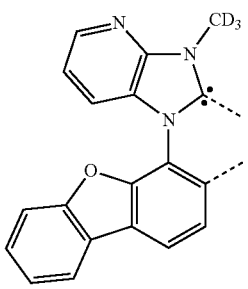
L<sub>B44</sub>
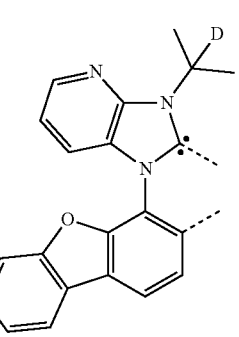
L<sub>B45</sub>
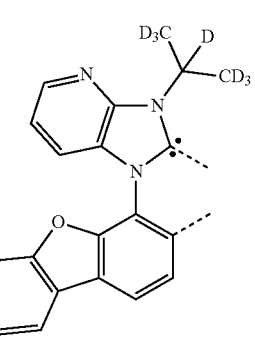
L<sub>B46</sub>
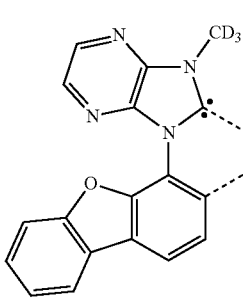
L<sub>B47</sub>
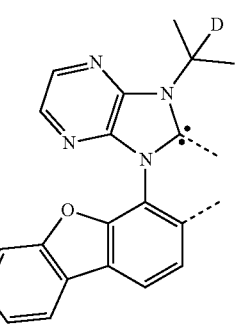

L_{B48}
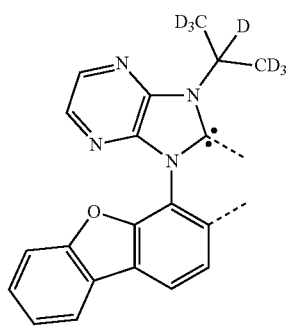
L_{B49}
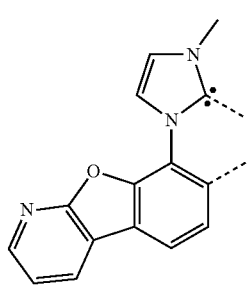
L_{B50}
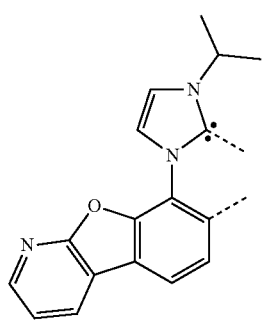
L_{B51}
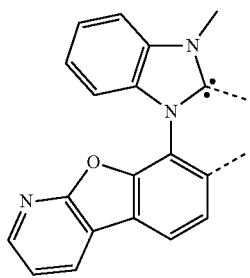
L_{B52}
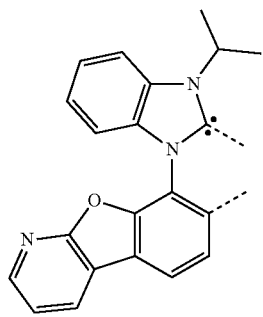
L_{B53}
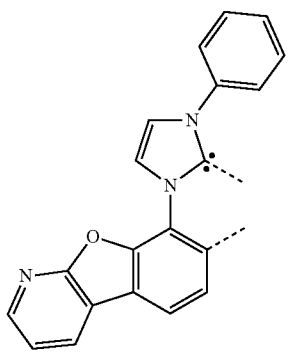
L_{B54}
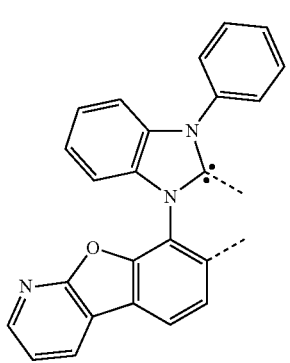
L_{B55}
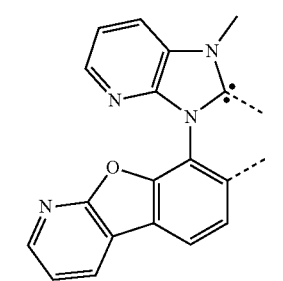
L_{B56}
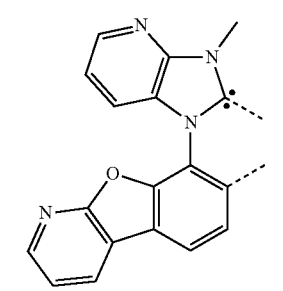
L_{B57}
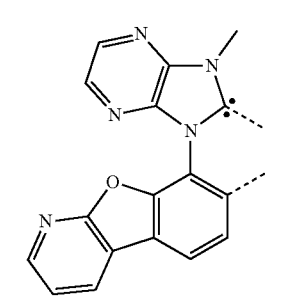

L<sub>B58</sub>
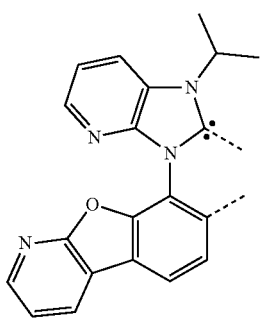
L<sub>B59</sub>
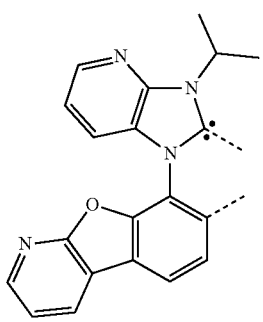
L<sub>B60</sub>
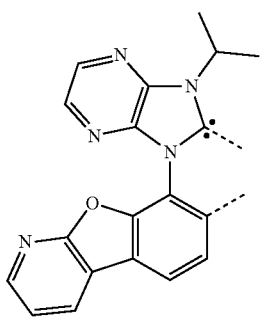
L<sub>B61</sub>
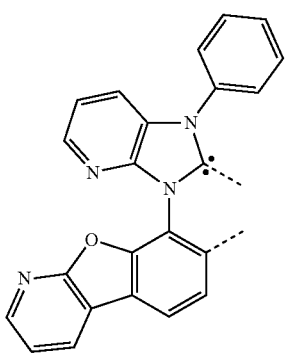
L<sub>B62</sub>
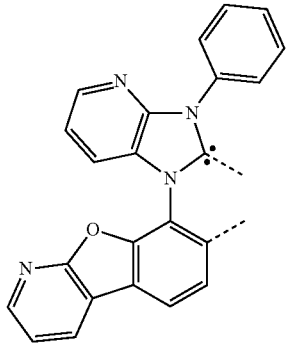
L<sub>B63</sub>
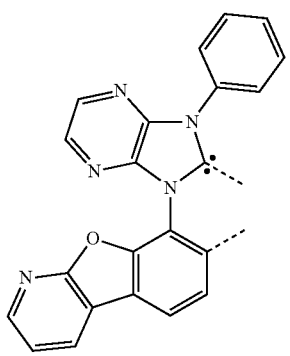
L<sub>B64</sub>
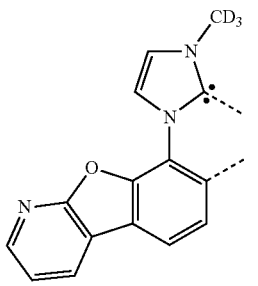
L<sub>B65</sub>
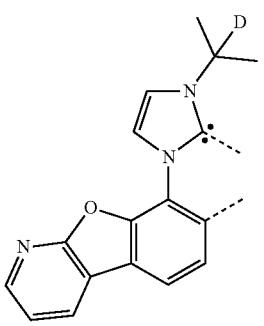
L<sub>B66</sub>
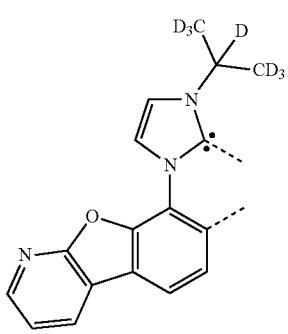

-continued
L<sub>B67</sub> 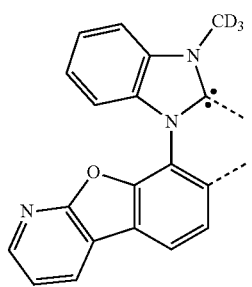
L<sub>B68</sub> 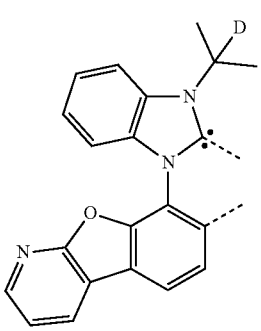
L<sub>B69</sub> 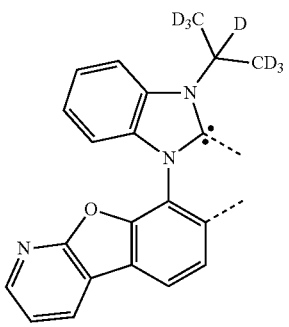
L<sub>B70</sub> 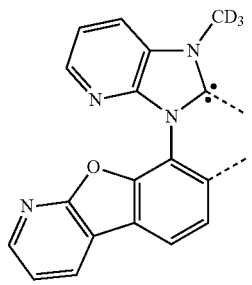
L<sub>B71</sub> 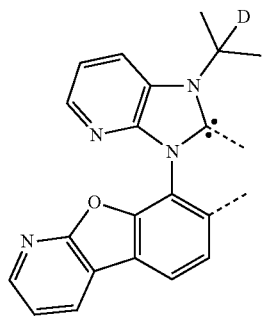
-continued
L<sub>B72</sub> 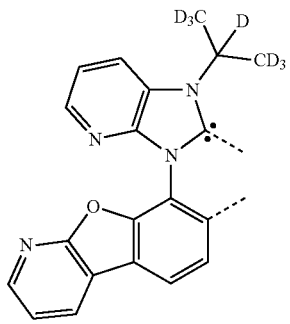
L<sub>B73</sub> 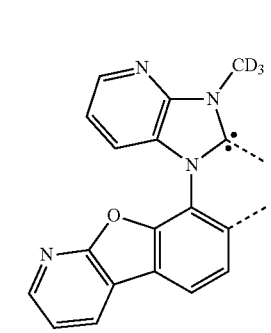
L<sub>B74</sub> 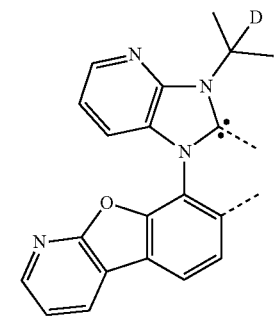
L<sub>B75</sub> 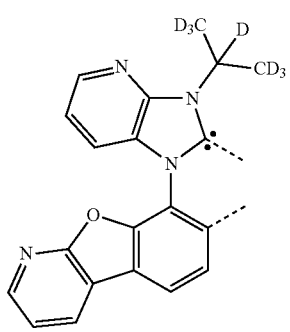
L<sub>B76</sub> 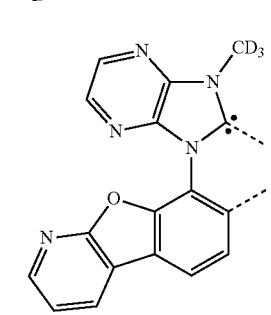

L_{B77}
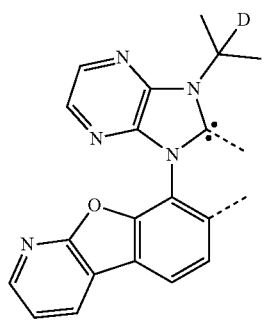
L_{B78}
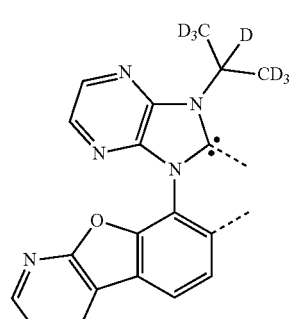
L_{B79}
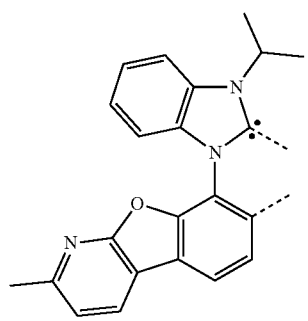
L_{B80}
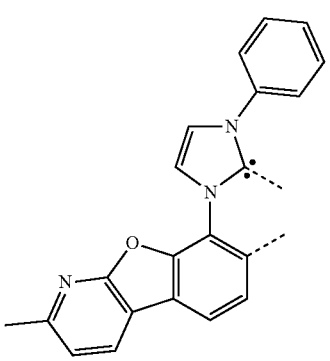
L_{B81}
L_{B82}
L_{B83}
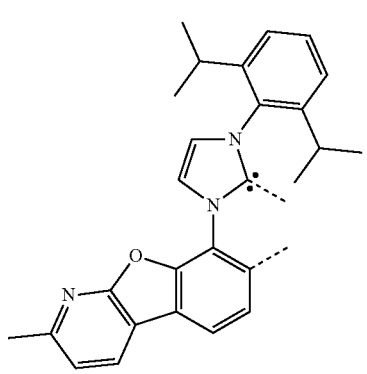
L_{B84}
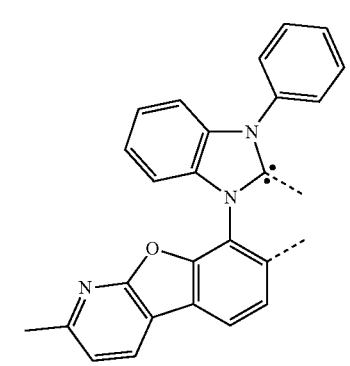
L_{B85}

L<sub>B86</sub>
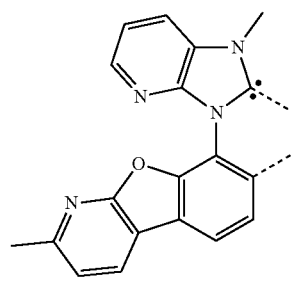
L<sub>B87</sub>
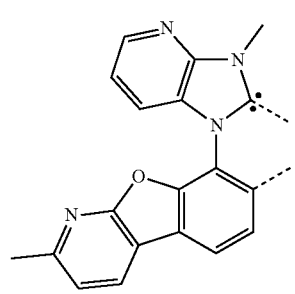
L<sub>B88</sub>
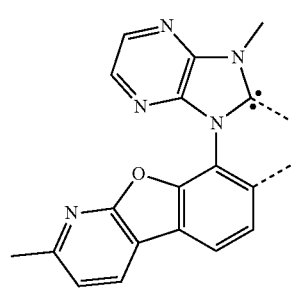
L<sub>B89</sub>
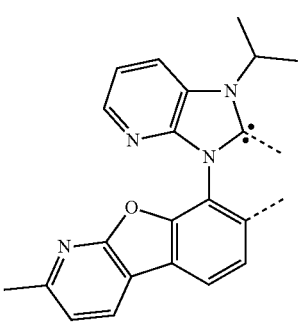
L<sub>B90</sub>
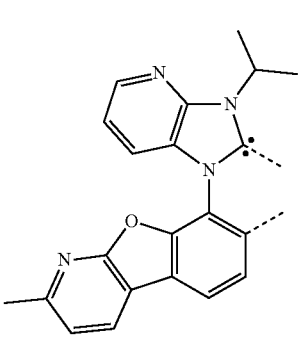
L<sub>B91</sub>
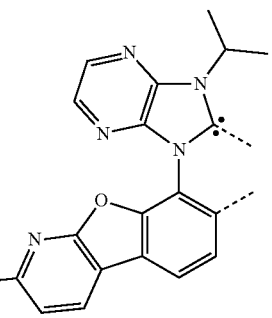
L<sub>B92</sub>
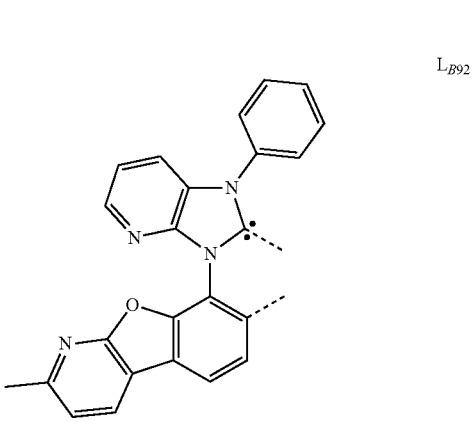
L<sub>B93</sub>
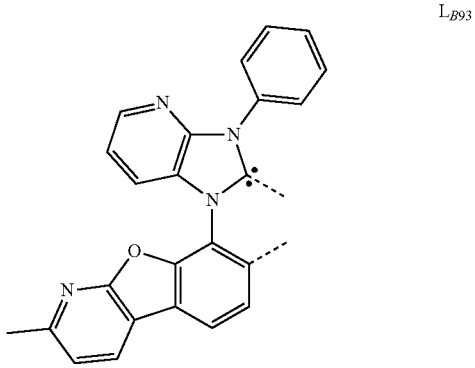
L<sub>B94</sub>
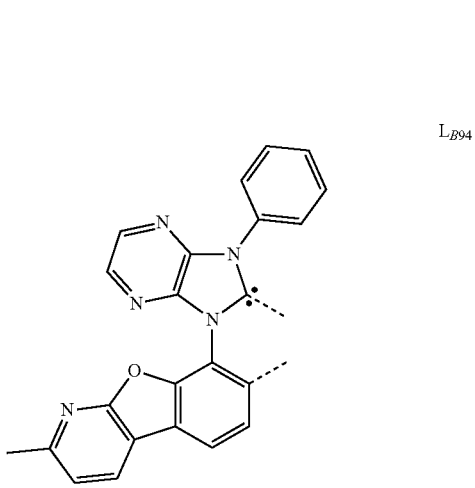

-continued
L_{B95} 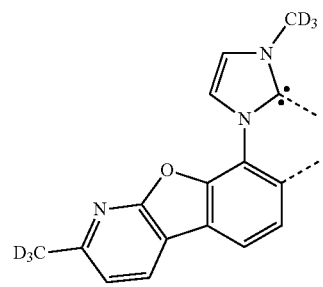
L_{B96} 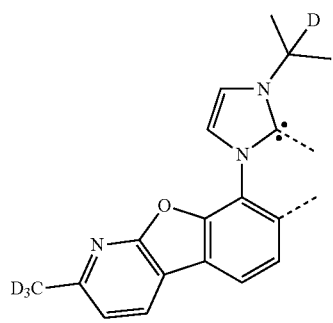
L_{B97} 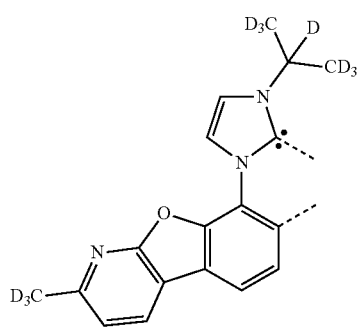
L_{B98} 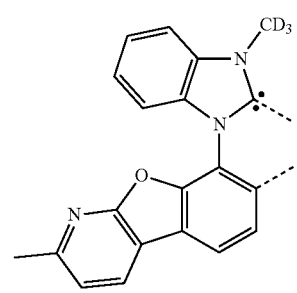
L_{B99} 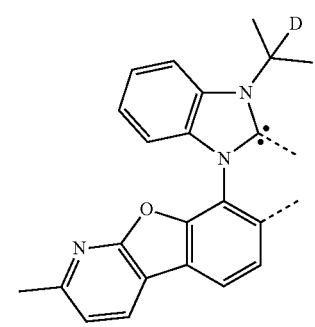
-continued
L_{B100} 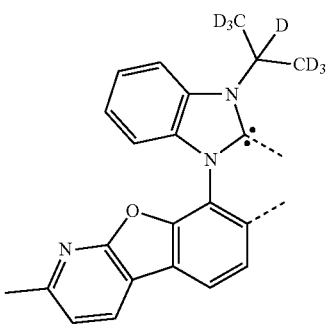
L_{B101} 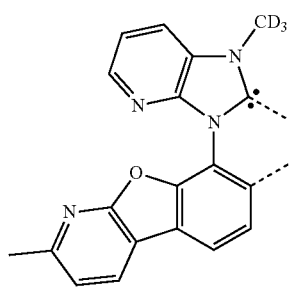
L_{B102} 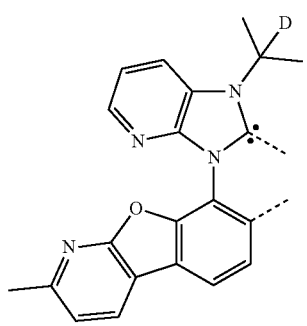
L_{B103} 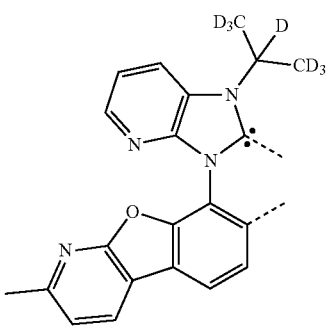
L_{B104} 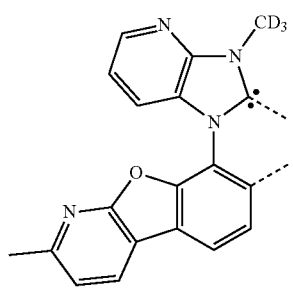

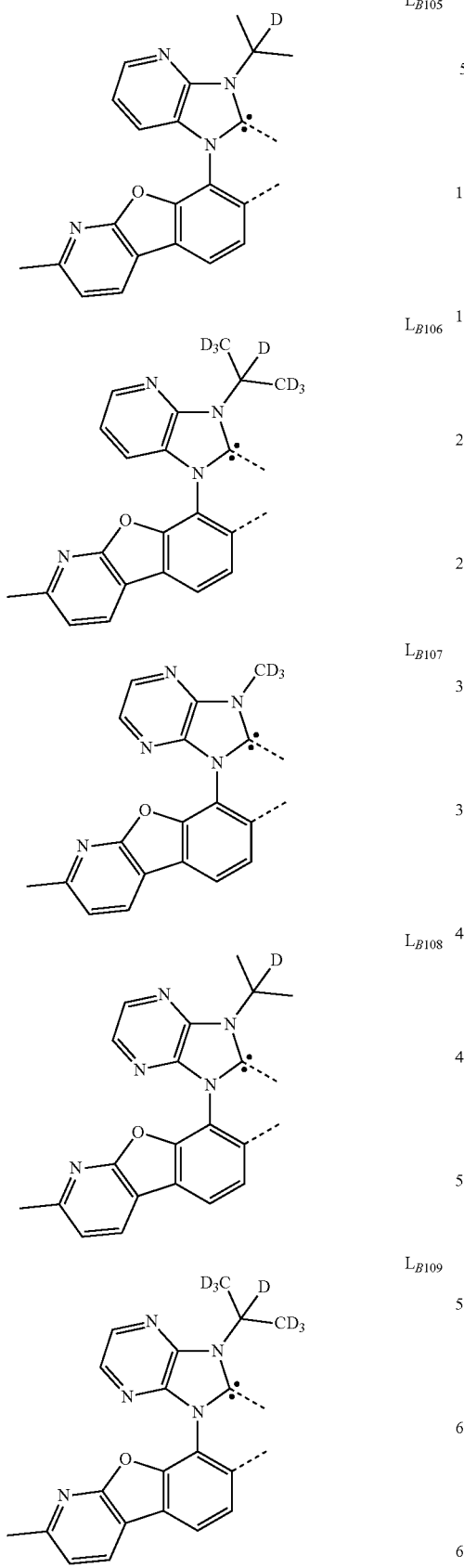
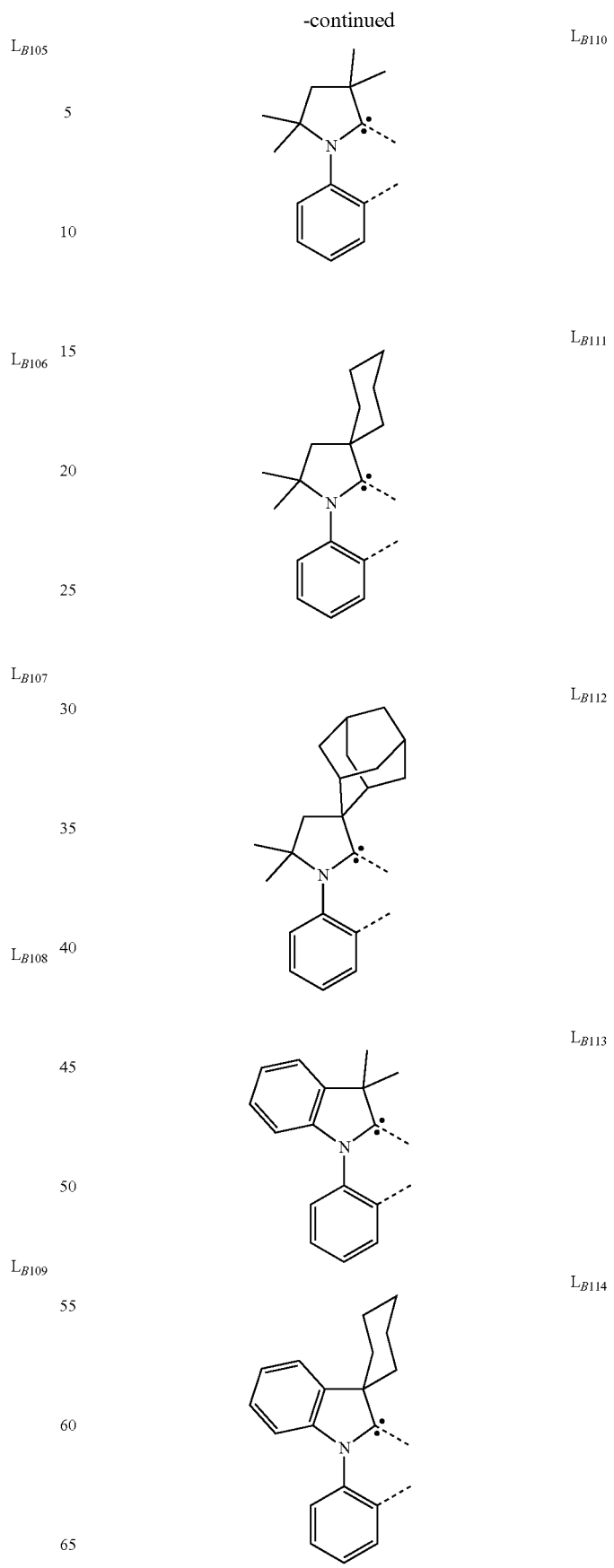

L_{B115}
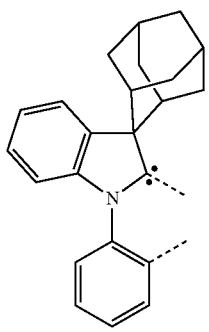
L_{B116}
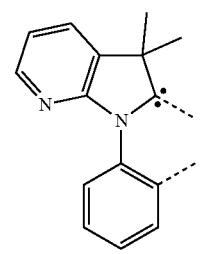
L_{B117}
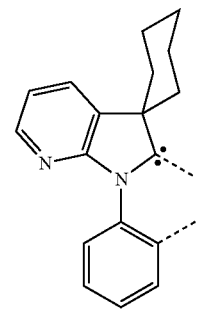
L_{B118}
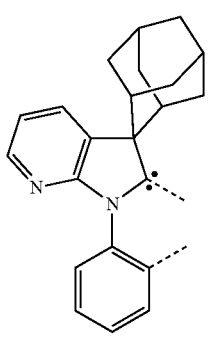
L_{B119}
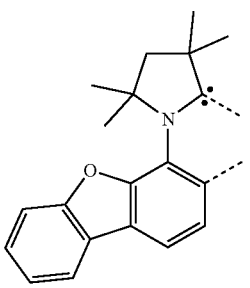
L_{B120}
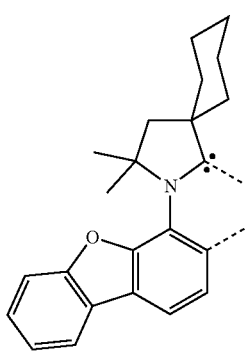
L_{B121}
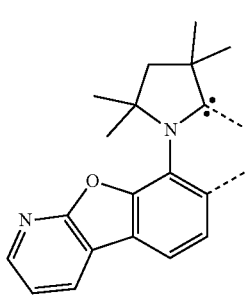
L_{B122}
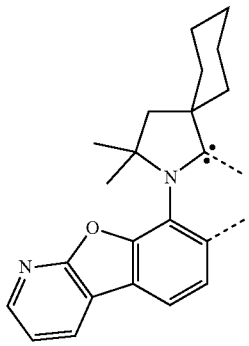
L_{B123}
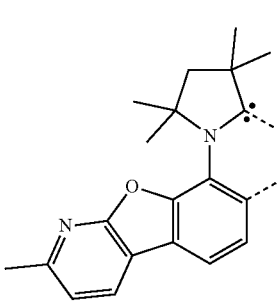
L_{B124}
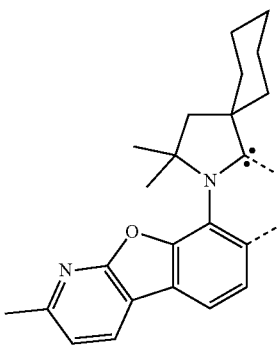

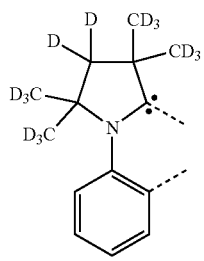
L<sub>B125</sub>
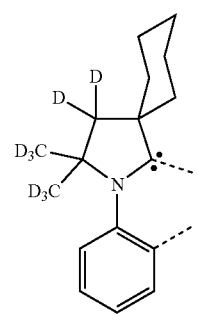
L<sub>B126</sub>
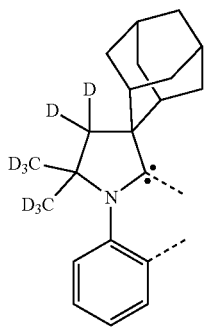
L<sub>B127</sub>
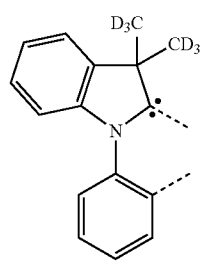
L<sub>B128</sub>
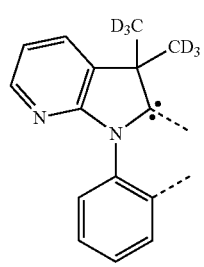
L<sub>B129</sub>
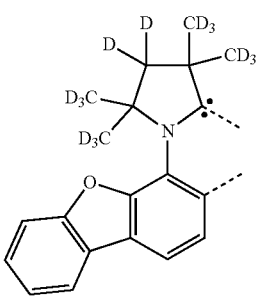
L<sub>B130</sub>
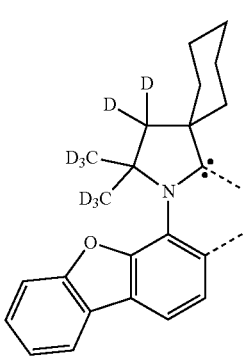
L<sub>B131</sub>
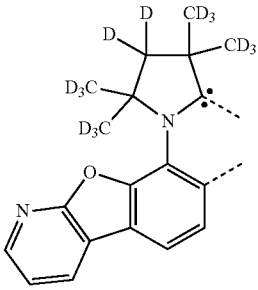
L<sub>B132</sub>
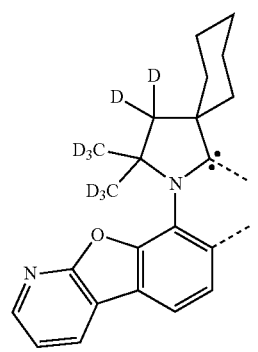
L<sub>B133</sub>
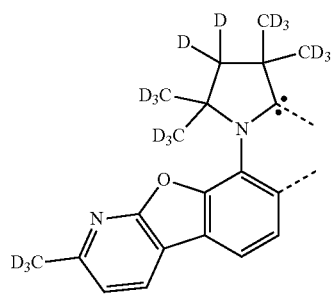
L<sub>B134</sub>

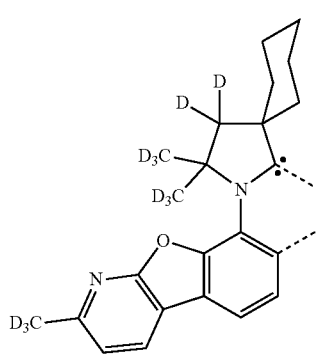 L$_{B135}$
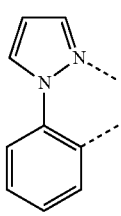 L$_{B136}$
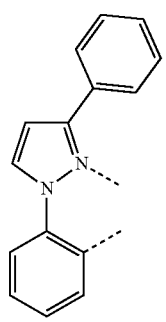 L$_{B137}$
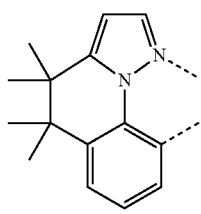 L$_{B138}$
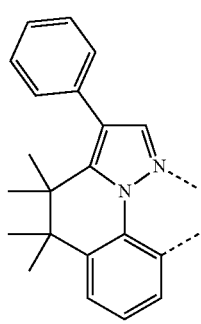 L$_{B139}$
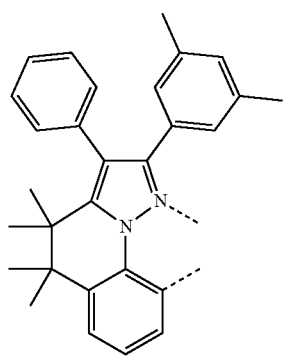 L$_{B140}$
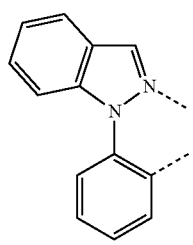 L$_{B141}$
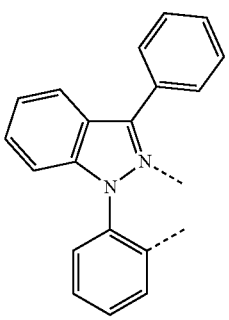 L$_{B142}$
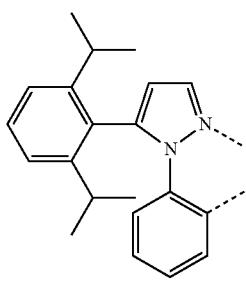 L$_{B143}$
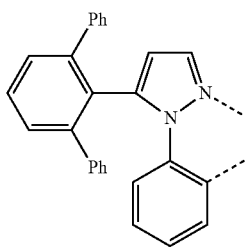 L$_{B144}$ -continued
L_{B145}
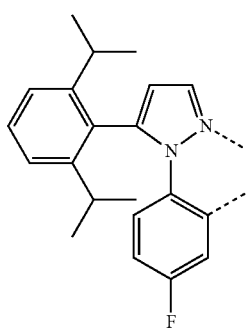
L_{B146}
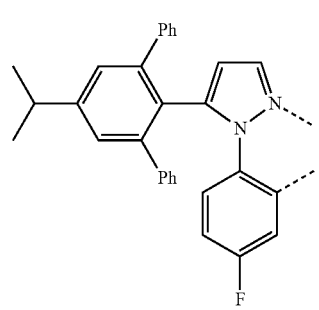
L_{B147}
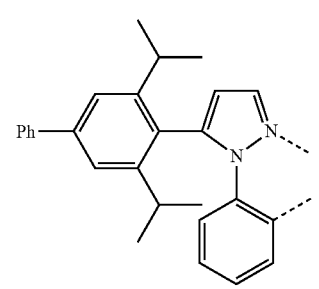
L_{B148}
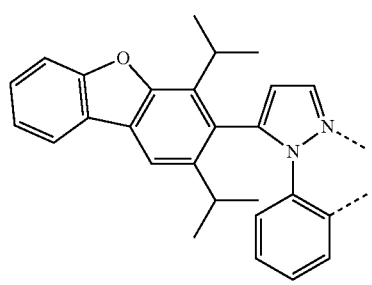
L_{B149}
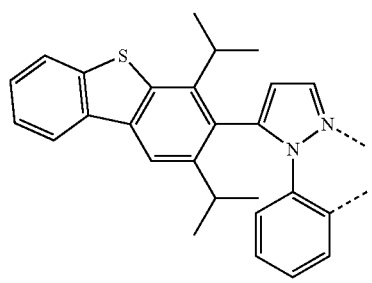
-continued
L_{B150}
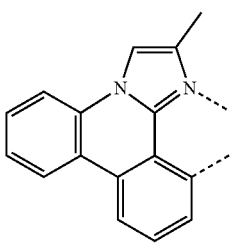
L_{B151}
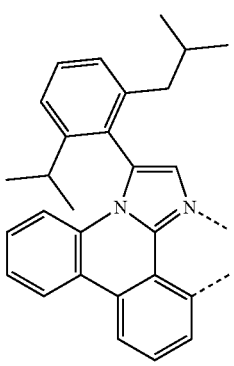
L_{B152}
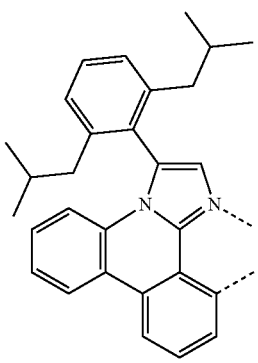
L_{B153}
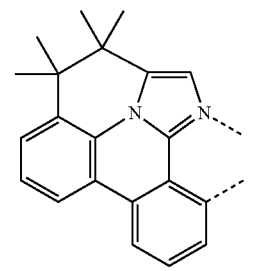
L_{B154}
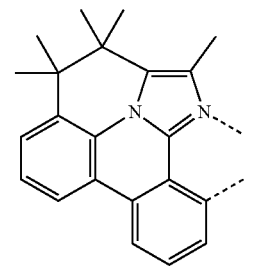

-continued

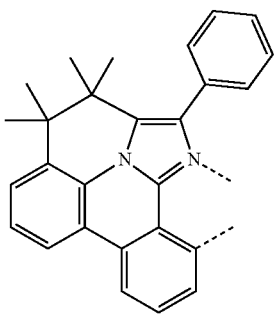
L_{B155}

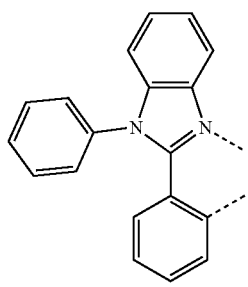
L_{B156}

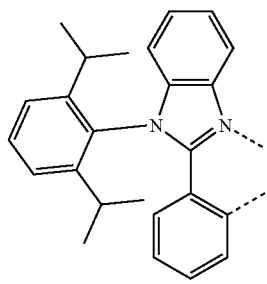
L_{B157}

A consumer product comprising an OLED is also disclosed. The OLED comprises an anode, a cathode, and an organic emissive layer disposed between the anode and the cathode. The organic emissive layer comprises a first host and an emitter, wherein the emitter is selected from the group consisting of a phosphorescent metal complex, and a delayed fluorescent emitter. $E_{H1T}$, the $T_1$ triplet energy of the first host, is higher than $E_{ET}$, the $T_1$ triplet energy of the emitter, wherein $E_{ET}$ is at least 2.50 eV. The LUMO energy of the first host is higher than the HOMO energy of the emitter. The absolute value of the difference between the HOMO energy of the emitter and the LUMO energy of the first host is represented by $\Delta E1$ and wherein $a \leq \Delta E1 - E_{ET} \leq b$, where $a \geq 0.05$ eV, and $b \leq 0.60$ eV.

An OLED according to another embodiment is disclosed, comprising: an anode; a cathode; and an organic emissive layer disposed between the anode and the cathode, the organic emissive layer comprising: a first host, a second host; and an emitter; wherein the emitter is selected from the group consisting of a phosphorescent metal complex, and a delayed fluorescent emitter; wherein $E_{H1T}$, the $T_1$ triplet energy of the first host, is higher than $E_{ET}$, the $T_1$ triplet energy of the emitter; wherein $E_{ET}$ is at least 2.50 eV; wherein the HOMO energy of the first host is higher than the HOMO energy of the second host; wherein the absolute value of the difference between the HOMO energy of the emitter and the HOMO energy of the first host is $\Delta E2$; wherein $\Delta E2 \leq d$; wherein d is 1.2 eV; wherein the absolute value of the difference between the LUMO energy of the emitter and the HOMO energy of the first host is represented by $\Delta E3$; wherein the following relationship $a \leq \Delta E3 - E_{ET} \leq b$ is maintained; wherein $a \geq eV$, and $b \leq 0.60$ eV. This energy configuration is shown in FIGS. 6A and 6B. In some embodiments of the OLED, d is 0.8 eV. In some embodiments, d is 0.5 eV. In some embodiments, a is 0.05 eV and b is eV. In some embodiments, a is 0.05 eV and b is 0.2 eV. In some embodiments, a is 0.10 eV, 0.15 eV, or 0.20 eV. In some embodiments, b is 0.50 eV, 0.40 eV, 0.30 eV, or 0.25 eV. In some embodiments, $E_{ET}$ is at least 2.60 eV. In some embodiments, $E_{ET}$ is at least 2.70 eV. In some embodiments, $E_{ET}$ is at least 2.75 eV. In some embodiments, $E_{ET}$ is at least 2.80 eV.

Figure 7:
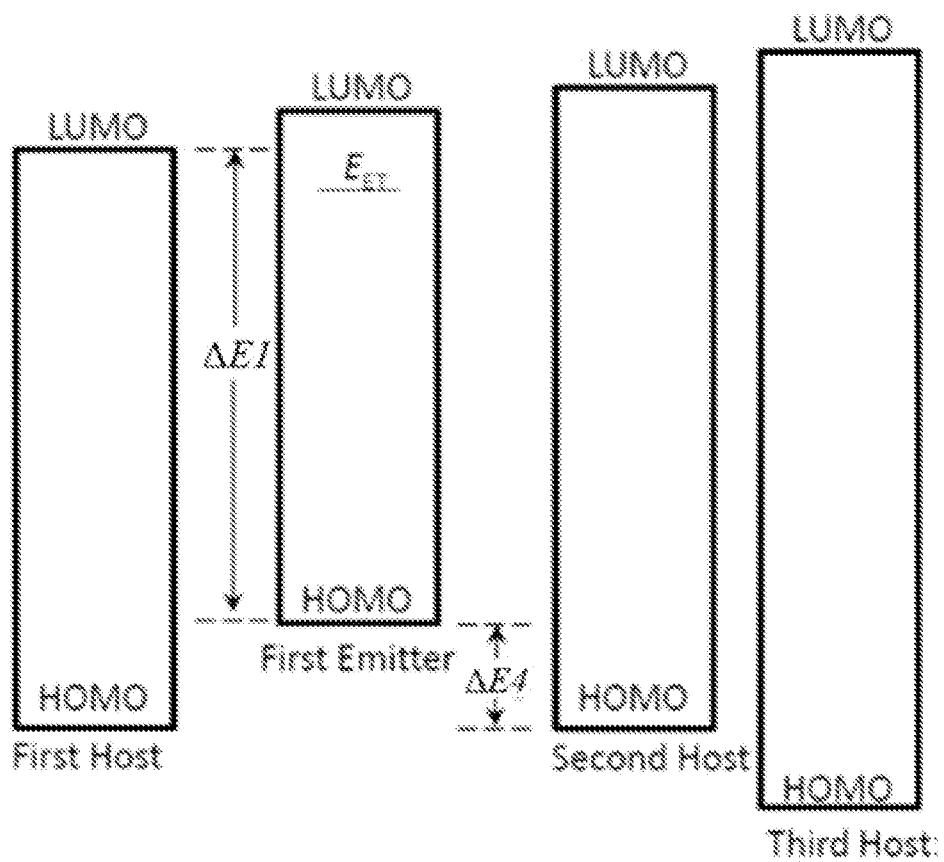
FIG. 7 shows the relative HOMO and LUMO energy levels of the first emitter, the first host, the second host, and the third host in a one emitter, three hosts system device according to some embodiments.
Figure 8:
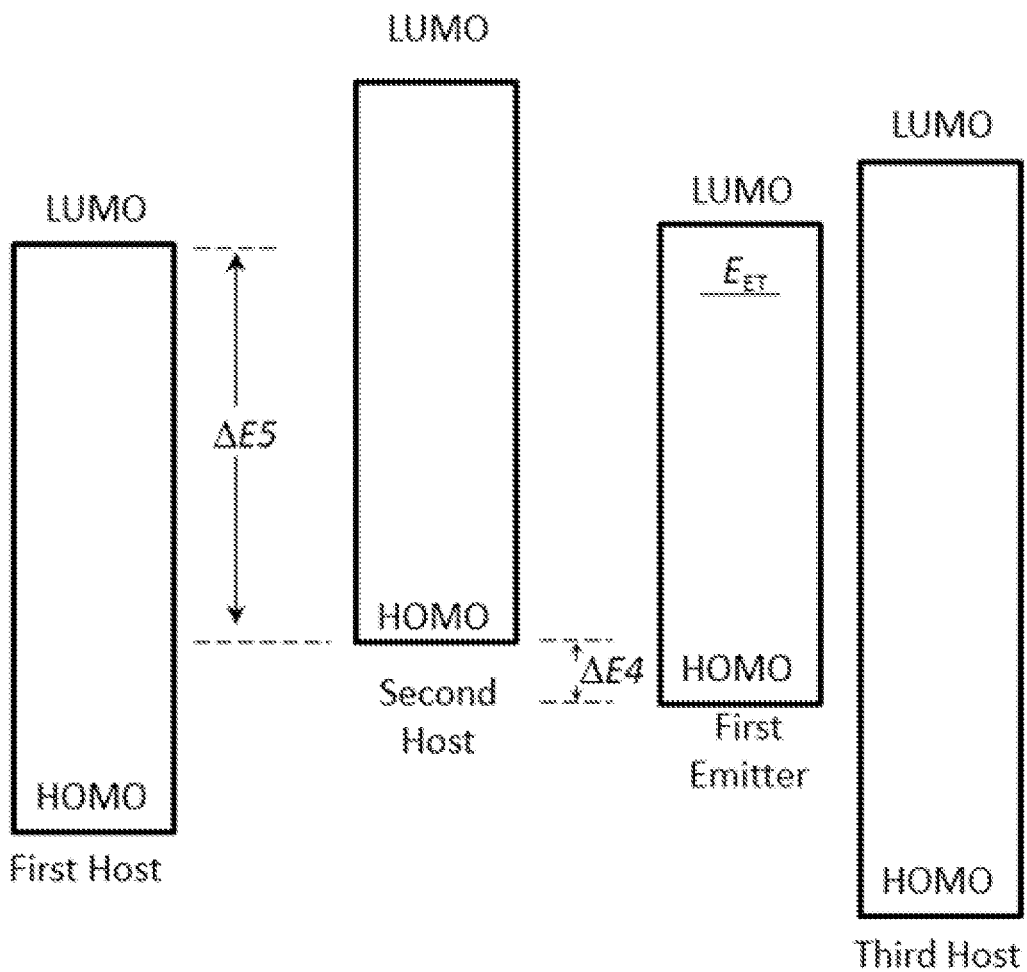
FIG. 8 shows the relative HOMO and LUMO energy levels of the first emitter the first host, the second host, and the third host in a one emitter, three hosts system device according to some other embodiments.

An OLED according to another embodiment is disclosed that comprises: an anode; a cathode; and an organic emissive layer disposed between the anode and the cathode. The organic emissive layer comprises: a first host, a second host, and a third host; and an emitter; wherein the emitter is a phosphorescent metal complex having $E_{ET}$, $T_1$ triplet energy, of at least 2.50 eV; wherein the absolute value of the difference between the HOMO of the emitter and the LUMO of the first host is represented by $\Delta E1$; wherein the absolute value of the difference between the HOMO of the emitter and the HOMO of the second host is $\Delta E4$; wherein the following relationship $a \leq \Delta E1 - E_{ET} \leq b$ is maintained wherein $a \geq 0.005$ eV, and $b \leq 0.60$ eV; wherein $\Delta E4 \leq d$; wherein d is 1.2 eV; and wherein the absolute energy difference between the HOMO level of the third host and the first emitter is greater than $\Delta E4$. This energy configuration is shown in FIG. 7. In some embodiments of the OLED, d is 0.8 eV. In some embodiments, d is 0.5 eV. In some embodiments, a is 0.005 eV and b is 0.4 eV. In some embodiments, a is 0.005 eV and b is 0.2 eV. In some embodiments, a is 0.10 eV, 0.15 eV, or 0.20 eV. In some embodiments, b is 0.50 eV, 0.40 eV, 0.30 eV, or 0.25 eV. In some embodiments, $E_{ET}$ is at least 2.60 eV. In some embodiments, $E_{ET}$ is at least 2.70 eV. In some embodiments, $E_{ET}$ is at least 2.75 eV. In some embodiments, $E_{ET}$ is at least 2.80 eV.

Figure 14:
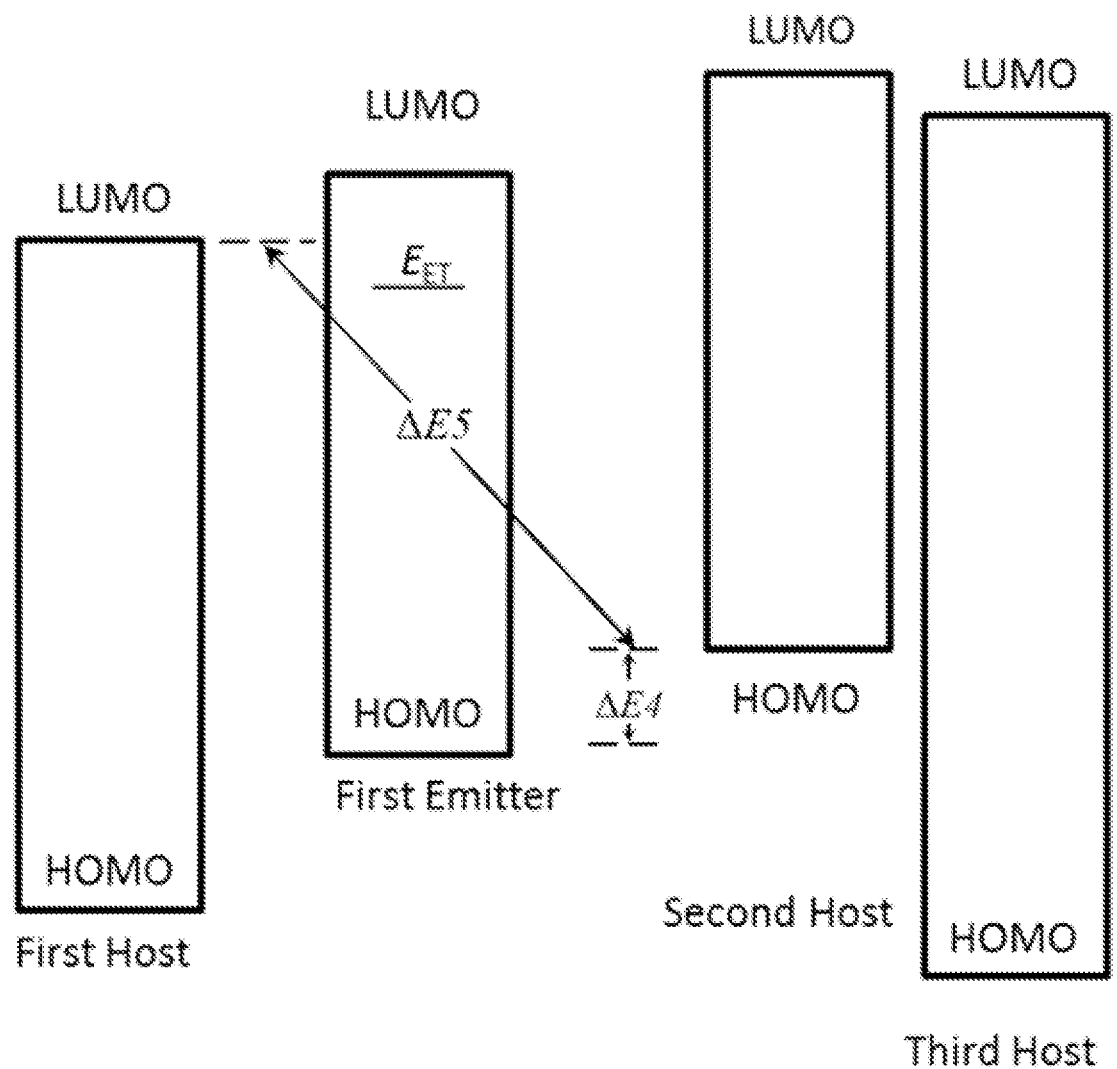
FIG. 14 illustrates the relative HOMO and LUMO energy levels of the first emitter, the first host, the second host, and the third host in a three hosts system device according to some embodiments.

In some embodiments, an OLED is disclosed that comprises: an anode; a cathode; and an organic emissive layer disposed between the anode and the cathode. The organic emissive layer comprises: a first host, a second host, and a third host; and an emitter; wherein the emitter is a phosphorescent metal complex having $E_{ET}$, $T_1$ triplet energy, of at least 2.50 eV; wherein the absolute value of the difference between the HOMO of the second host and the LUMO of the first host is represented by $\Delta E5$; wherein the absolute value of the difference between the HOMO of the emitter and the HOMO of the second host is $\Delta E4$; wherein the following relationship $a \leq \Delta E5 - E_{ET} \leq b$ is maintained wherein $a \geq 0.005$ eV, and $b \leq 0.60$ eV; wherein $\Delta E4 \leq d$; and wherein d is 1.2 eV. This energy configuration is shown in FIG. 14. In some embodiments of the OLED, d is 0.6 eV. In some embodiments, d is 0.3 eV. In some embodiments, a is 0.005 eV and b is 0.4 eV. In some embodiments, a is 0.005 eV and b is 0.2 eV. In some embodiments, a is 0.10 eV, 0.15 eV, or 0.20 eV. In some embodiments, b is 0.50 eV, 0.40 eV, 0.30 eV, or 0.25 eV. In some embodiments, $E_{ET}$ is at least 2.60 eV. In some embodiments, $E_{ET}$ is at least 2.70 eV. In some embodiments, $E_{ET}$ is at least 2.75 eV. In some embodiments, $E_{ET}$ is at least 2.80 eV.

The following are some examples of host materials that are suitable for use as the first host, the second host, and the third host, depending on the particular emitter compound that is selected.

Compound 1

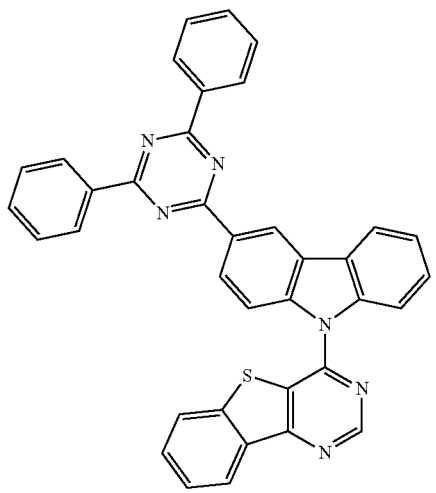

Compound 2

Compound 3

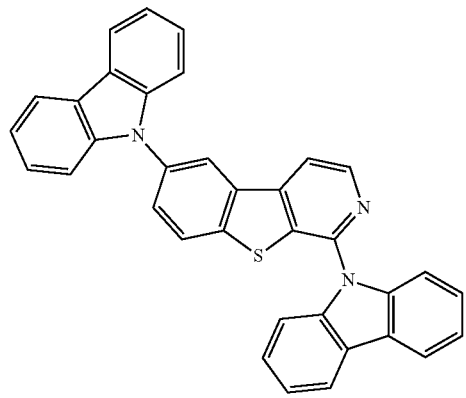

Compound 4

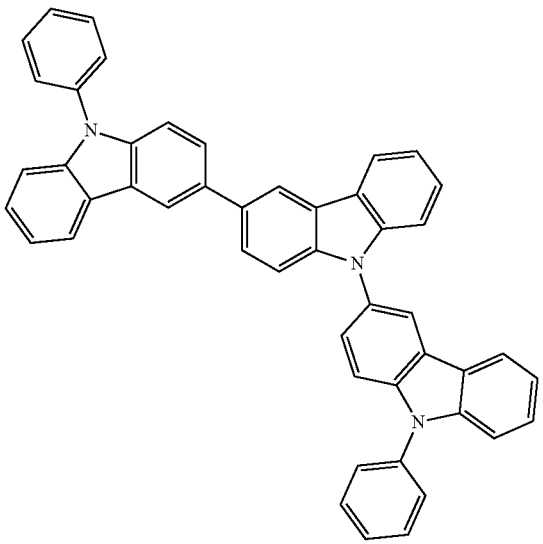

Compound 10

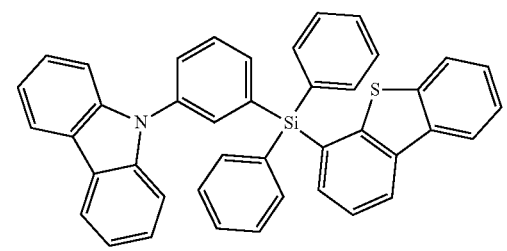

The HOMO, LUMO, and $E_{ET}$ of Compound 1, Compound 2, Compound 3, Compound 4, and Compound 10, are provided below in Table 1. The oxidation of Compound 1 is outside the window of the solvent of dimethylformamide. This means that the oxidation of Compound 1 is higher than 1.13 V which corresponds to HOMO deeper than −5.93 eV.

TABLE 1

| Material | HOMO (eV) | LUMO (eV) | $E_{ET}$ (eV) |
| --- | --- | --- | --- |
| Compound 1 | <−5.93 | −2.71 | 2.86 |
| Compound 2 | −5.7 | −2.47 | 2.95 |
| Compound 3 | −5.73 | −2.12 | 2.95 |
| Compound 4 | −5.38 | −1.84 | 2.74 |
| Compound 10 | −5.68 | −1.99 | 2.99 |

The following are some examples of emitter compounds that are suitable for use with the example host compounds.

Emitter 2

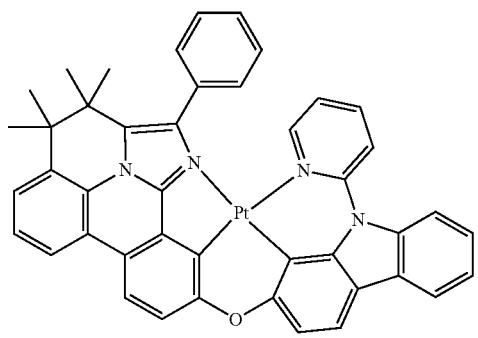

Emitter 3

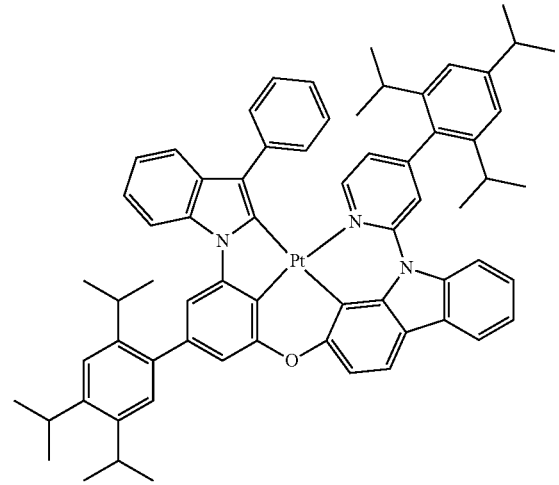

The HOMO, LUMO, and $E_{ET}$ of Emitter 2, and Emitter 3 are provided below in Table 2.

TABLE 2

| Material  | HOMO (eV) | LUMO (eV) | $E_{ET}$ (eV) |
|-----------|-----------|-----------|---------------|
| Emitter 2 | −5.37     | −2.18     | 2.76          |
| Emitter 3 | −5.40     | −2.22     | 2.76          |

The following are some examples of charge transport materials and red sensing compounds.

Compound 5

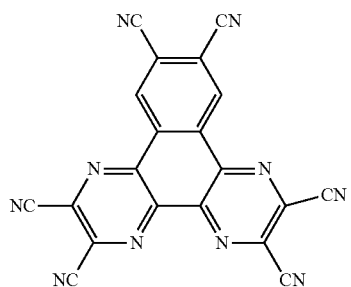

Compound 7

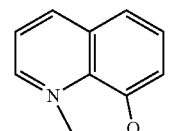

Compound 9

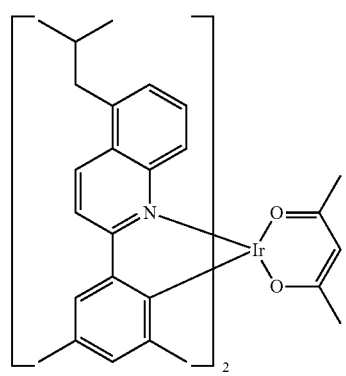

Compound 6

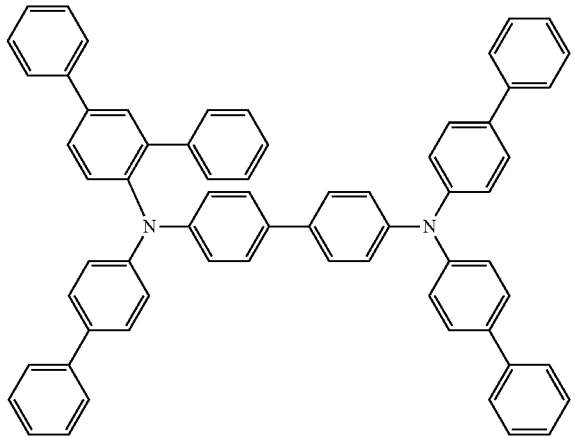

Compound 8

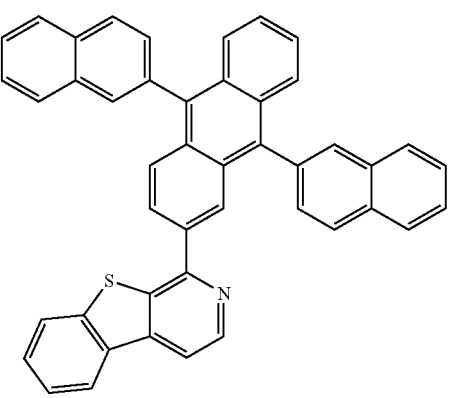

The HOMO, LUMO, and $E_{ET}$ levels for any given organic compounds can be readily measured and one of ordinary skill in the art would know how to measure these energy values and select the appropriate combination of emitter, first host, second host, and third host compounds that would meet the energy configurations disclosed herein. For example, to measure the energy levels, the inventors performed solution cyclic voltammetry (CV) and differential pulsed voltammetry using a CH Instruments model 6201B potentiostat using anhydrous dimethylformamide solvent and tetrabutylammonium hexafluorophosphate as the supporting electrolyte. Glassy carbon, and platinum and silver wires were used as the working, counter and reference electrodes, respectively. Electrochemical potentials were referenced to an internal ferrocene-ferrocenium redox couple (Fc/Fc+) by measuring the peak potential differences from differential pulsed voltammetry. The corresponding HOMO and LUMO energies were determined by referencing the cationic and anionic redox potentials to ferrocene (4.8 eV vs. vacuum) according to literature. The $T_1$ triplet energy of the materials is measured by dissolving the material in 2-methyl tetrahydrofuran and cooling the mixture to 77 K to form a frozen glass. The photoluminescence is measured using a Horiba Fluorolog fluorimeter and the $T_1$ is taken as $1^{st}$ emission peak. When the HOMO and LUMO are measured in the solid state with techniques such as Ultraviolet Photoelectron Spectroscopy (UPS) or Inverse Photoelectron Spectroscopy (IPES) the actual values are generally different than those measured with CV method. However, the relative difference in the energy levels between different molecules is fairly similar regardless of the measurement technique used. Thus, so long as one compares the relative energy level difference using the same technique, the energy difference should be similar for a given set of molecules being compared.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

An emissive region in an OLED is disclosed. The emissive region comprising a first host and an emitter, wherein the emitter is selected from the group consisting of a phosphorescent metal complex, and a delayed fluorescent emitter. The $T_1$ triplet energy of the first host $E_{H1T}$, is higher than the $T_1$ triplet energy of the emitter $E_{ET}$, wherein $E_{ET}$ is at least 2.50 eV. The LUMO energy of the first host is higher than the HOMO energy of the emitter. The absolute value of the difference between the HOMO energy of the emitter and the LUMO energy of the first host is represented by $\Delta E1$ and wherein $0.05$ eV $\leq \Delta E1 - E_{ET} \leq 0.60$ eV.

Figure 9:
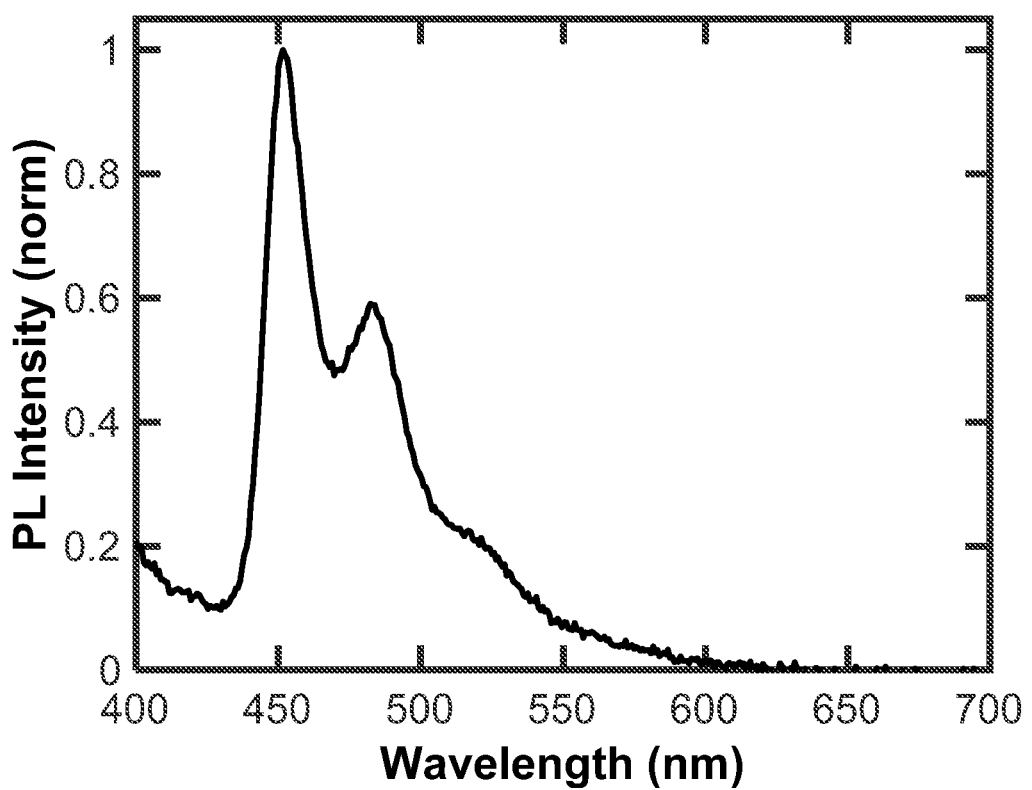
FIG. 9 shows a plot of photoluminescence of Emitter 2 in drop cast poly (methyl methacrylate) (PMMA) at room temperature demonstrating the intrinsic emission spectrum of Emitter 2.

FIG. 9 shows photoluminescence of Emitter 2 in poly (methyl methacrylate) at room temperature demonstrating the intrinsic emission spectrum of Emitter 2. The 1931 CIE coordinates of this spectrum are (0.146,0.149).

There are a number of requirements for the e-host that increase the performance of blue devices. The two foremost requirements for having the e-host to increase the lifetime of a device are: (1) the addition of e-host does not form an exciplex or charge transfer (CT) state with the emitter; and (2) that the charges are balanced with an exciton profile not pinned at an interface. Exciplex is an electronic state formed between two molecules, one a donor and the other an acceptor, which can subsequently dissociate in a deactivation process. The requirement that the addition of the e-host does not form an exciplex or CT state as the lowest energy state in the device will maintain the blue color of the phosphorescent emitter. The CT state exists between the e-host and the other components when a hole resides on an emitter or a host molecule and an electron resides on the e-host. A rough estimate of the CT state energy is the absolute value of the energy difference between the HOMO level of the emitter and the LUMO level of the e-host, $\Delta E1$. Since the CT state is composed of an electron and a hole that are fairly well separated spatially, the energy difference between the S1 singlet and the $T_1$ triplet state of the CT will be small and $\Delta E1$ is a good approximation of the $T_1$ triplet state of the CT state. Having any CT state (if formed) that is higher in energy than the $T_1$ triplet of the emitter is OK for device operation. If the CT state is higher in energy than the emitter's $T_1$, there are two important aspects for the device. First, the emission spectrum of the device will be that of the emitter and not the CT state. Second, there will be a minimal loss in emitter's photoluminescence quantum yield (PLQY) in the host system. Conversely, if the CT state is the lowest energy state in the emission system, the $T_1$ triplet of the emitter will be quenched into the CT state and the CT state spectrum will dominate the device's emission spectrum.

Figure 15:
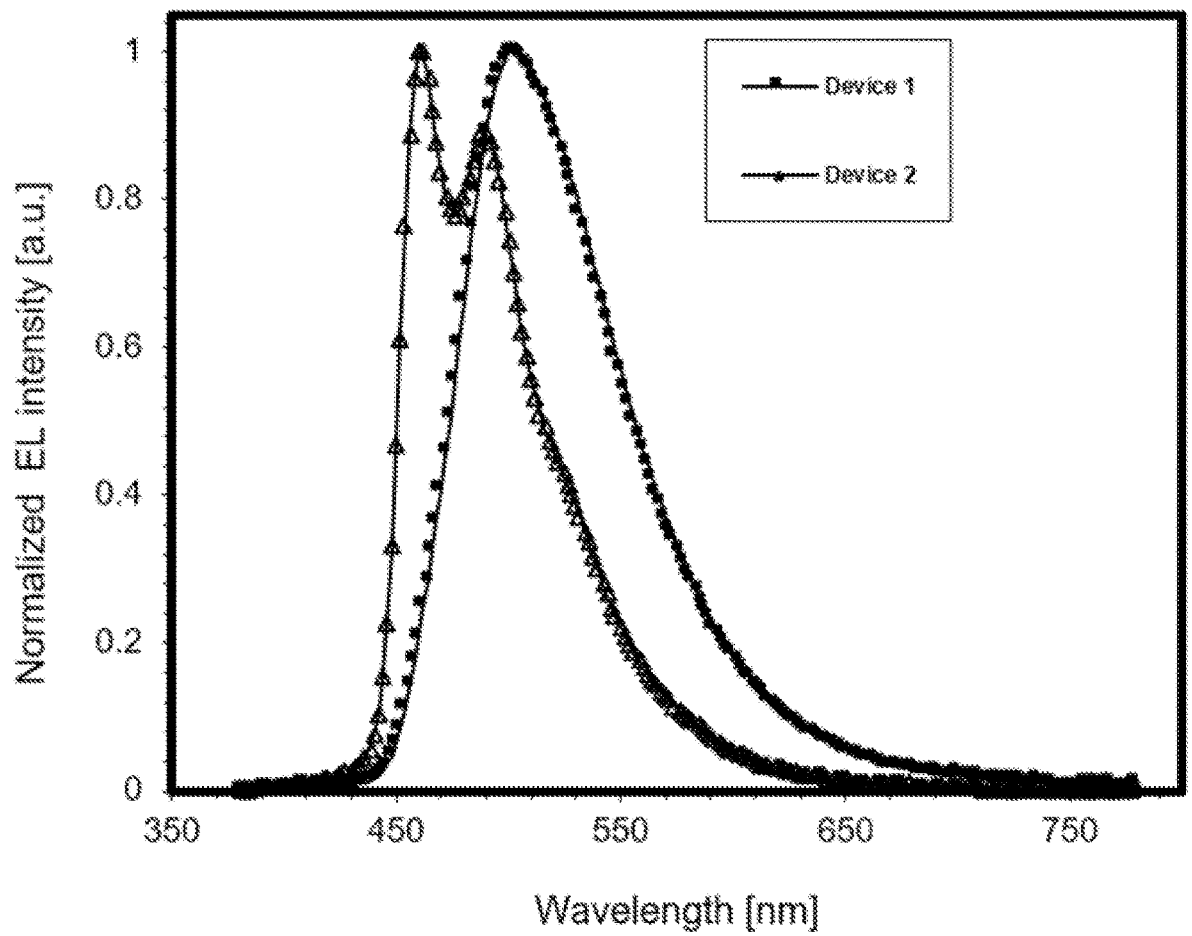
FIG. 15 shows the electroluminescent spectra of the experimental devices Device 1 and Device 2.

For example, Table 3 contains the device structures and data for two different single-component e-hosts for blue phosphorescence emitter (Emitter 2). The terms "device structures" here refers to the material make up of the layers in the device. In the results, we can see that a lower energy CT state is formed when using Compound 1 (Cmp 1) as the host material. This is readily observed by the change in the peak wavelength from 461 nm of Device 2 to the peak of 502 nm in Device 1. This can be seen in the emission spectrum of Device 1 and Device 2 provided in FIG. 15. Further, the FWHM of Device 1 increases to 83 nm consistent with a Gaussian emission spectrum that is typically exhibited when an exciplex is formed. With Compound 2 (Cmp 2) as the host, the spectral emission of the blue device is very similar to that of Emitter 2 drop cast in poly (methyl methacrylate) (PMMA), indicating that no CT state is formed with Compound 2 as the host. The emission spectrum of Emitter 2 in drop cast PMMA at room temperature is shown in FIG. 9, which shows the emission spectrum of Emitter 2. The 1931 CIE coordinates of this spectrum are (0.146,0.149) and the peak emission wavelength is 452 nm.

TABLE 3

Device structures and data. This table is split into two parts.

| | Device structure | | | | | | | | | |
|---|---|---|---|---|---|---|---|---|---|---|
| | | | | EML | | | | | 1931 CIE | |
| | HIL | HTL | EBL | Host | Emitter | BL | ETL | EIL | | |
| | [100 Å] | [250 Å] | [50 Å] | [300 Å] | [10%] | [50 Å] | [300 Å] | [10 Å] | x | y |
| Device 1 | Cmp 5 | Cmp 6 | Cmp 4 | Cmp 1 | Emitter 2 | Cmp 2 | Cmp 7:Cmp 8 35% | Cmp 7 | 0.246 | 0.507 |
| Device 2 | Cmp 5 | Cmp 6 | Cmp 4 | Cmp 2 | Emitter 2 | Cmp 2 | Cmp 7:Cmp 8 35% | Cmp 7 | 0.155 | 0.282 |

| | | | at 10 mA/cm² | | | |
|---|---|---|---|---|---|---|
| | λ max [nm] | FWHM [nm] | Voltage [V] | LE [cd/A] | EQE [%] | PE [lm/W] |
| Device 1 | 502 | 83 | 3.6 | 11 | 3.7 | 9 |
| Device 2 | 461 | 64 | 3.5 | 7 | 3.7 | 4.1 |

HIL = hole injection layer; HTL = hole transport layer; EBL = electron blocking layer; EML = emissive layer; BL = hole blocking layer; ETL = electron transport layer; EIL = electron injection layer; the devices also had a 1000 Å Al cathode.
All doping percenages are in volume percent.

The experimentally realized CT state formed between Cmp 1 and Emitter 2 can be verified by comparing ΔE to the $T_1$ triplet energy of Emitter 2. The HOMO level of Emitter 2, as determined by CV, is −5.37 and the LUMO level of Compound 1, as determined by CV, is −2.71. For the combination of Compound 1 and Emitter 2, ΔE is 2.66 eV. For Emitter 2, the 77 K emission peak is at 449 nm which corresponds to a triplet energy of 2.76 eV. Thus, we see that the CT state with energy ΔE is lower in energy than the $T_1$ triplet of Emitter 2. In turn, the device emission is dominated by the CT state, leading to non-blue emission and low external quantum efficiency (EQE).

Compound 2 is the converse example. The LUMO level of Compound 2 is −2.47 eV as determined by CV. The ΔE for Emitter 2 and Compound 2 is 2.90 eV which is greater than the 2.76 eV triplet energy of Emitter 2. This leads to the $T_1$ triplet energy of Emitter 2 being the lowest energy state in the device, as observed by the emission spectrum of the device matching that of Emitter 2 in PMMA.

In addition to the avoidance of CT state formation, requirement (1), the use of an electron transporting material in a deep blue phosphorescent device requires careful consideration of charge balance, requirement (2). A properly charge balanced device can greatly increase the efficiency and LT of the blue phosphorescent device and spreading the exciton profile over the thickness of the emissive layer can increase lifetime of the device.

Figure 10:
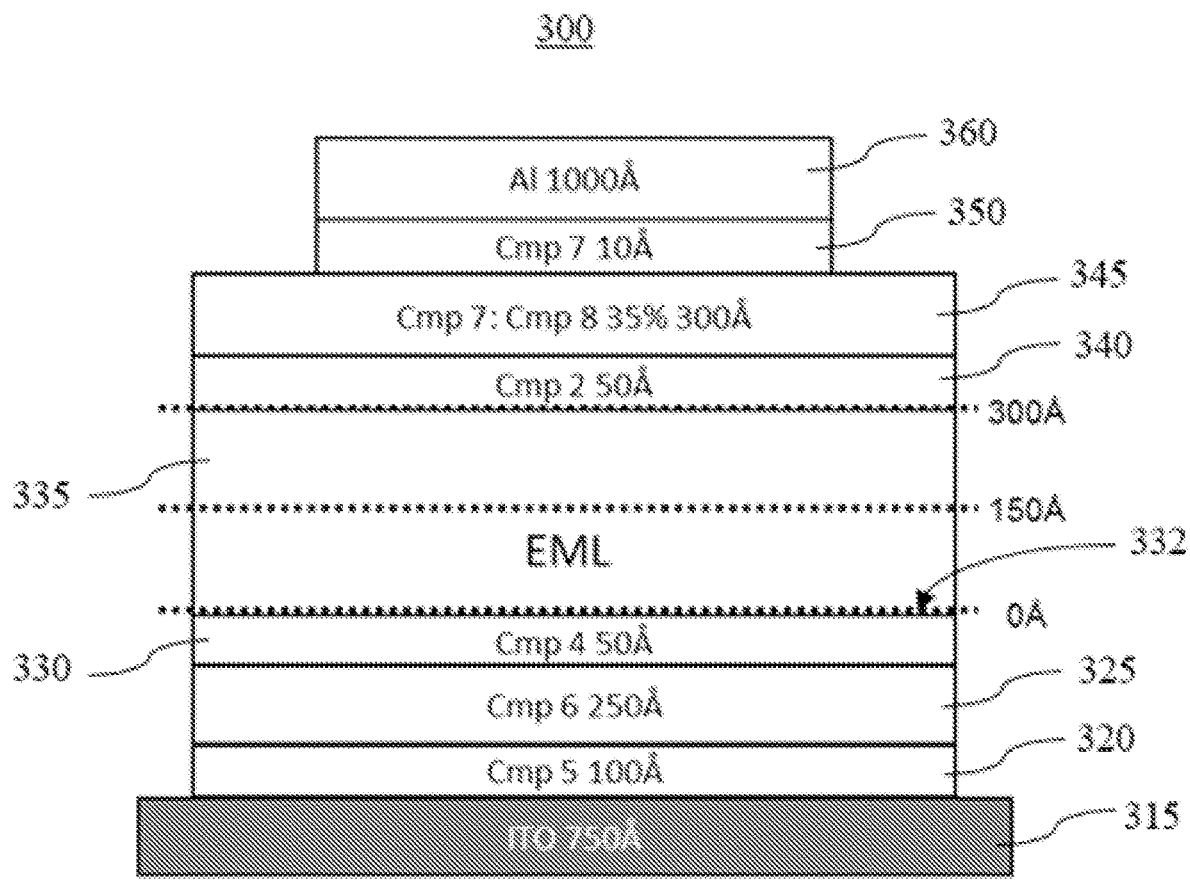
FIG. 10 is a schematic illustration of a red probe device 300 with the materials for the layers other than the emissive layer (EML) specified. The dashed lines indicate the different locations where the red sensing layer was inserted. The locations for the red sensing layer is marked with distances relative to the EBL/EML interface 332 and are reported in angstroms.

In order to evaluate whether a given emissive layer composition spreads the exciton profile over the thickness of the emissive layer requires the ability to probe the location of the exciton population spatially. Inventors used a 20 Å thick sensing layer to probe the location of the exciton population in the emissive layer. FIG. 10 is a schematic depiction of a red probe device 300 used with all of the layers other than the emissive layer (EML) 335 specified. The red probe device 300 is comprised of an ITO (750 Å thick) anode layer 315; Compound 5 (100 Å thick) as a hole injection layer (HIL) 320; Compound 6 (250 Å thick) as a hole transport layer (HTL) 325; Compound 4 (50 Å thick) as an electron blocking layer (EBL) 330; EML 335; Compound 2 (50 Å thick) as a hole blocking layer (HBL) 340; Compound 7 and Compound 8 (300 Å thick; 65 vol. %:35 vol. %) as a electron transport layer (ETL) 345; Compound 7 (10 Å thick) as an electron injection layer (EIL) 350; and Al (1000 Å thick) as a cathode 360. The dashed lines 0A, 150A, and 300A identify the locations, noted as the distance from the EBL/EML interface 332 reported in angstroms, where 20 Å thick neat layers of Compound 9, a red emitter as red sensing layers, were deposited within the emissive layer 335. Excitons on the blue phosphorescent molecules near the red sensing layer will be quenched to become excitons on the red phosphorescent emitter; while excitons far away from the red sensing layer will not be quenched. Thus, devices with the red sensing layer will have a combination of red and blue emission. The more red emission in the spectrum of the device for a fixed amount of red dopant, the more blue exciton are within a transfer radius of the sensing layer. This means, that the more red emission in the spectrum, the more blue excitons reside at that spatial location within the device. We assume that the quenching efficiency is independent of the number of blue excitons and that the red emitter molecules do not perturb charge balance as the layer is discontinuous (due to its 20 Å thickness).

Figure 11A:
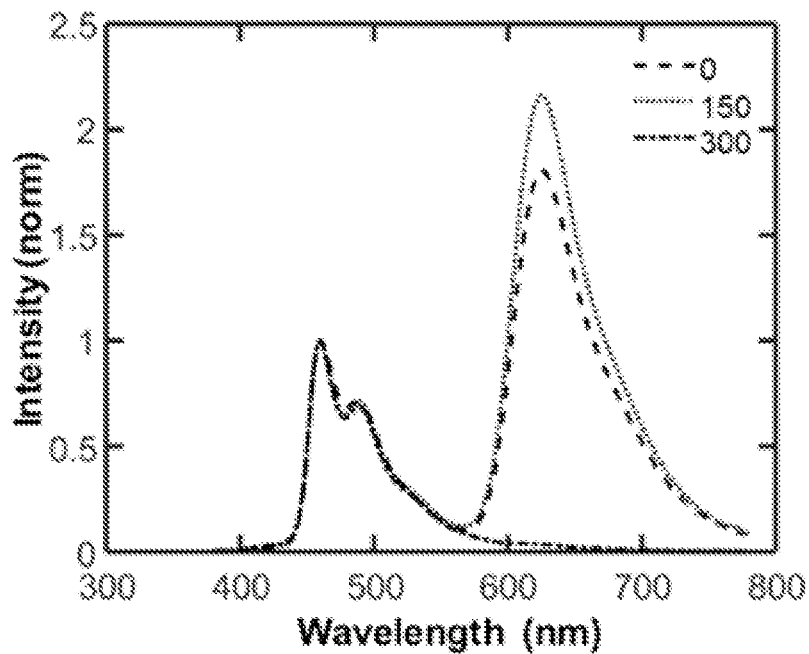
FIG. 11A shows the electroluminescent spectra from three example red probe devices each with a red sensing layer formed of 20 Å thick Compound 9 provided at a distance of 0 Å, 150 Å, and 300 Å from the EBL of Compound 4.
Figure 11B:
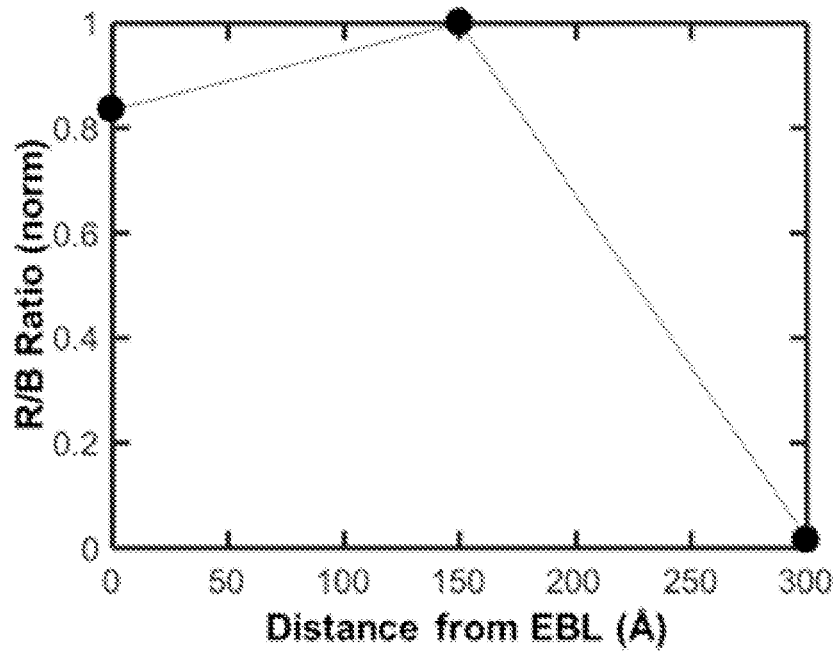
FIG. 11B shows the normalized red to blue intensity ratio (R/B) as a function of the position of the sensing layer. The higher the R/B value the larger the exciton population at that spatial location. The measurements were taken at driving current density of 10 mA/cm$^2$.

FIG. 11A shows electroluminescent spectrum from the example red probe device 300 with the probe layer of 20 Å of Compound 9 at a distance of 0,150, and 300 Å from the EBL of Compound 4. FIG. 11B shows red to blue intensity ratio (R/B) as a function of the position of the sensing layer. The higher the R/B value the larger the exciton population at that spatial location. The measurement occurred at 10 mA/cm².

Figure 12:
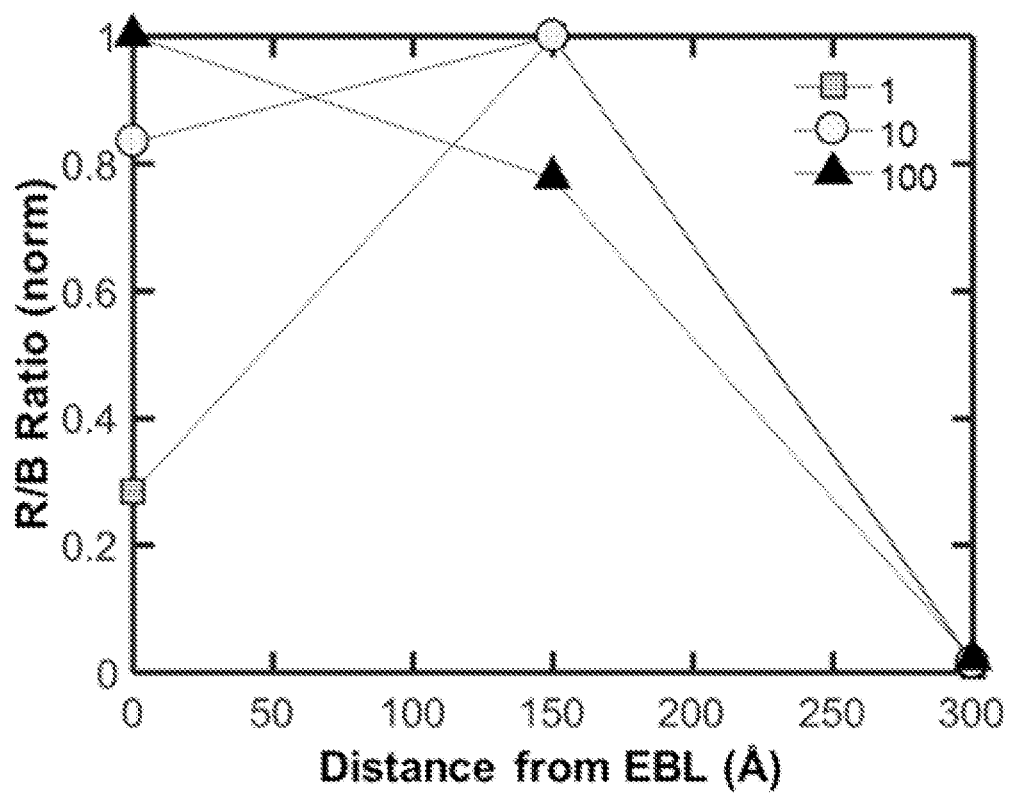
FIG. 12 shows the R/B ratio of the device from FIGS. 11A and 11B at driving densities of 1, 10, and 100 mA/cm$^2$. Thus, the plot for the R/B ratio taken at 10 mA/cm$^2$ is the same plot shown in FIG. 11B.

FIG. 12 is a plot of the R/B ratio of the device 300 at driving densities of 1, 10, and 100 mA/cm2.

FIGS. 13A-13D are plots of R/B ratio as a function of driving current density for Device 2a, Device 2b, Device 2c, and Device 2d, respectively.

Using the red probe experiment and through varying the composition of the emissive layer we can demonstrate certain compositions that result in either good exciton profiles and/or good charge stability. In doing so we will use the device structure of FIG. 10 where the composition of the emissive layer is varied.

Referring to FIGS. 11A and 11B, an example of understanding how the red sensing devices work will be described. FIG. 11A shows a plot of the normalized emission spectrum of a red probe device with a 20 Å layer of Compound 9 doped at various distances from the HTL-EML interface 332. The plot is normalized at the location of the peak emission of the blue emitter for clarity. The lines labeled as "0" "150" and "300" correspond to the three red sensing devices each having the red sensing layer of Compound 9 at locations 0A, 150A, and 300A, shown in FIG. 10, respectively. It is readily apparent that there are different amounts of red emission when the probe is at different spatial locations. To easily compare across devices with different locations of the red sensing layer, we can summarize the spectrum into a single number, the R/B ratio. The R/B ratio is the EL intensity at the peak wavelength of the red emitter divided by the EL intensity at the peak wavelength of the blue emitter. This represents the ratio of red to blue emission. For probe locations which have a high R/B ratio, this indicates that there are a large number of blue excitons at this spatial location. If the R/B ratio is low, then the blue light is coming from blue excitons which are not quenched by the red sensing layer and there are few blue excitons at this spatial location. FIG. 11B is a plot of the R/B ratio for the devices in FIG. 11A. The R/B ratio demonstrates that blue excitons reside at the HTL-EML interface 332 and also the middle of the EML but not at the ETL side of the EML.

In addition to having a good exciton profile, blue phosphorescent devices should be stable to different charging current densities (electric field strengths). We can monitor the charge stability of a device by monitoring the R/B ratio as a function of current density of the device. FIG. 12 is the R/B ratio of the same three devices of FIGS. 11A and 11B measured at current densities 1, 10, and 100 mA/cm². The R/B ratio is normalized for each current density to allow for comparison between different current densities of operation. In FIG. 12 the exciton profile is strongly dependent on the current density. This is not ideal for creating stable devices. Instead, it would be better if the exciton profile is nearly constant and centered in the middle of the device.

As an example to how to design a stable blue phosphorescent devices, we can use Emitter 2. Emitter 2 is a blue phosphorescent emitter with a peak wavelength of emission at 460 nm in a device or 452 nm in PMMA and a PLQY of 70% in drop cast PMMA. Using the device structure shown in FIG. 10, we varied the host compounds which compose the emissive layer keeping the amount of Emitter 2 fixed at 10% by volume. The device results are provided in Table 4 below. In addition to the device results in Table 4, we performed red phosphorescent probe layer devices. The results of the R/B ratio as a function of current density are provided in FIGS. 13A-13D. FIGS. 13A, 13B, 13C, and 13D are the R/B ratio plots for the experimental devices 2a, 2b, 2c, and 2d, respectively, whose EML compositions are provided in Table 4. Below we discuss the results of contained in these two figures and their implications for making stable blue phosphorescent OLEDs.

TABLE 4

Device data table. The EML composition is noted. All other layer information is specified in FIG. 10. The lifetime is calculated assuming an acceleration factor of 1.8

| | EML composition [280-300 Å] | 1931 CIE x | 1931 CIE y | λ max [nm] | FWHM [nm] | Voltage [V] | at 10 mA/cm² LE [cd/A] | EQE [%] | PE [lm/W] | at 1K nits calc* 80% [h] |
|---|---|---|---|---|---|---|---|---|---|---|
| Device 2a | Cmp 2:Emitter 2 10% 280 Å | 0.156 | 0.236 | 460 | 53 | 3.41 | 4.5 | 2.7 | 4.1 | 15 |
| Device 2b | Cmp 3:Emitter 2 10% 280 Å | 0.153 | 0.218 | 460 | 51 | 4.78 | 14.5 | 9.1 | 9.5 | 38 |
| Device 2c | Cmp 3:Cmp 2:Emitter 2 40:10% 300 Å | 0.151 | 0.212 | 460 | 50 | 4.14 | 11.1 | 7.1 | 8.4 | 60 |
| Device 2d | Cmp 3:Cmp 2:Cmp 4:Emitter 2 40:25:10% 300 Å | 0.155 | 0.244 | 460 | 55 | 4.04 | 17.0 | 9.9 | 13.2 | 57 |

Devices which feature host compounds Cmp 2 and Cmp 3 are single host component devices, where Cmp 2 is an e-host and Cmp 3 is consider a h-host. The device with Cmp 2 does not show any evidence of exciplex emission with Emitter 2 showing that the first requirement for having a stable blue phosphorescent device is satisfied. There are several items to note. First, the efficiency of this device is quite low. Second, the voltage at 10 mA/cm2 is very low which is a positive. Third, the R/B ratio in FIG. 13A indicates that the excitons are all piled up at the EBL-EML interface 332. This conclusion is verified by making the same device without the EBL. We observe that the EQE at 10 mA/cm2 decreases to 0.8% and the EL spectrum has some emission from the HTL layer. These two phenomena indicate significant quenching of Emitter 2 by the HTL.

Figure 13A:
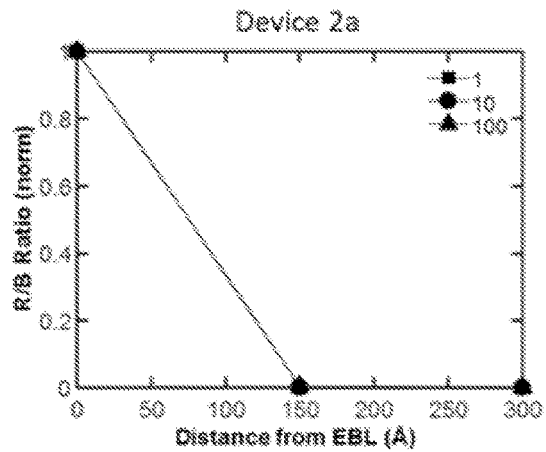
FIGS. 13A-13D are plots of R/B ratio as a function of driving current density for Device 2a, Device 2b, Device 2c, and Device 2d, respectively.
Figure 13B:
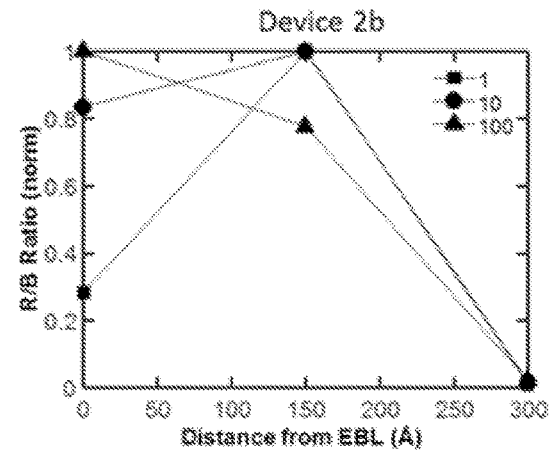
Figure 13C:
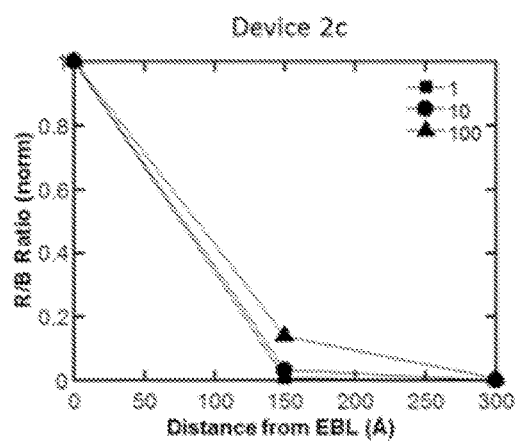

In contrast to the single-component e-host device, the single-component h-host has significantly higher EQE. However, this device has a high operating voltage. Additionally, as seen in FIG. 13B the exciton profile at low current density is good but the profile is not stable to varying the current density.

This leads to the use of a device with energy levels equivalent to FIG. 4. This device is composed of both Cmp3 and Cmp2. Using the both electron and hole conducting hosts gives a device with an EQE at 10 mA/cm² of intermediate value between the two single component devices. However, the lifetime at 1,000 nits is greater than either of the single component devices. We observe in FIG. 13C that the exciton profile is at the EBL-EML interface 332 which is not ideal and might explain why the EQE is lower than the single hole transporting device. This likely can be shifted to the middle of the EML by lowering the electron conducting host volume fraction. Never the less, the lifetime of the device is significantly increased over that of the single-component devices.

Figure 13D:
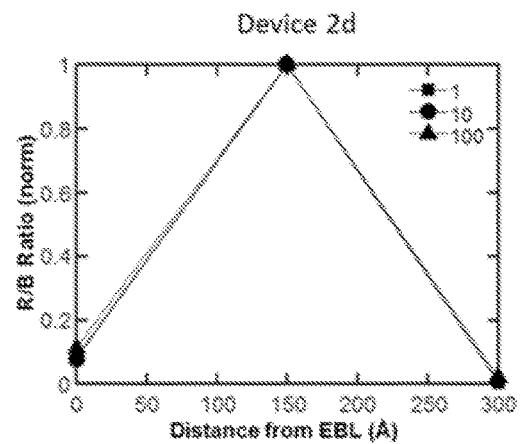

To combat the good electron transport of the device with Cmp 3: Cmp2 40% we can add an additional h-host. The energetics of the host components are depicted in FIG. 7. This additional h-host should have a HOMO level that is as shallow as possible without forming an exciplex with the electron conducting host or the emitter. This requires that the energy difference between the HOMO level of the second host (per FIG. 7) and the LUMO of the electron conducting first host be greater than the triplet energy of emitter 1 (per FIG. 7). The addition of this extra host will add hole transport and move the exciton profile away from the EBL-EML interface 332. We also expect that the increase in hole conductivity will result in a lower voltage of operation. This is what is observed with the fourth device in Table 2. The addition of Cmp 4 to the emissive layer decreases voltage and increases EQE. In FIG. 13D, we see that the exciton profile is moved to the center of the EML. Further, we observe that this exciton profile is stable to current density with the profile hardly changing with driving current density. Finally, we note that this device has the best combination of EQE, operating voltage, and lifetime. The addition of Cmp 4 did not significantly change the stability of the device LT80 at 1,000 nits.

The overall conclusions from the red probed devices plus the device results in Table 4 demonstrate managing the composition of the EML can greatly improve device performance. However, the ideal composition can vary by emitter. For example, in Table 5 provided below we show the device performance of Emitter 3 for various EML compositions. The EML composition of each device is noted in the table with the remaining layers per FIG. 10. In this case, the device performance can be improved over the single host case by using devices with energy level alignments similar to FIGS. 4, 6B, and 13 which are demonstrate with devices 3b, 3c, and 3d respectively.

hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277,

TABLE 5

Device data table. The EML composition is noted. All other layer information is specified in FIG. 10.

| | EML composition [300 Å] | 1931 CIE | | λ max [nm] | FWHM [nm] | at 10 mA/cm² | | | | at 1K nits |
| | | x | y | | | Voltage [V] | LE [cd/A] | EQE [%] | PE [lm/W] | calc* 80% [h] |
|---|---|---|---|---|---|---|---|---|---|---|
| Device 3a | Cmp 10:Emitter 3 15% | 0.133 | 0.188 | 467 | 29 | 5.64 | 12.0 | 8.9 | 6.7 | 8 |
| Device 3b | Cmp 10:Cmp 2:Emitter 3 40:10% | 0.132 | 0.191 | 467 | 33 | 4.03 | 9.3 | 6.8 | 7.3 | 19 |
| Device 3c | Cmp 10:Cmp 4:Emitter 3 40:10% | 0.129 | 0.180 | 468 | 27 | 4.07 | 12.6 | 9.7 | 9.7 | 13 |
| Device 3d | Cmp 10:Cmp 2:Cmp 4:Emitter 3 40:25:10% | 0.130 | 0.195 | 468 | 33 | 3.94 | 19.0 | 13.8 | 15.1 | 58 |

Table 5 highlights the following important information. First, use of Compound 2 in the emissive layer at 40% doping lowers the EQE at 10 mA/cm2 but increase the lifetime and lowers the operating voltage similar to Emitter 2. However, for Emitter 3, the addition of Compound 4 to the emissive layer adds hole transport to the emissive layer which increases EQE, increases lifetime, and decreases operating voltage relative to the single host device. Similar to Emitter 2, Emitter 3 experiences the best EQE, lifetime, and operating voltage when using Compound 10, Compound 2, and Compound 4 in the emissive layer.

The OLED disclosed herein can be incorporated into one or more of a consumer product, an electronic component module, and a lighting panel.

Combination with Other Materials

The materials described herein as useful for a particular layer in an organic light emitting device may be used in combination with a wide variety of other materials present in the device. For example, emissive dopants disclosed herein may be used in conjunction with a wide variety of WO2009011327, WO2014009310, US2007252140, US2015060804, US20150123047, and US2012146012.

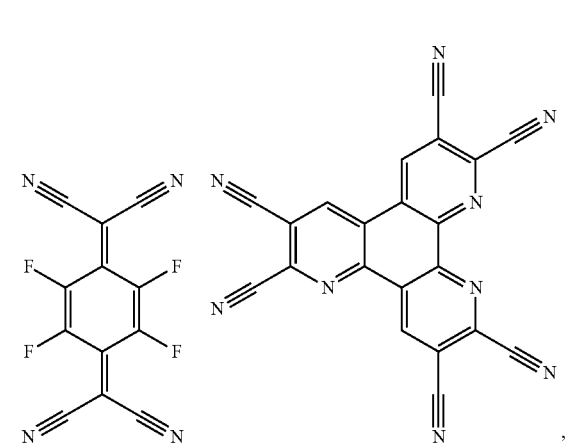

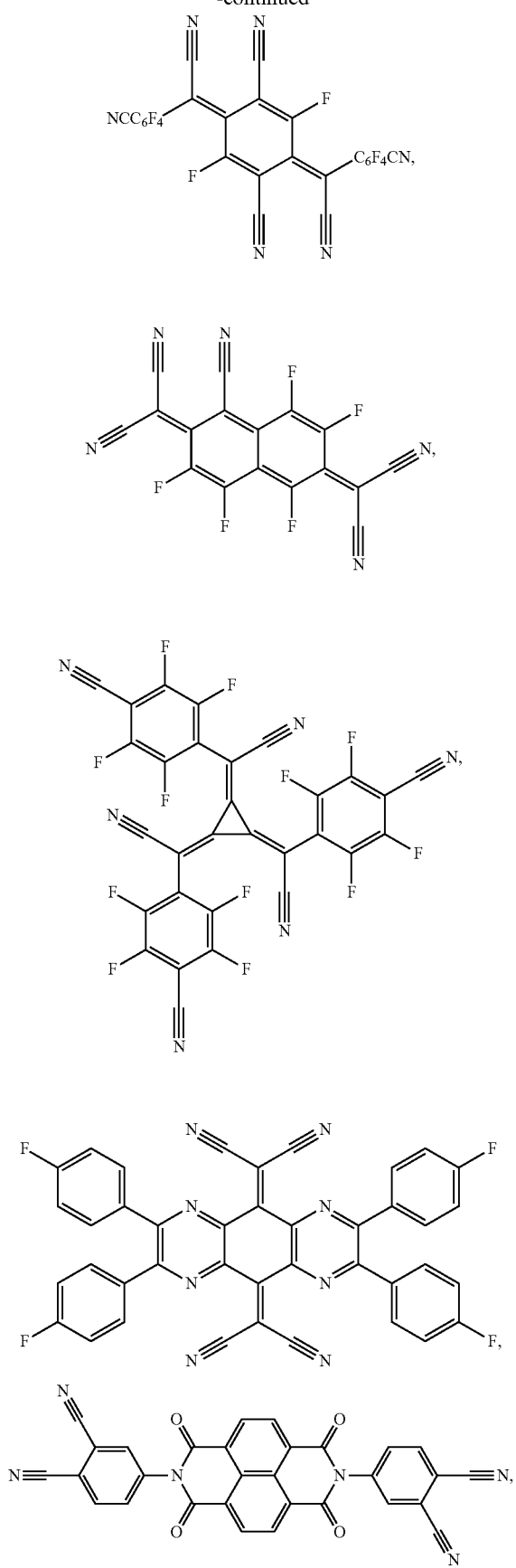
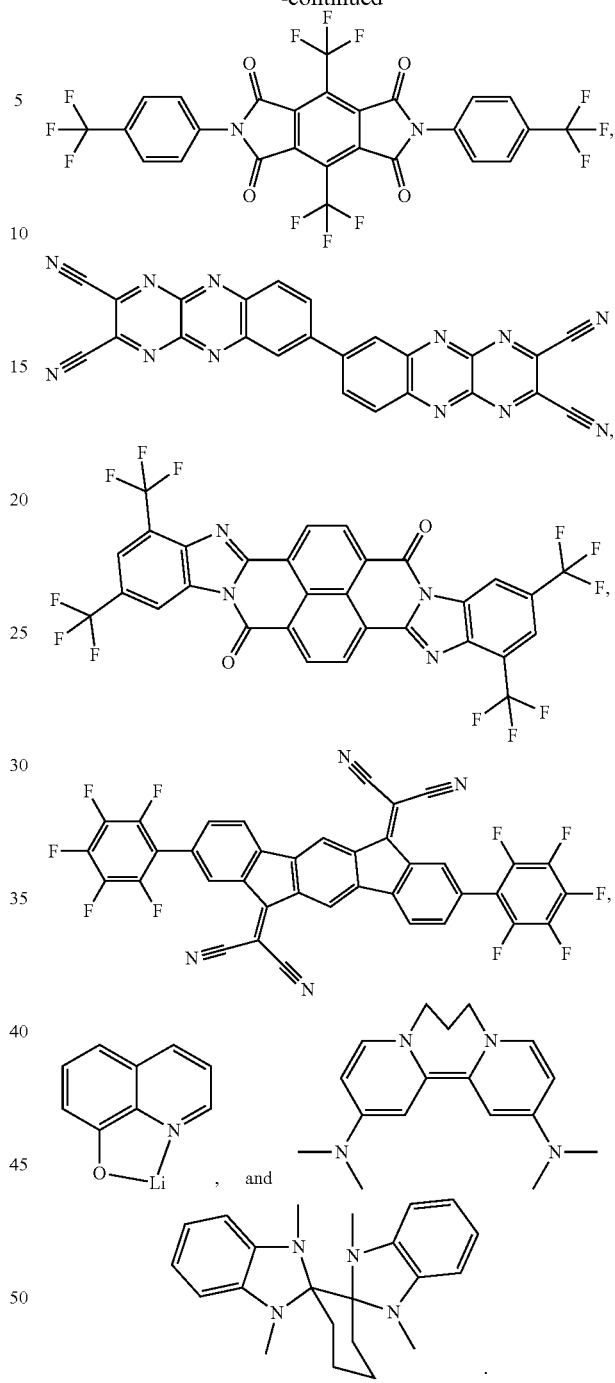

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5, 8,9,12-Hexaazatriphenylenehexacarbonitrile; a metal complex, and a cross-linkable compounds.

Examples of aromatic amine derivatives used in HIL or HTL include, but are not limited to the following general structures:

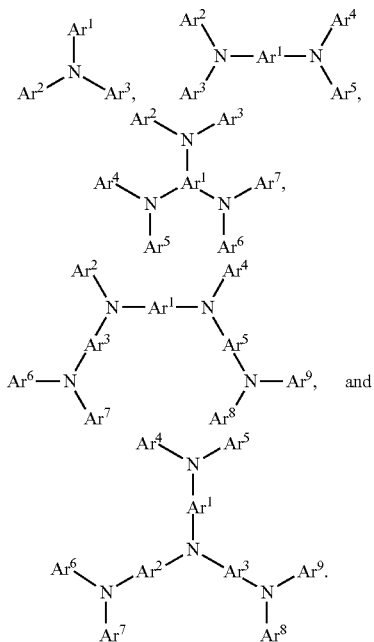

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

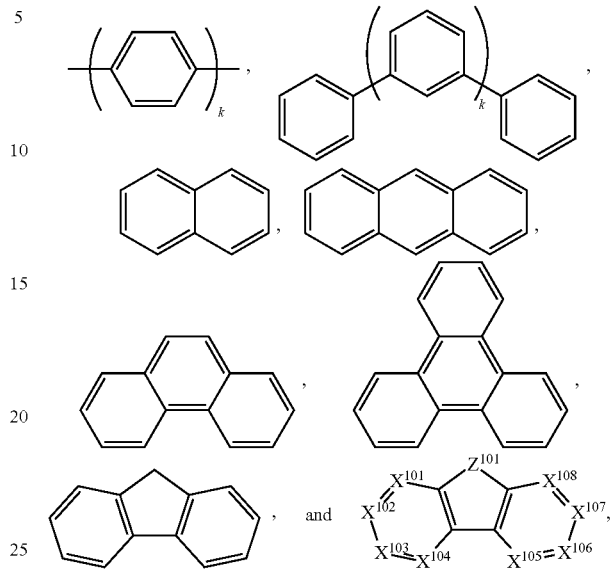

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

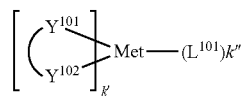

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018,
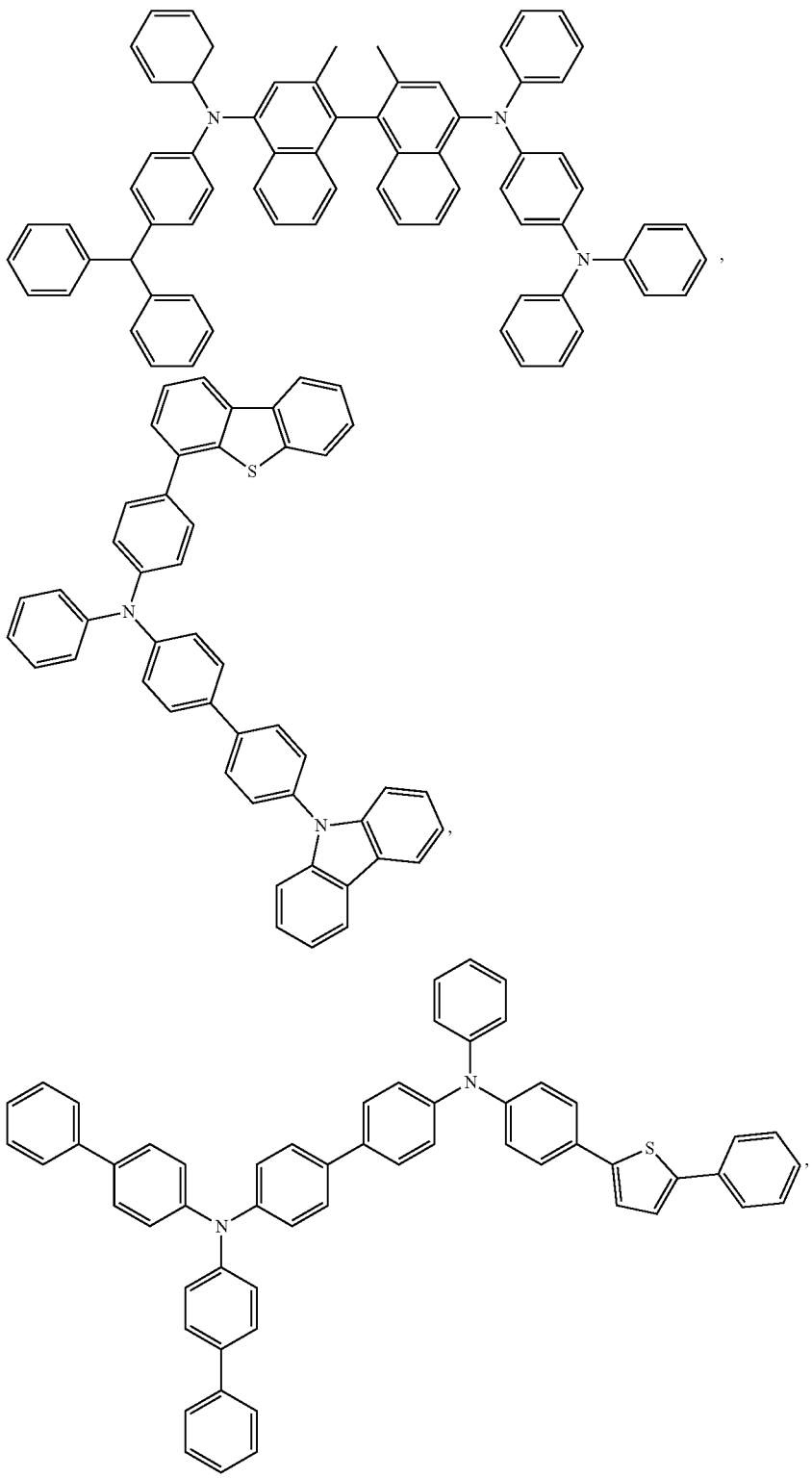

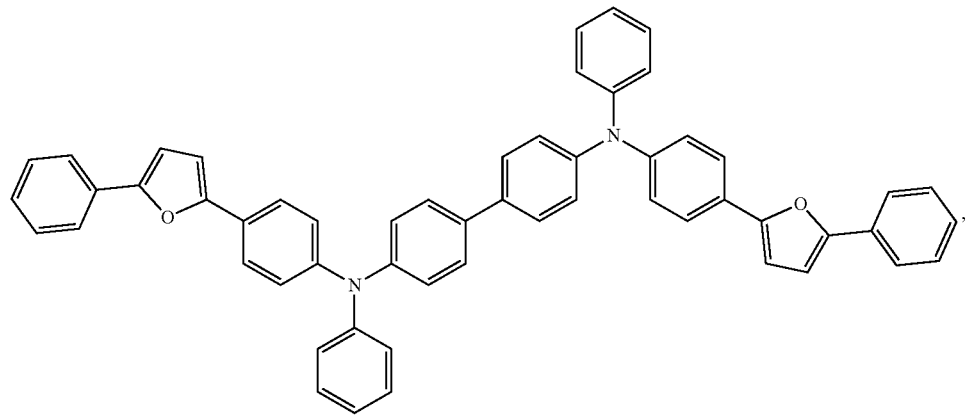
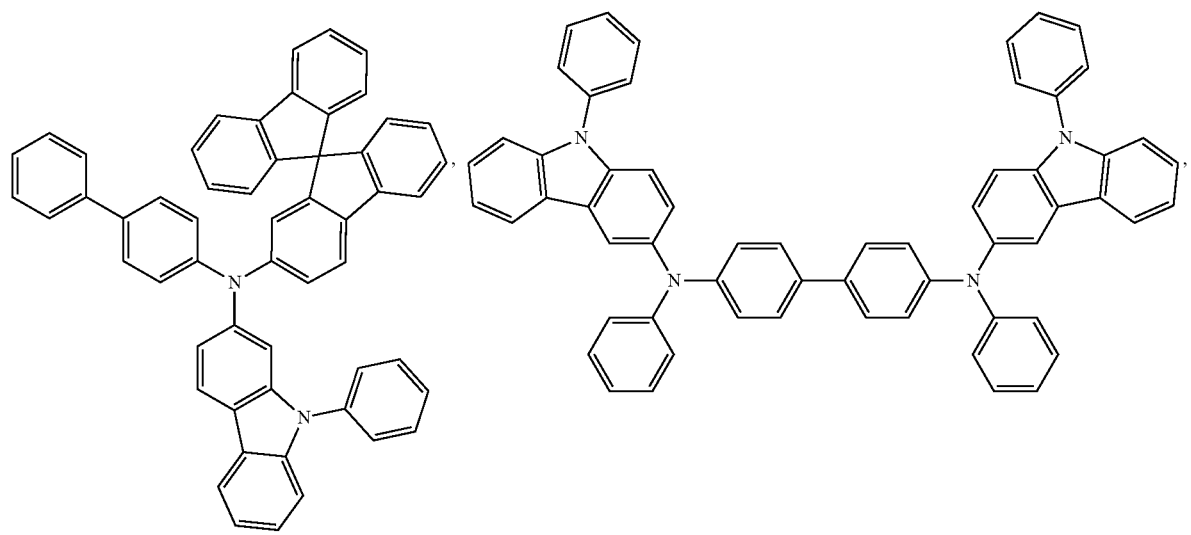
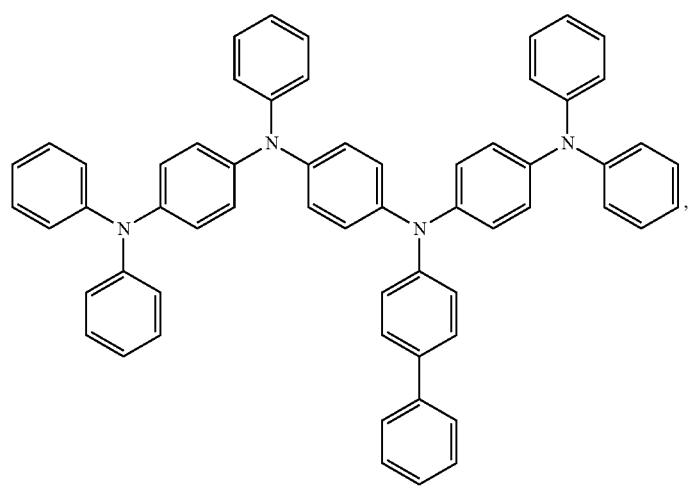

-continued
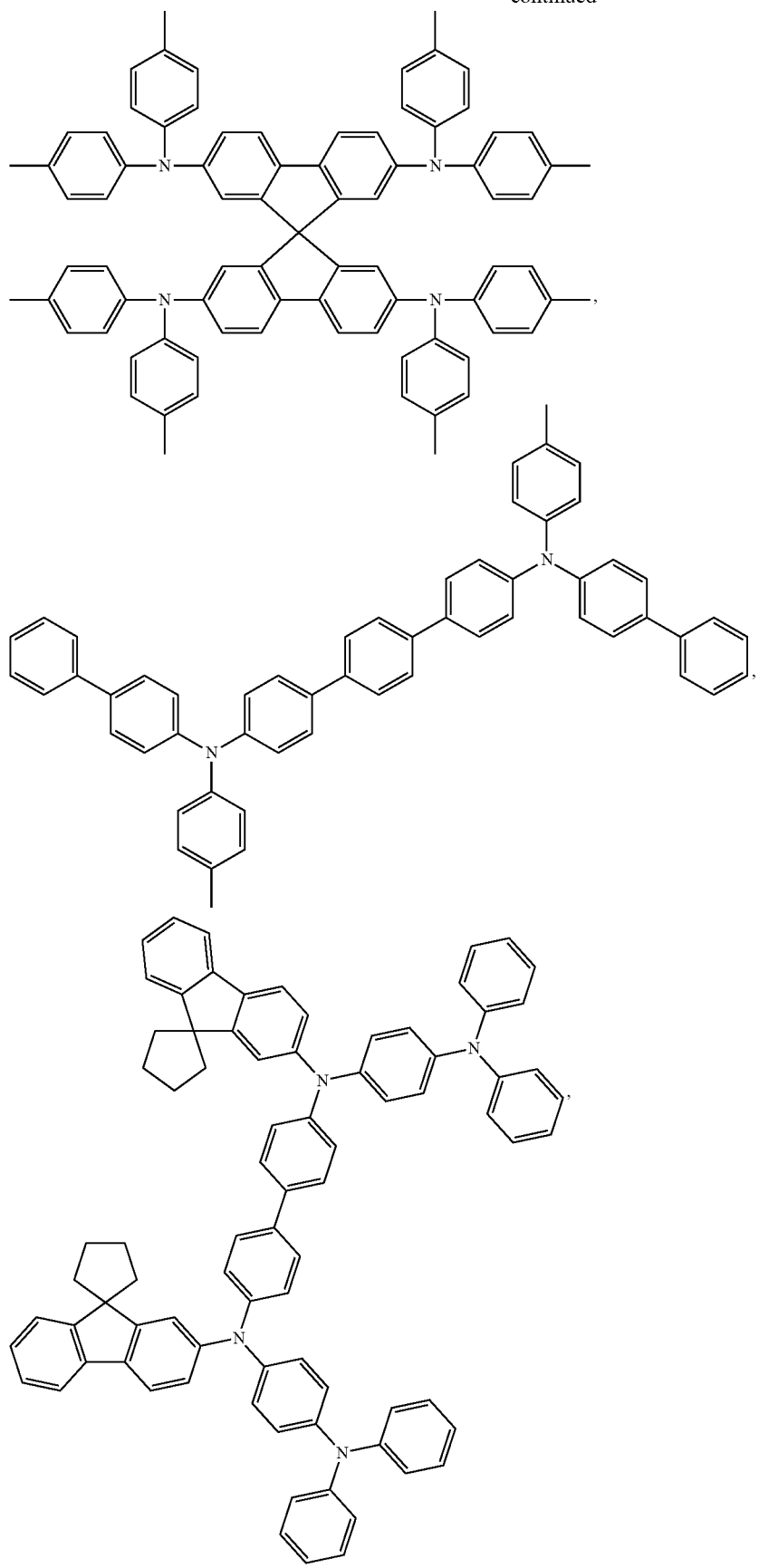

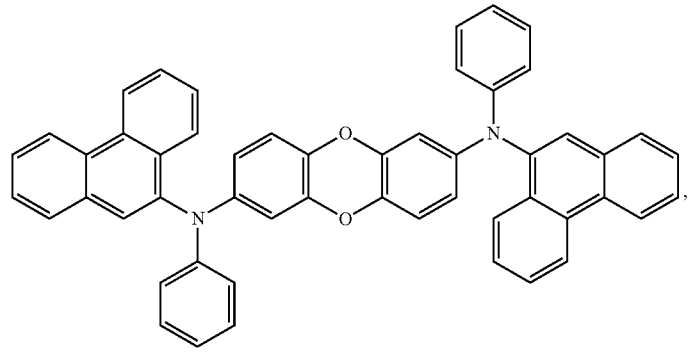
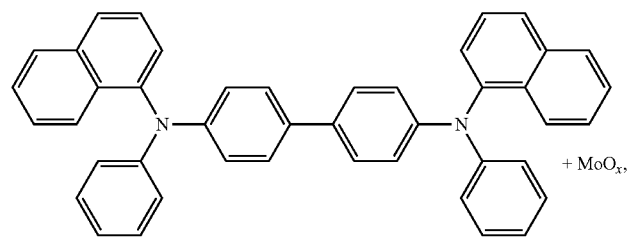
+ MoOx,
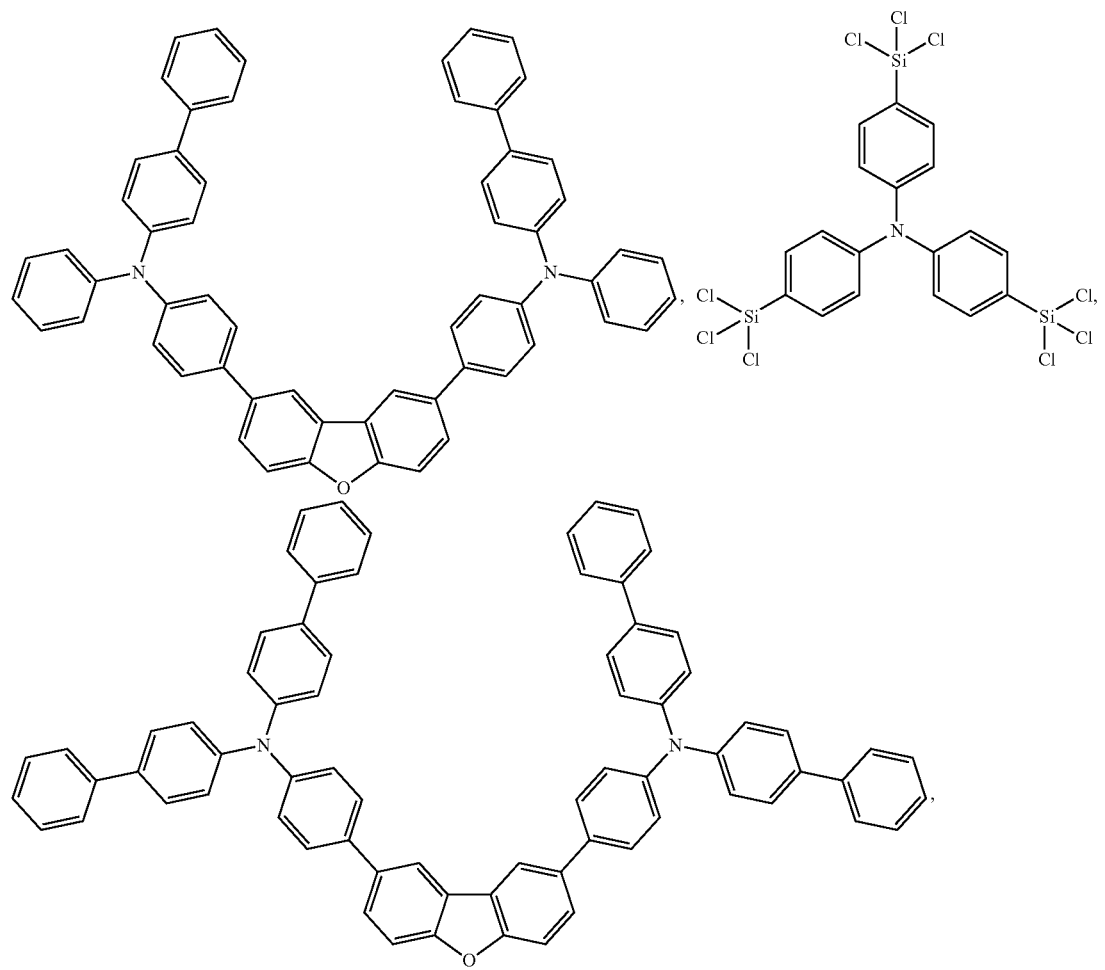

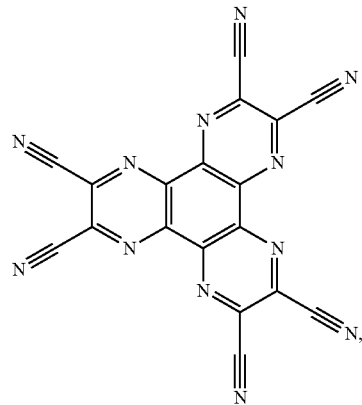
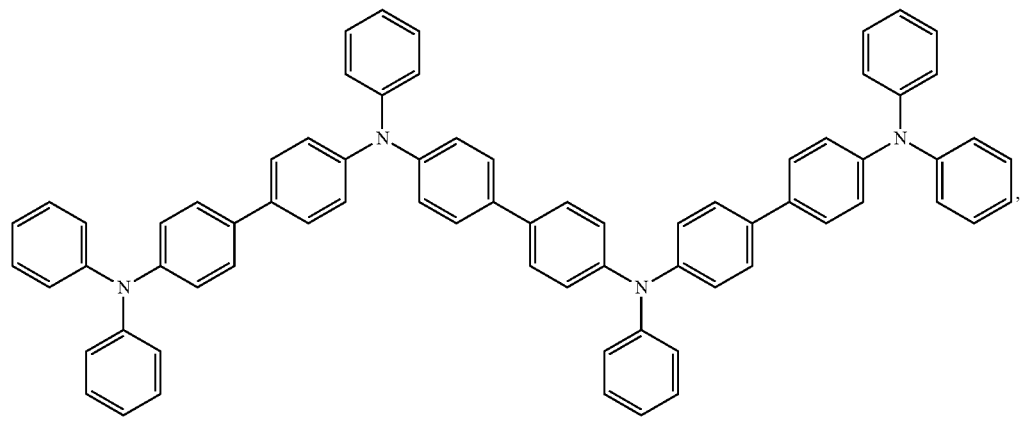
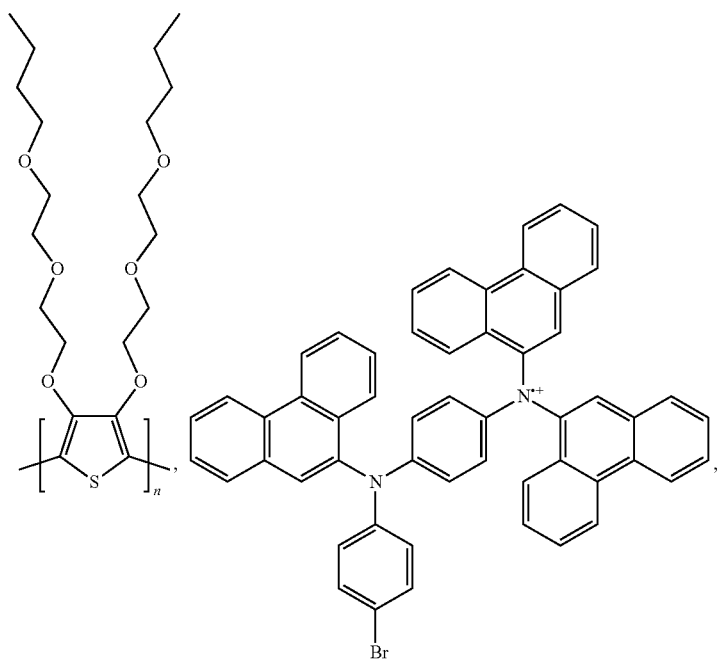

-continued
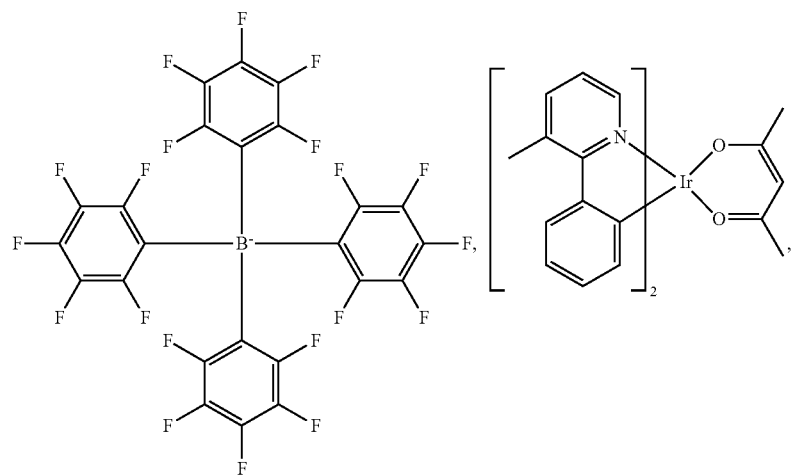
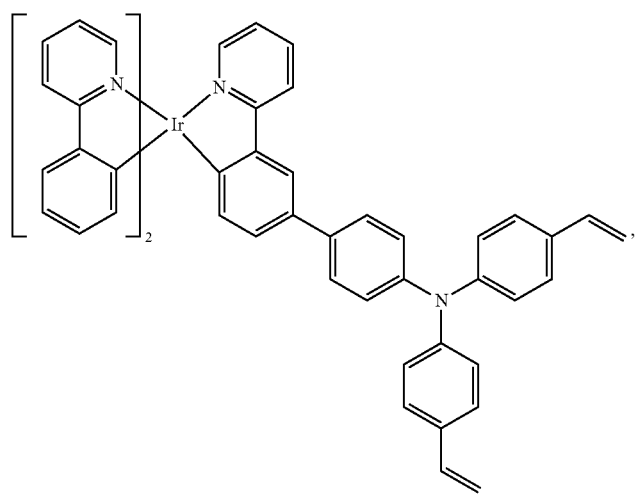
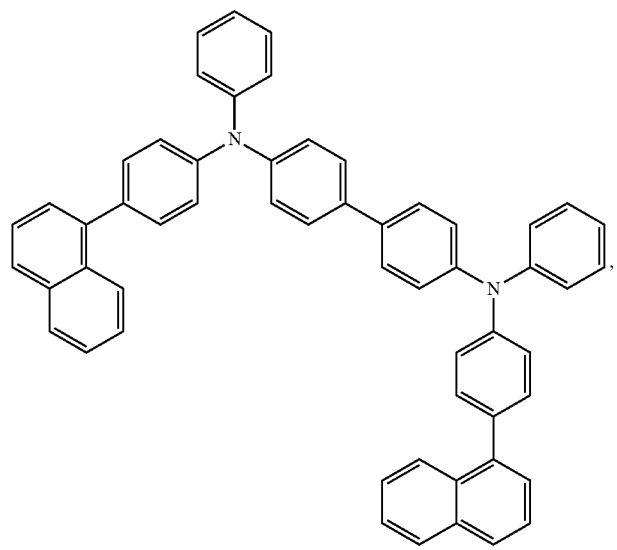

-continued
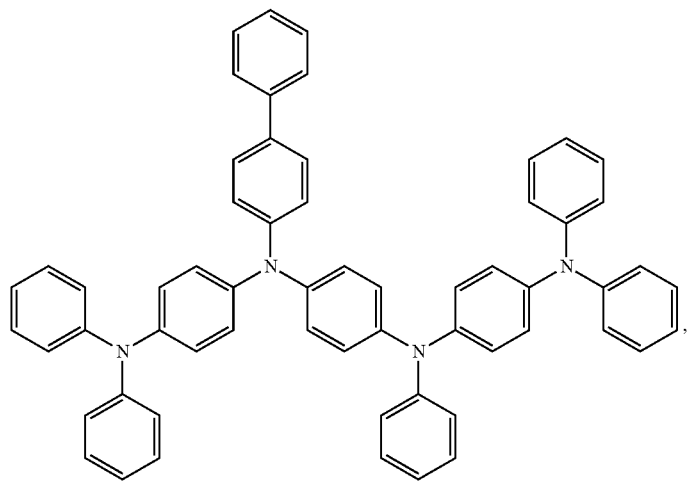
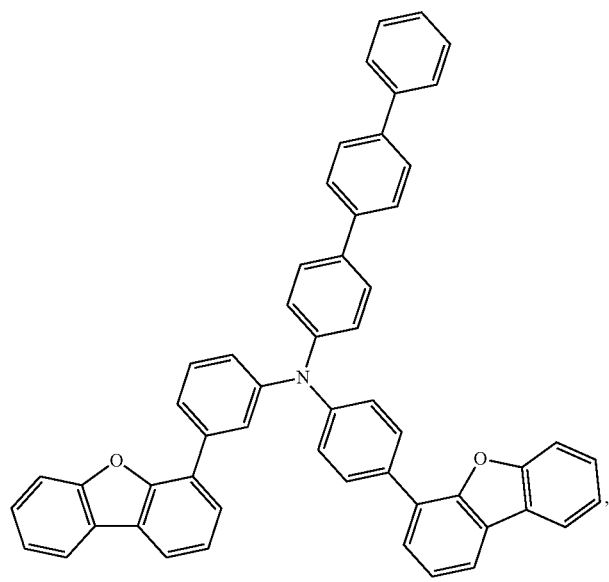
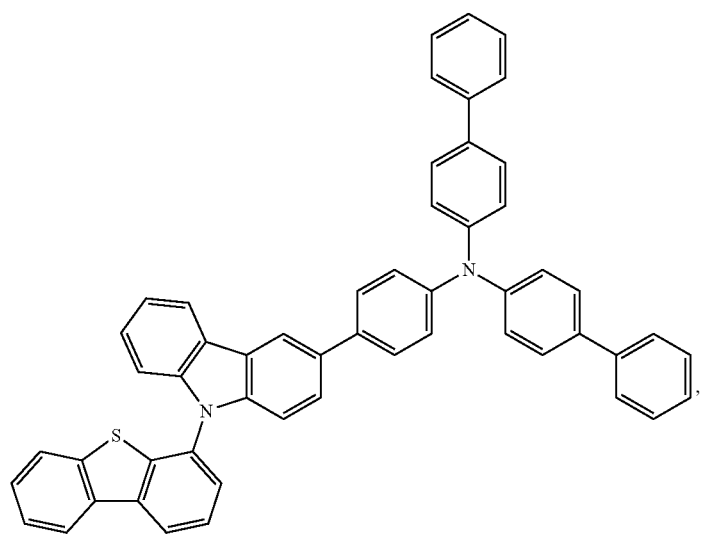

-continued
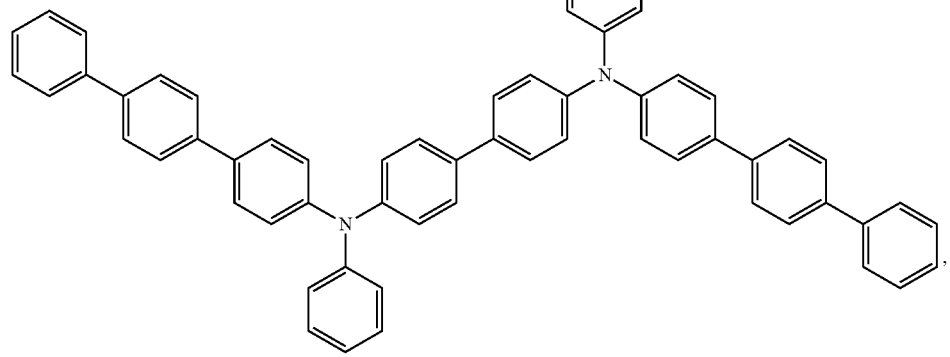
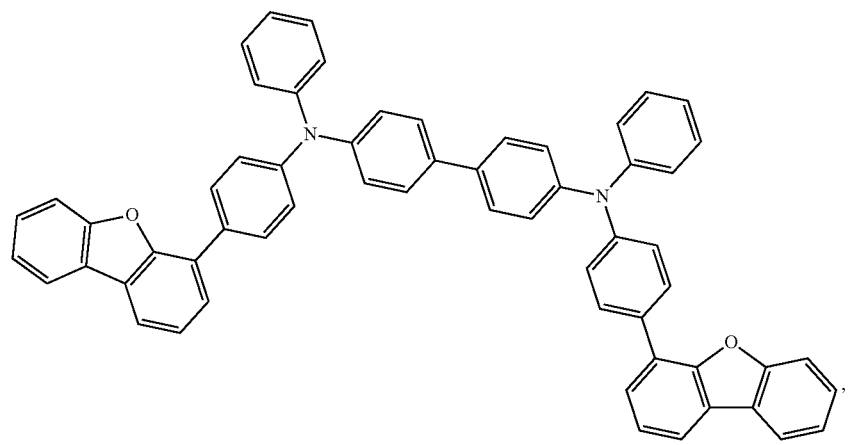
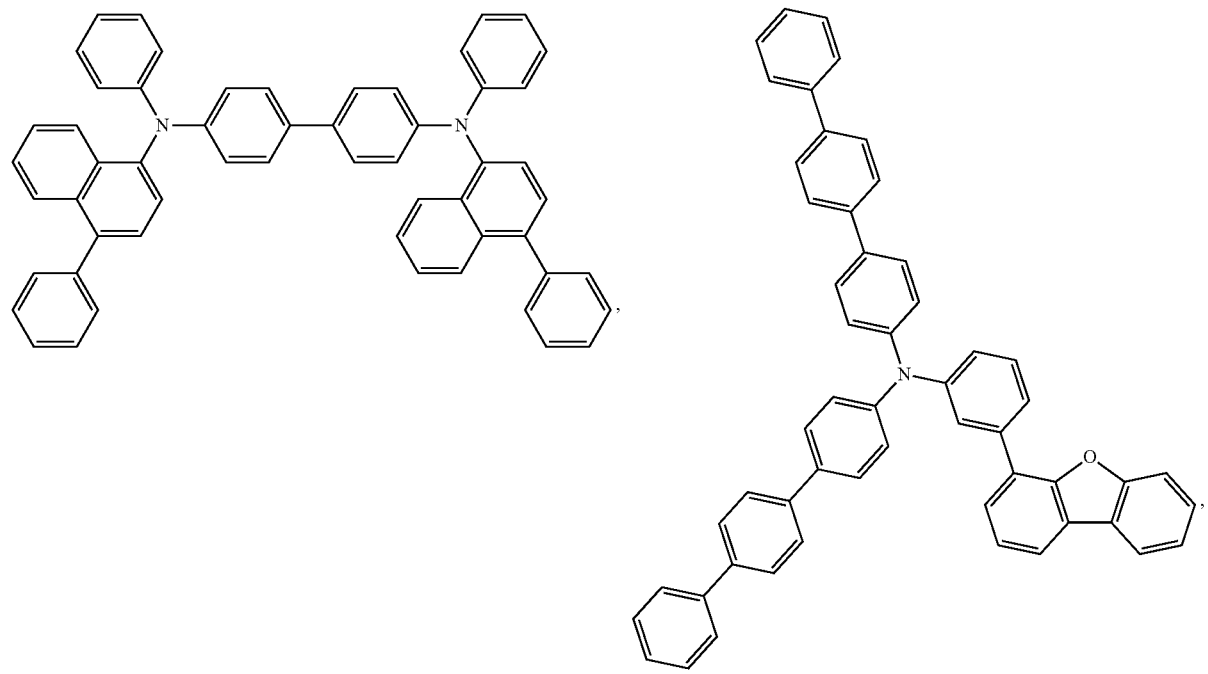

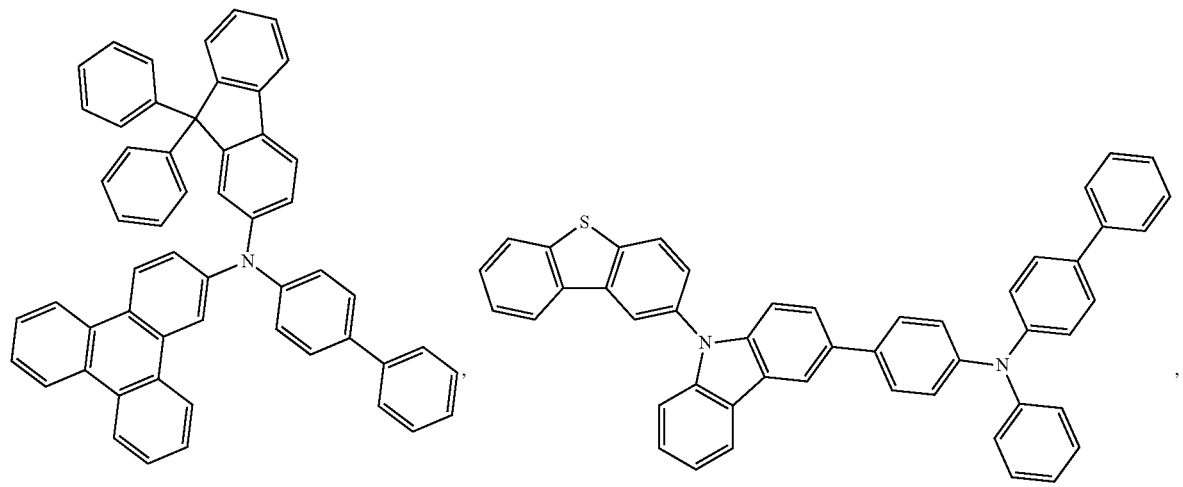
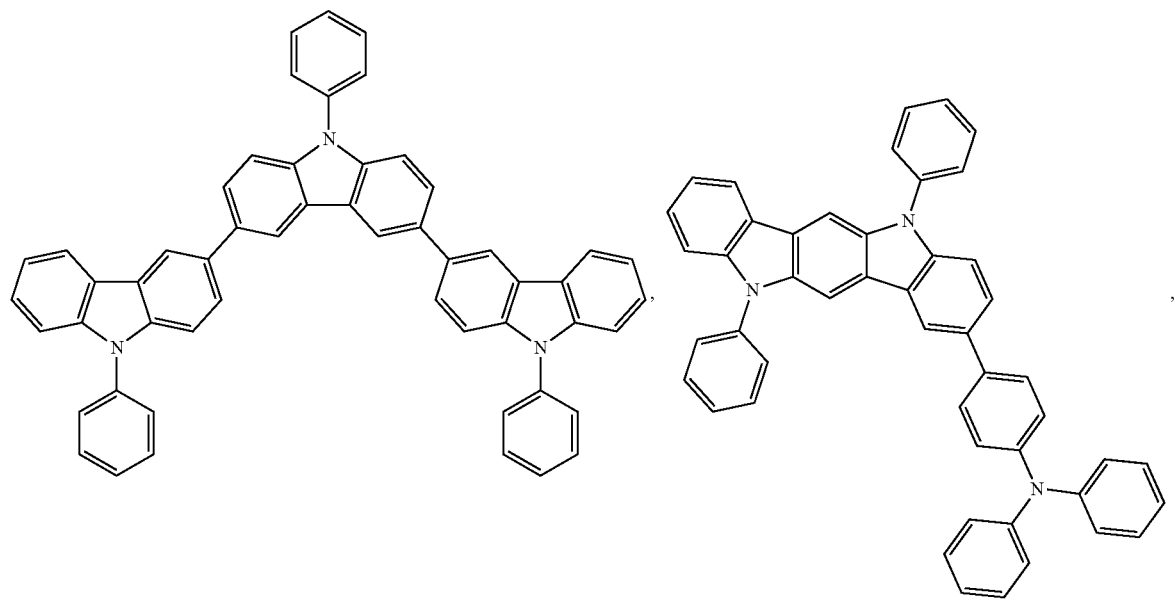
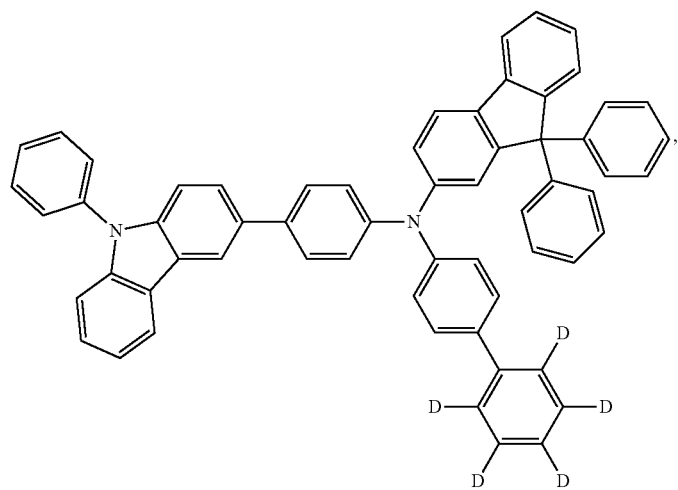

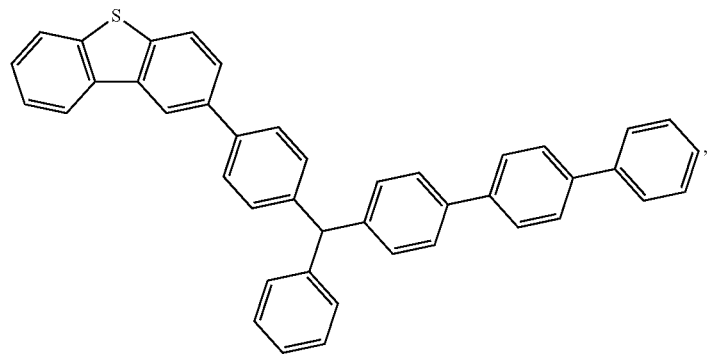
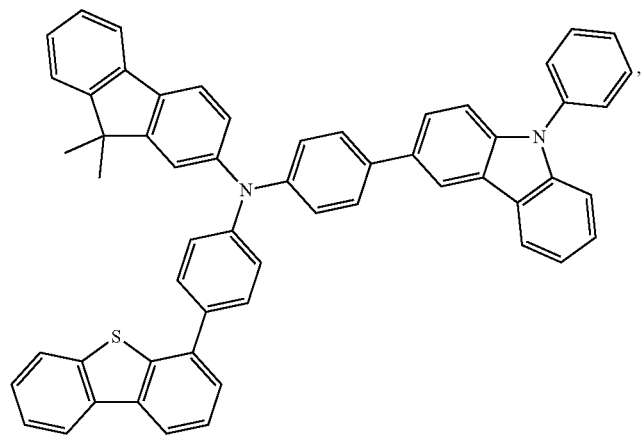
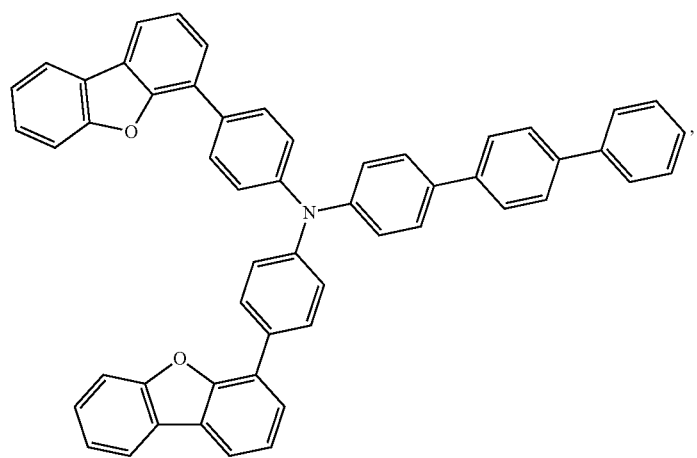

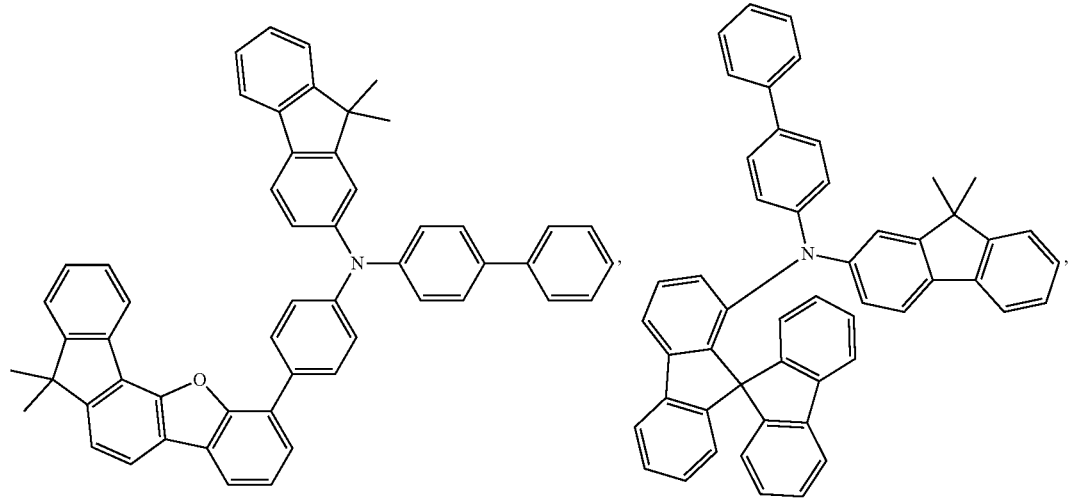
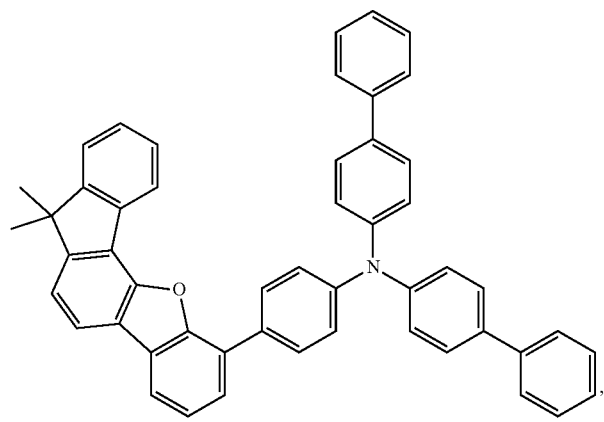
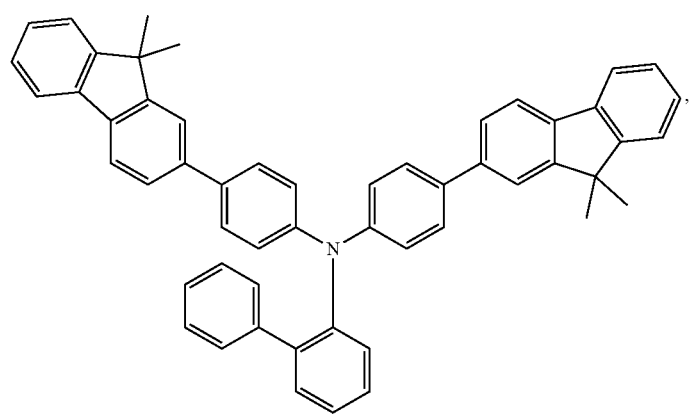

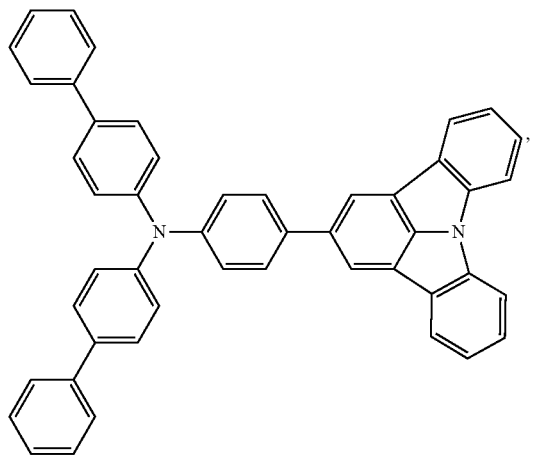
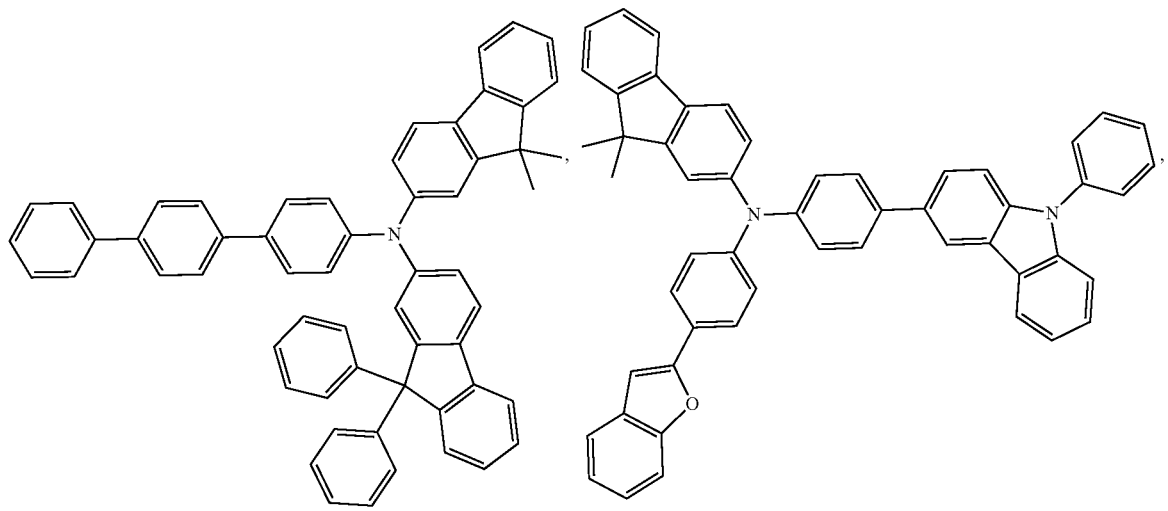
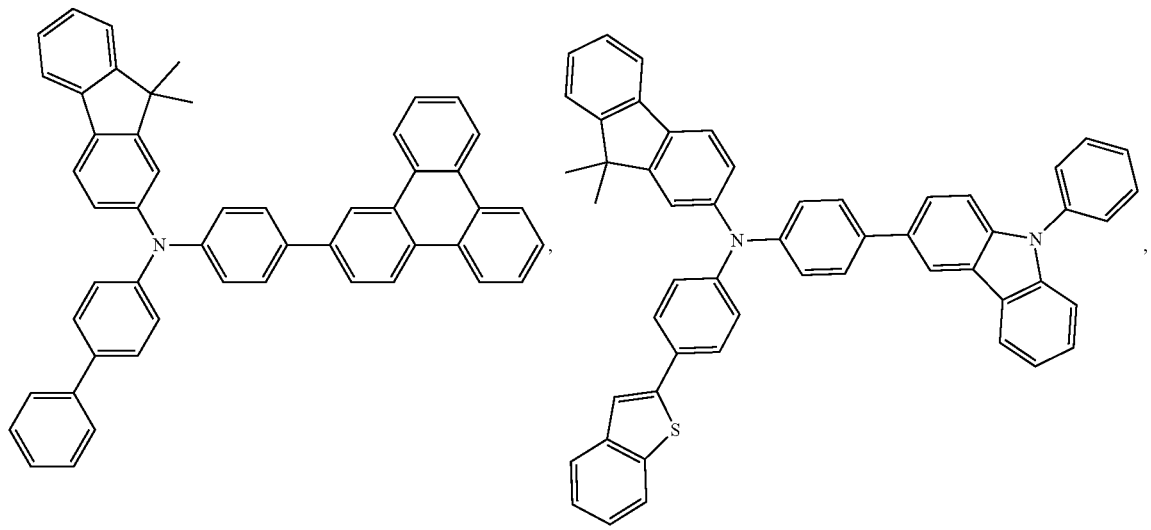

-continued
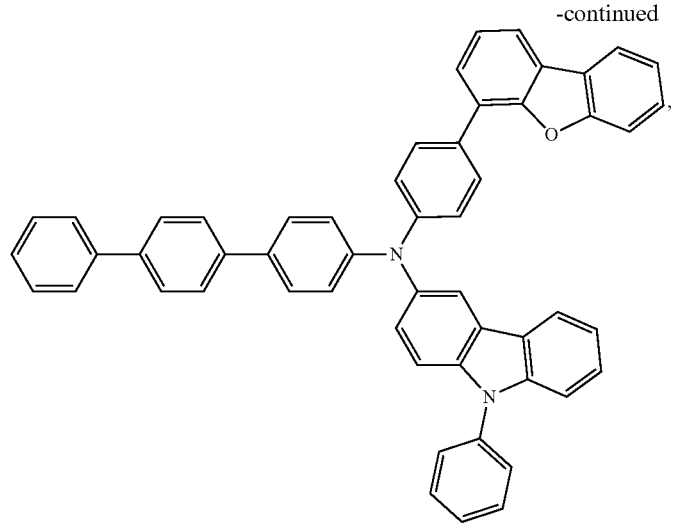
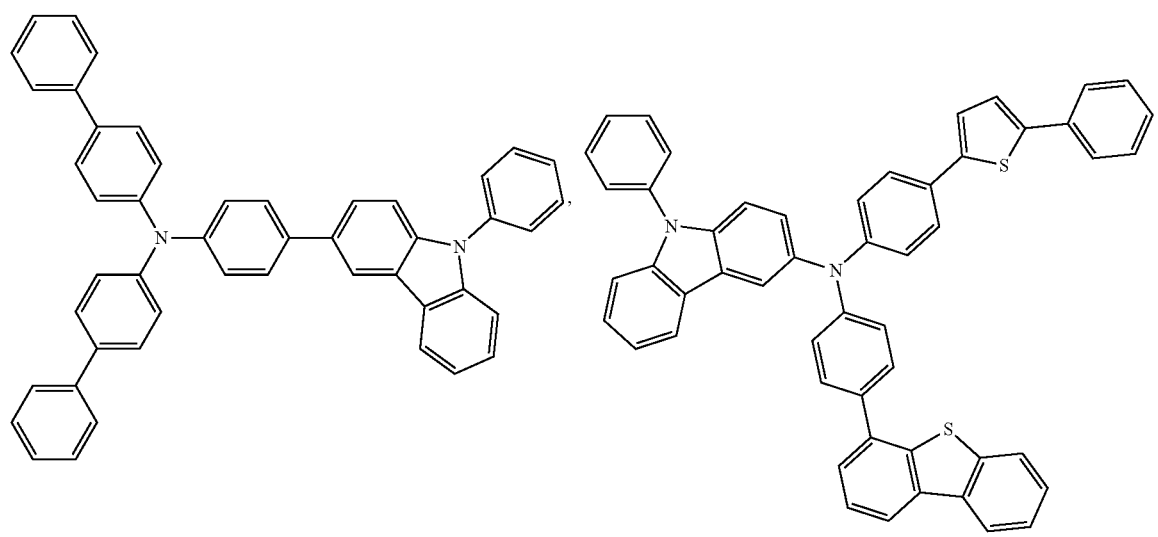
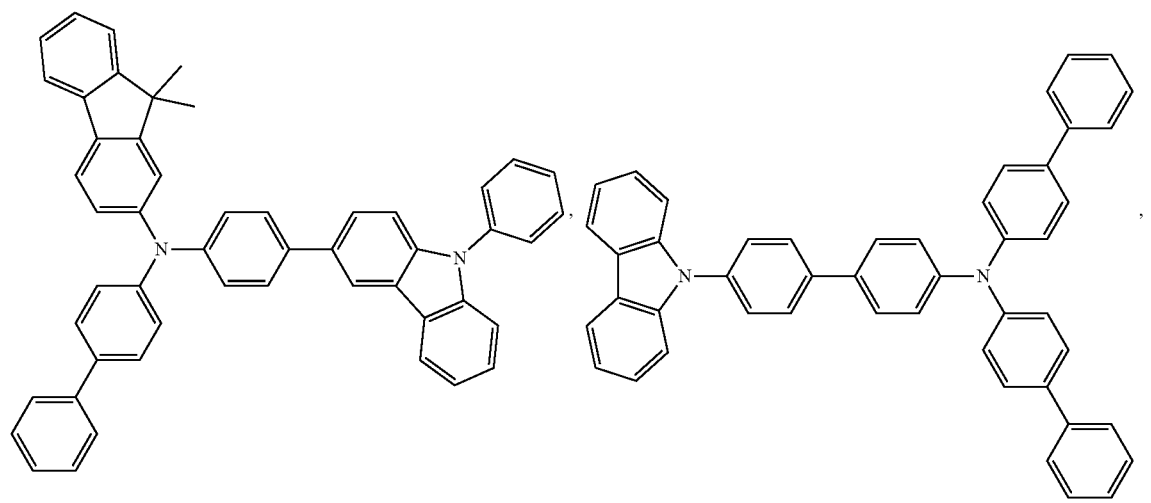

-continued
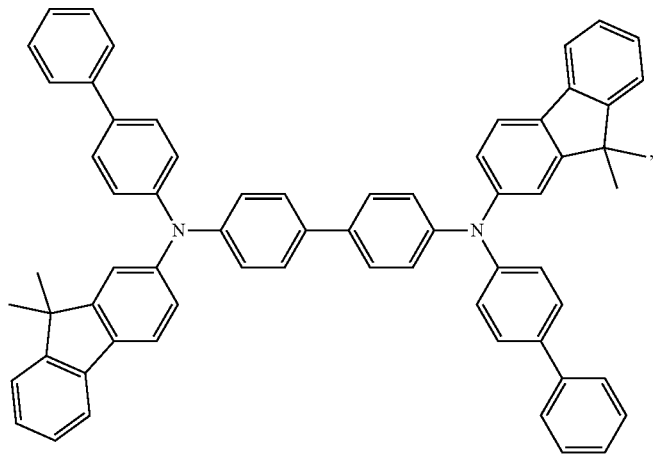
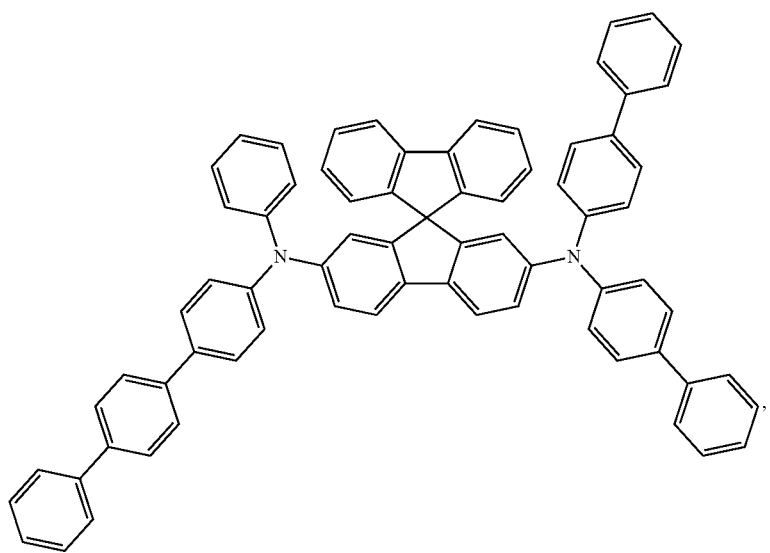
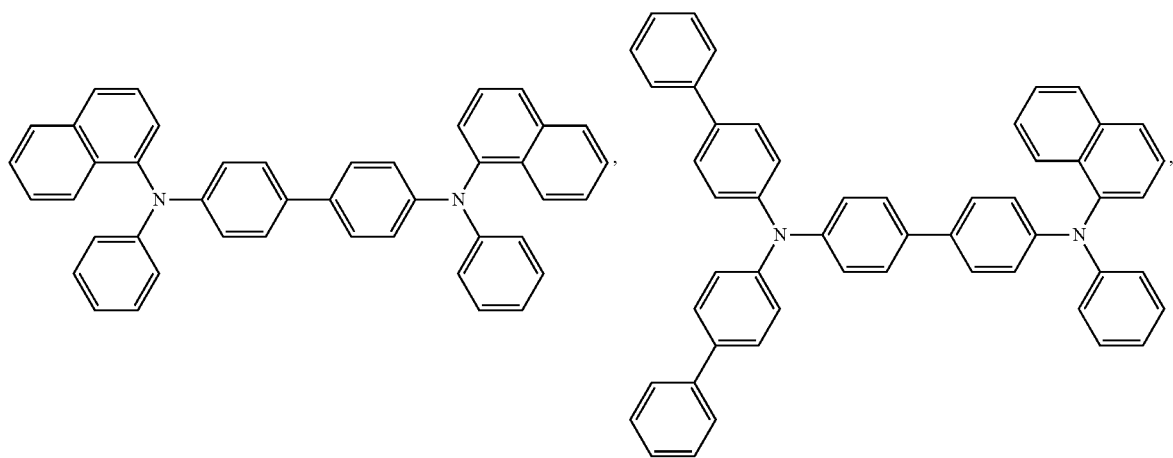

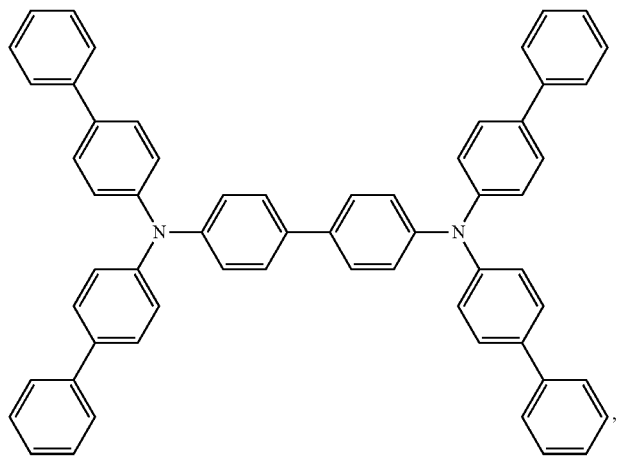
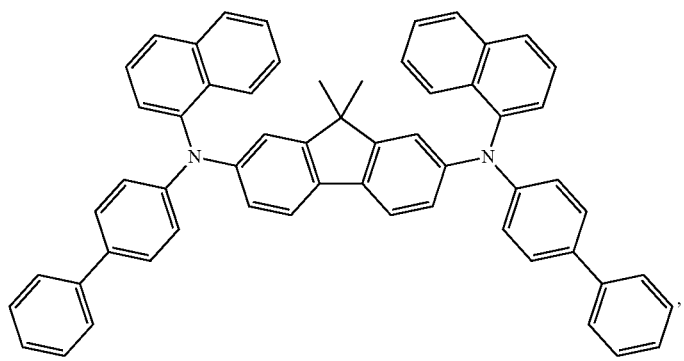
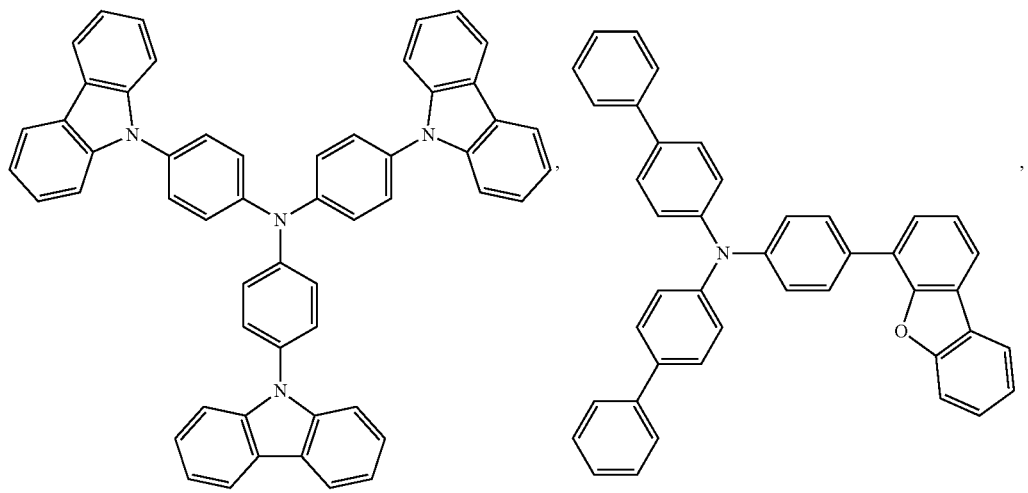

-continued
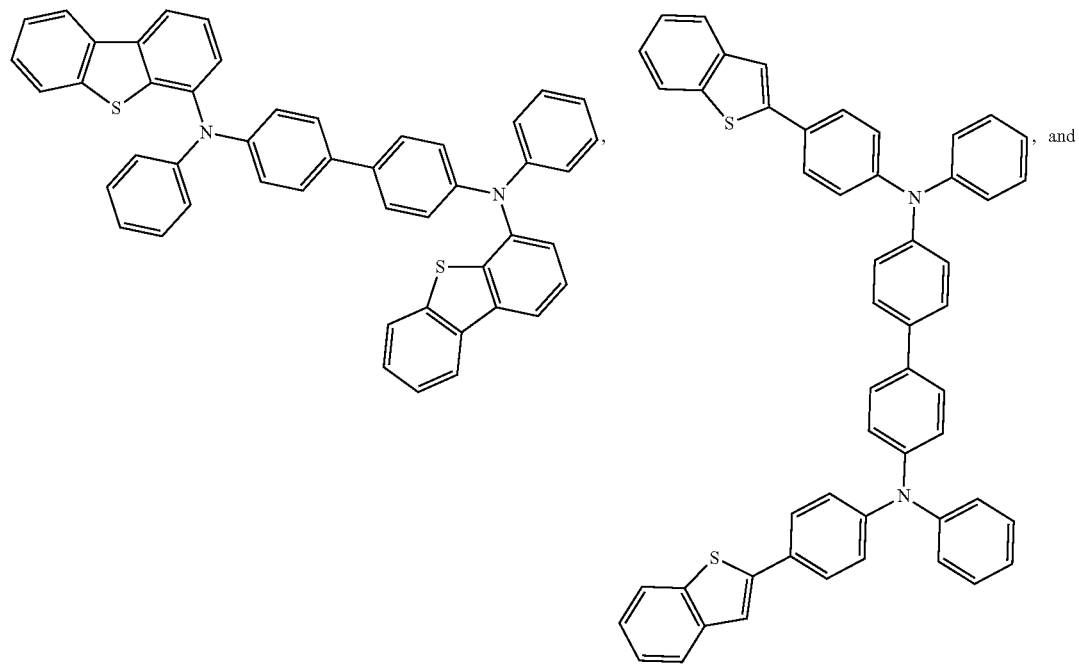
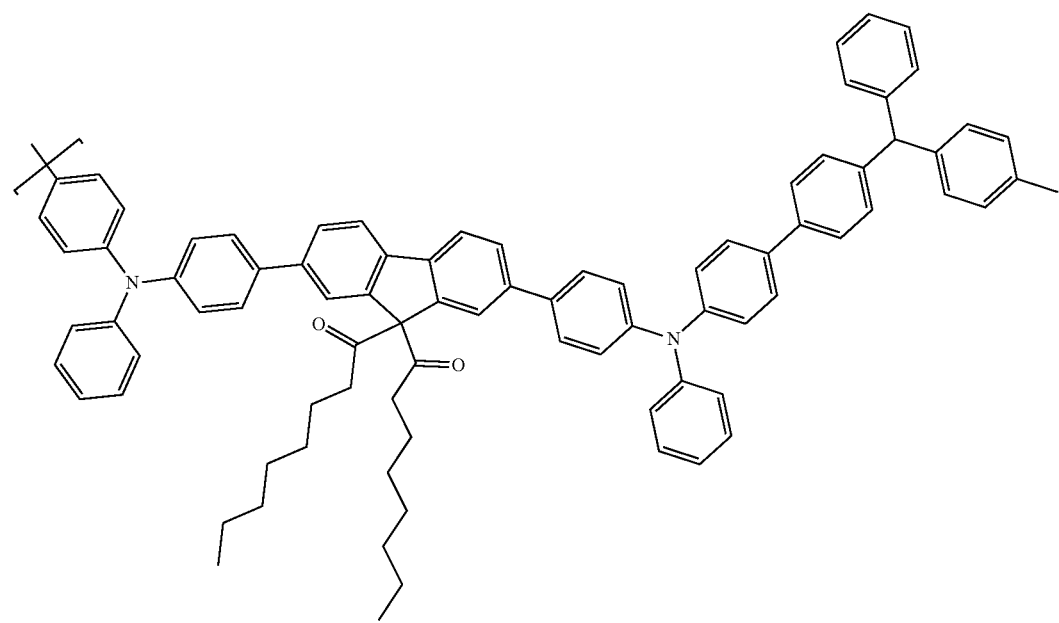

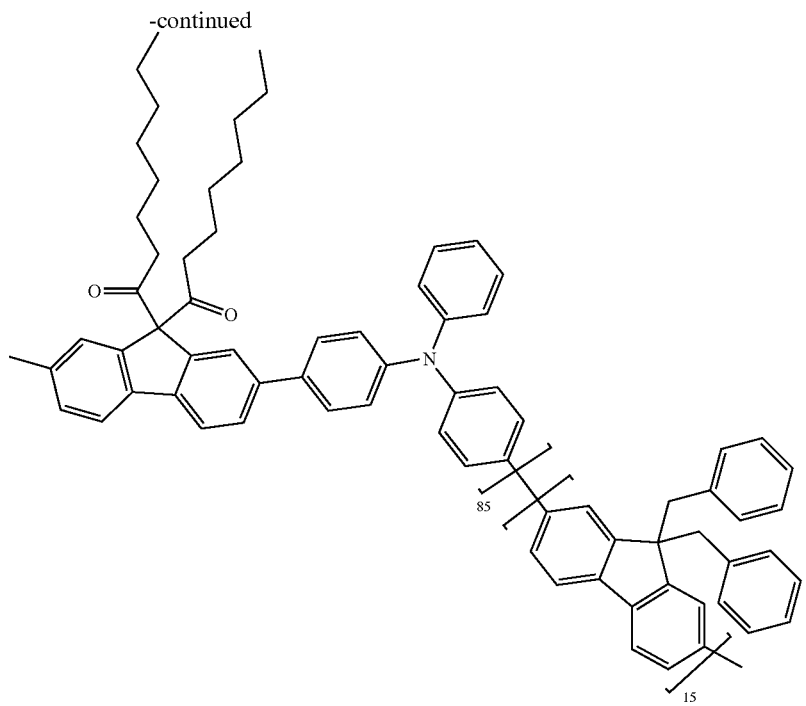

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Additional Hosts:

The light emitting layer of the organic EL device of the present invention preferably contains at least a metal complex as light emitting dopant material, and may contain one or more additional host materials using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

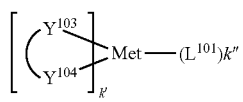

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

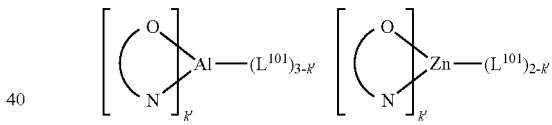

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as additional host are selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

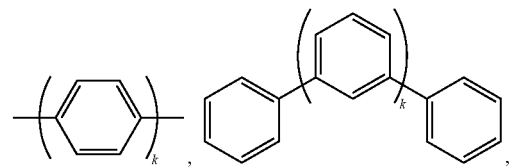

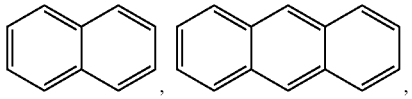

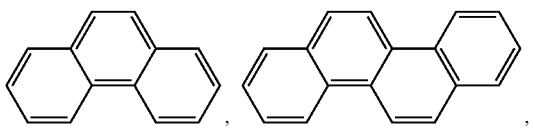

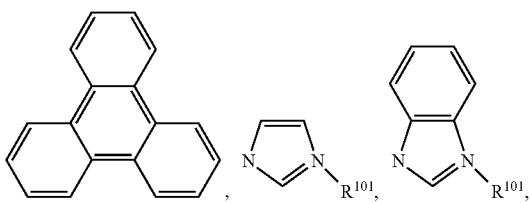

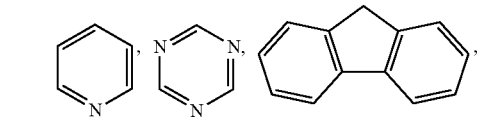

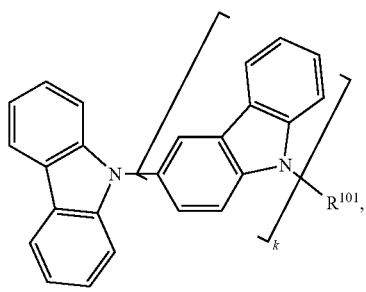

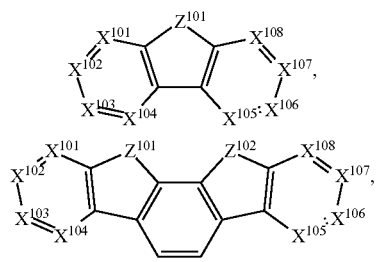

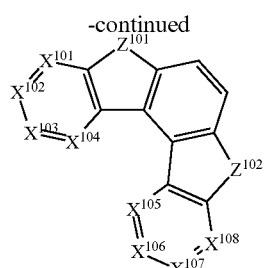

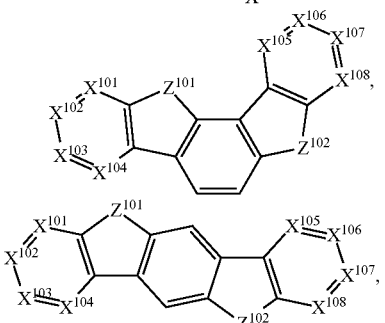

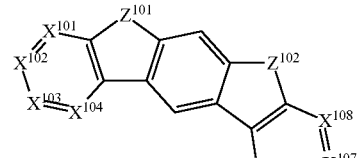

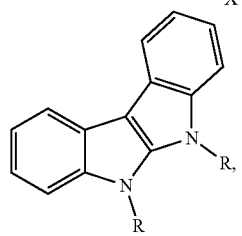

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, or S.

Non-limiting examples of the additional host materials that may be used in an OLED in combination with the host compound disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551,

| 103 | | | 104 | | |
|---|---|---|---|---|---|
| WO2005089025, | WO2006072002, | WO2006114966, | WO2011086863, | WO2012128298, | WO2012133644, |
| WO2007063754, | WO2008056746, | WO2009003898, | WO2012133649, | WO2013024872, | WO2013035275, |
| WO2009021126, | WO2009063833, | WO2009066778, | WO2013081315, | WO2013191404, | WO2014142472, |
| WO2009066779, | WO2009086028, | WO2010056066, | US20170263869, | US20160163995, | U.S. Pat. No. 9,466, |
| WO2010107244, | WO2011081423, | WO2011081431, | 803. | | |
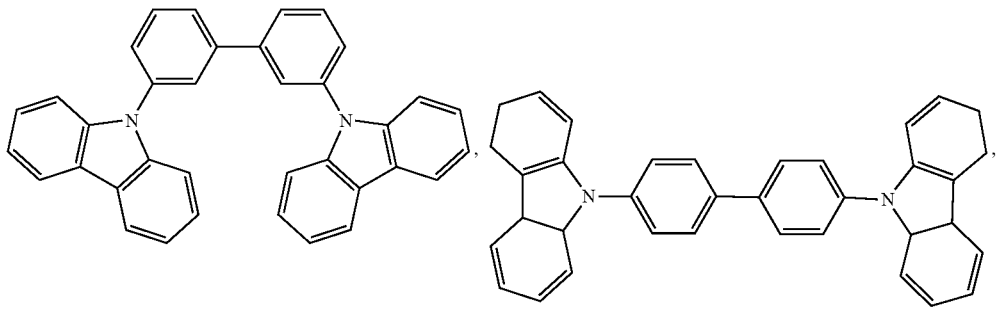
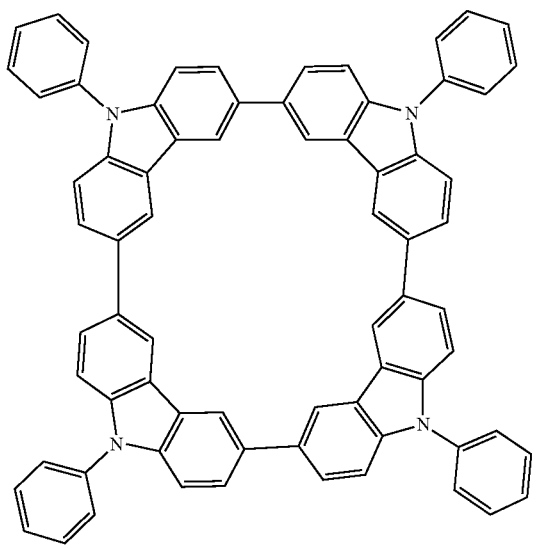
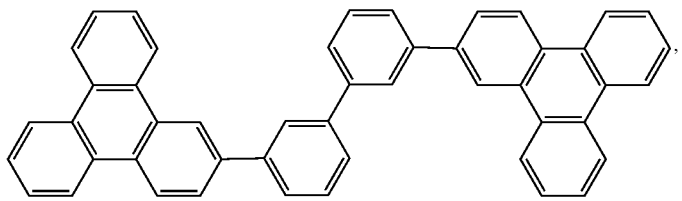
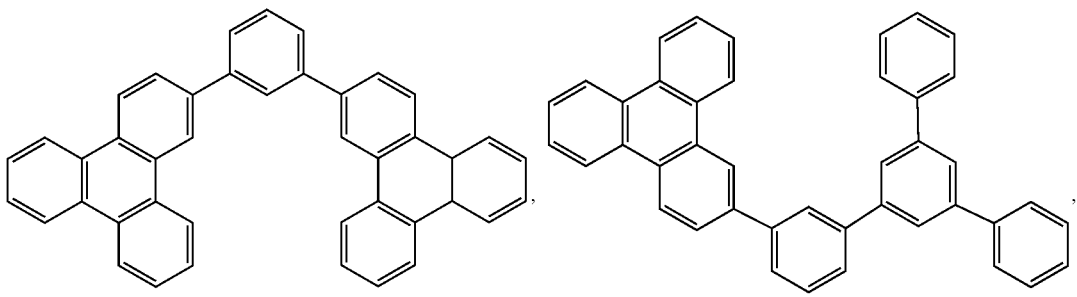

105
106
-continued
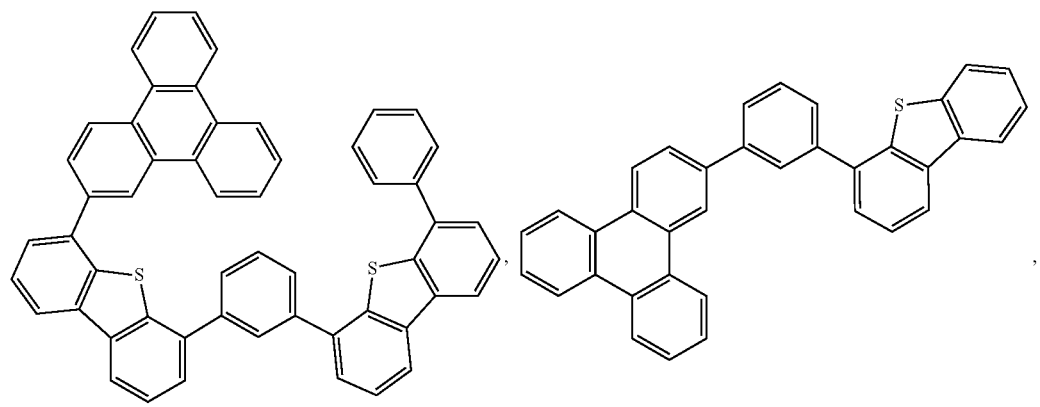
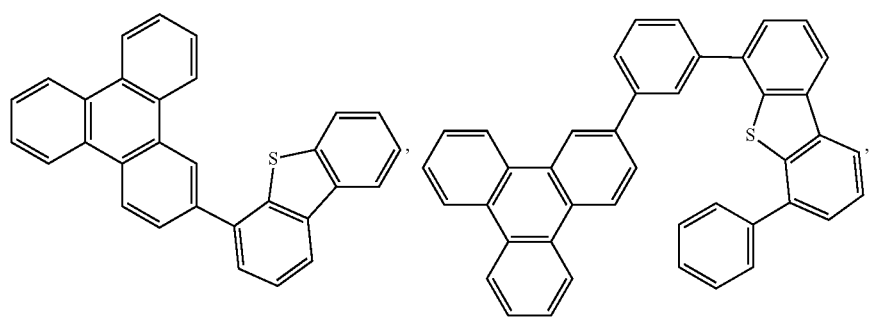
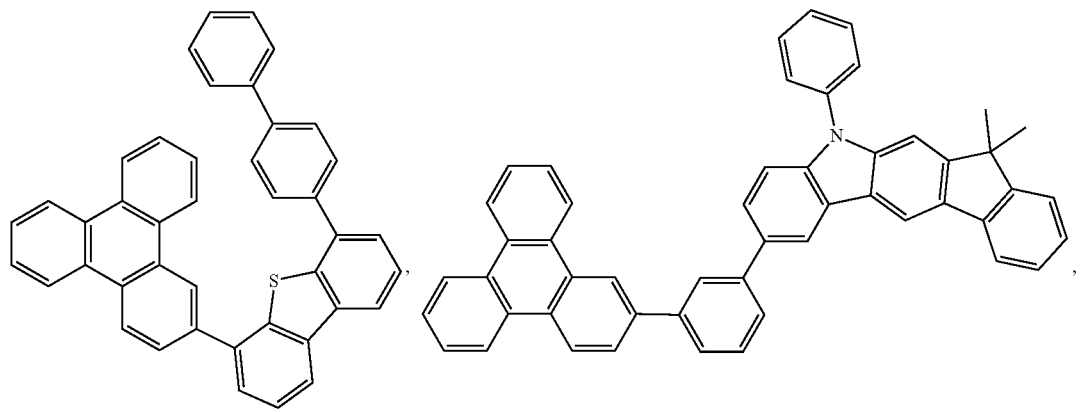
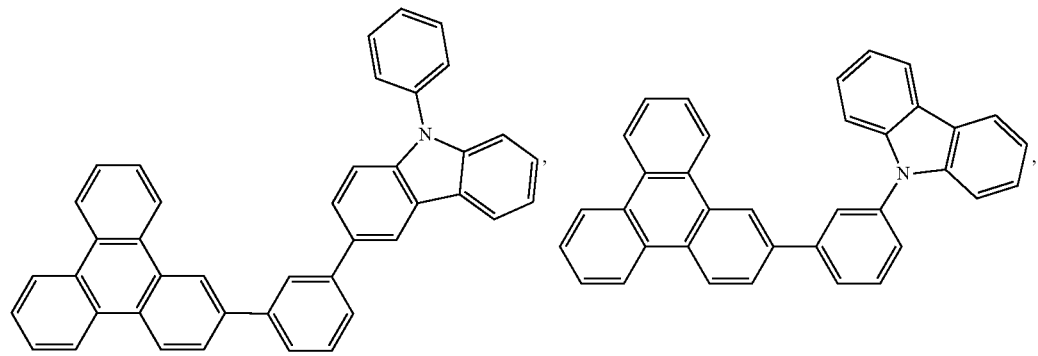

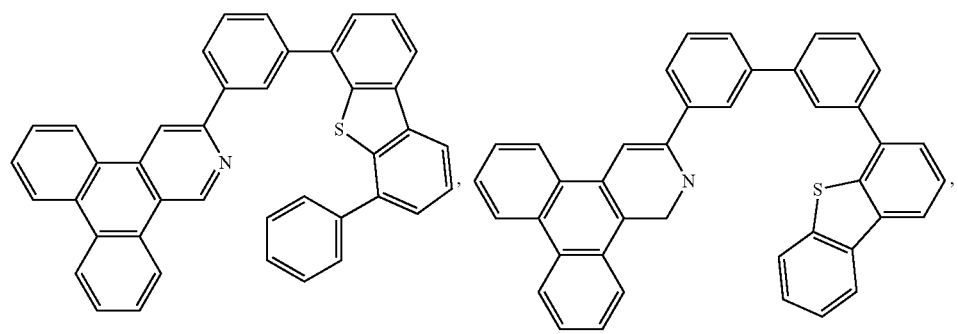
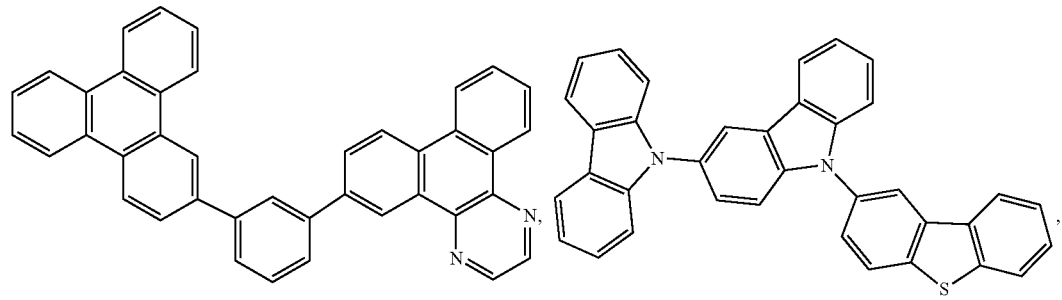
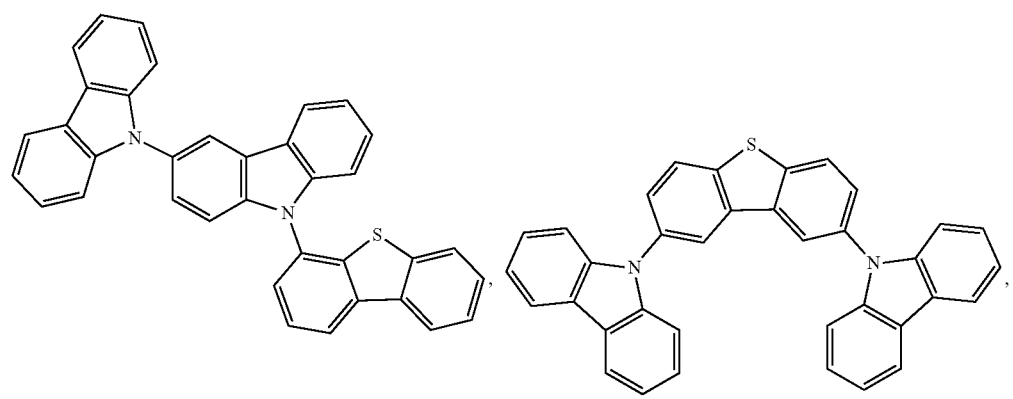
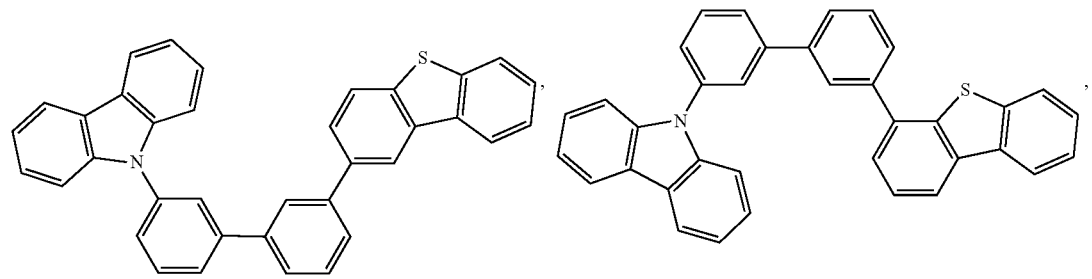
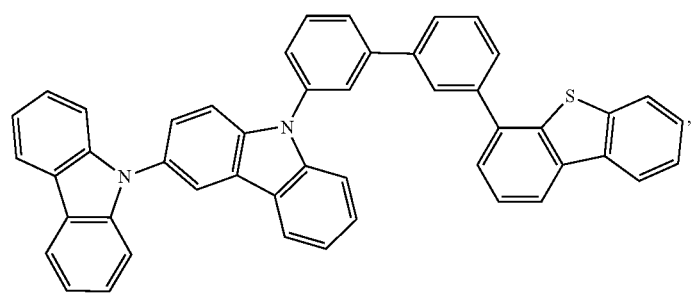

-continued
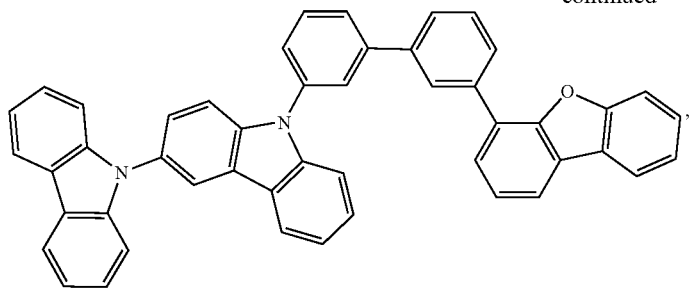
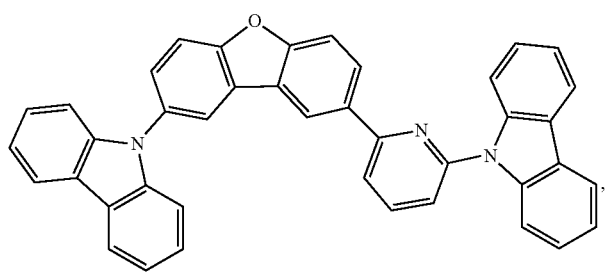
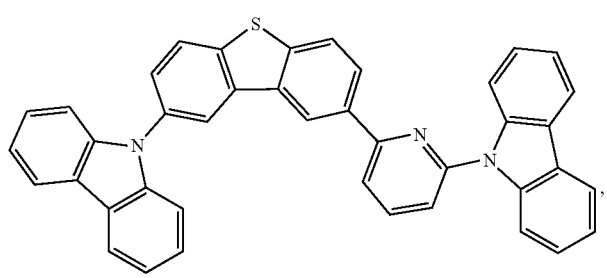
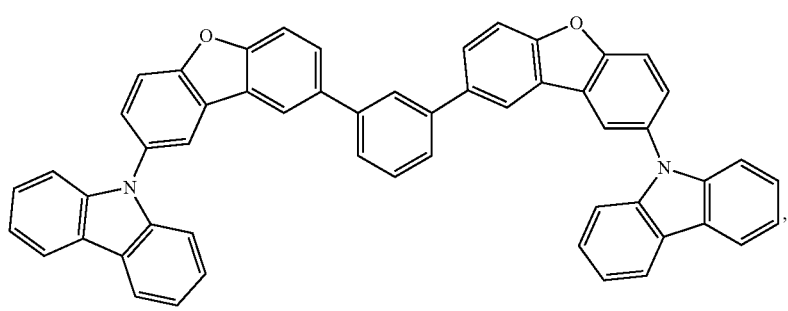
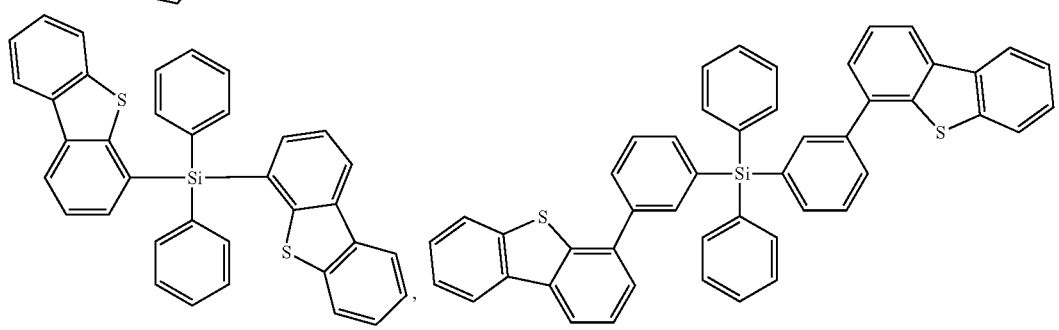

-continued
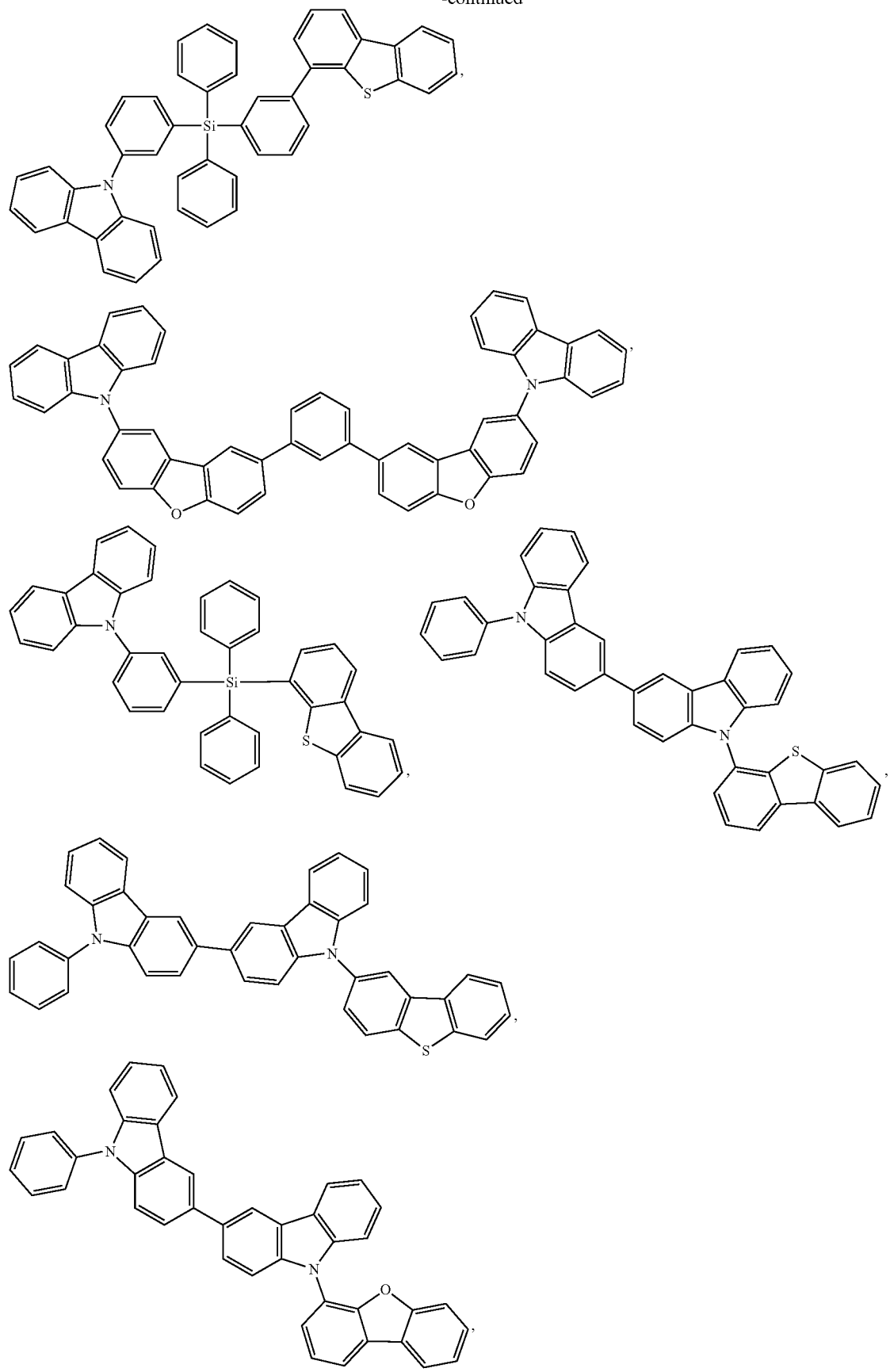

-continued
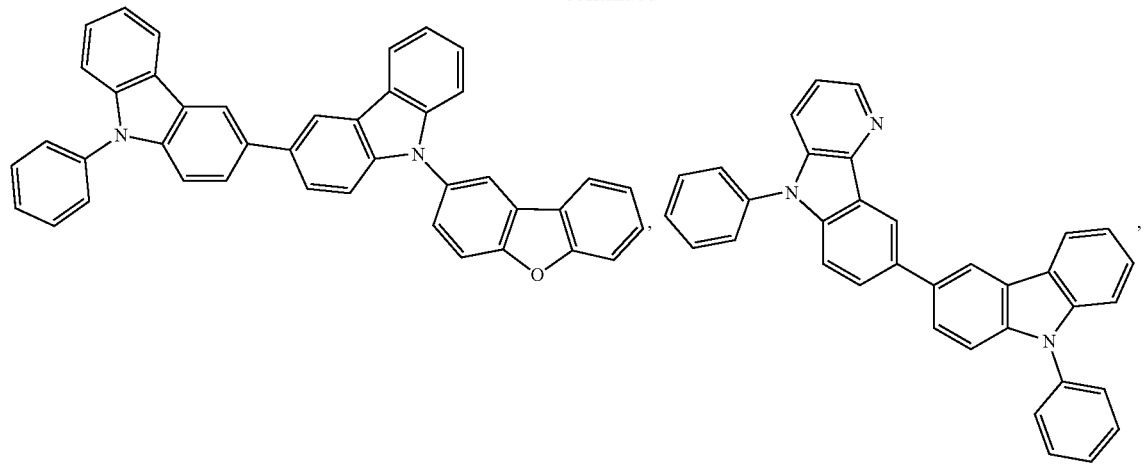
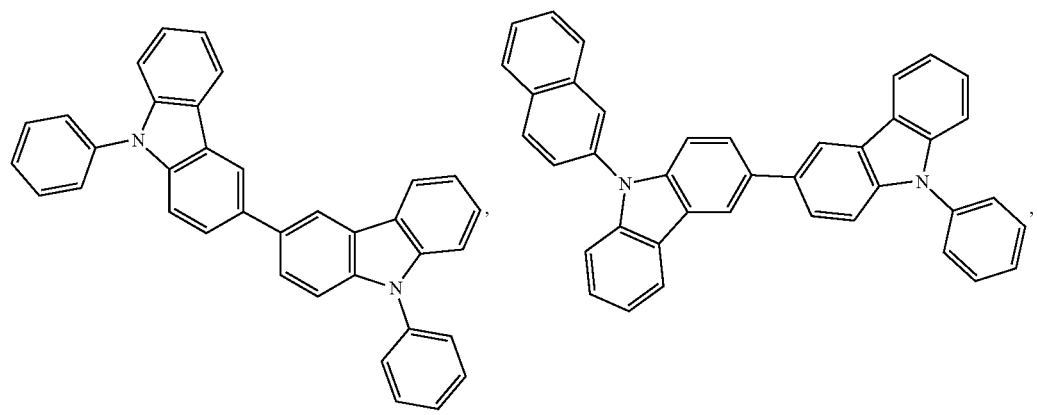
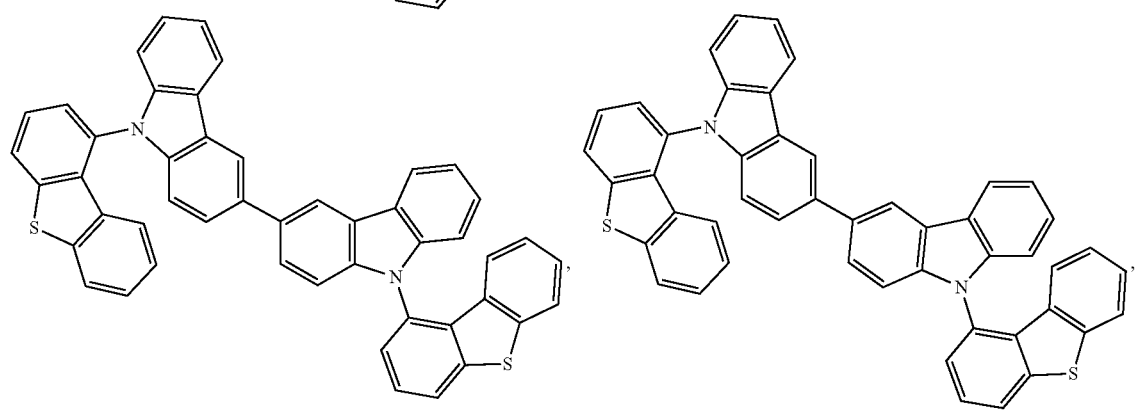
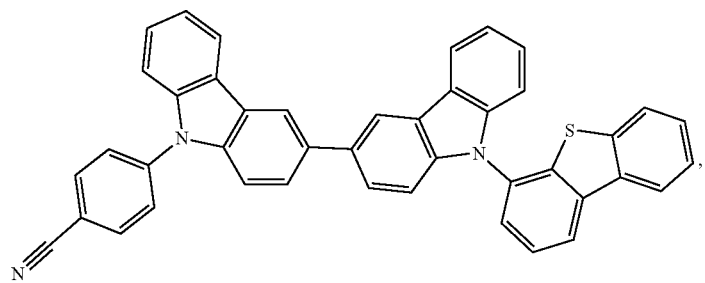

-continued
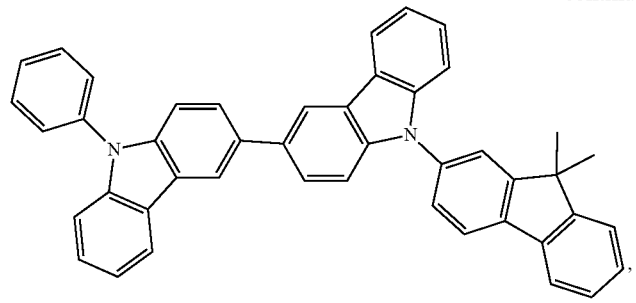
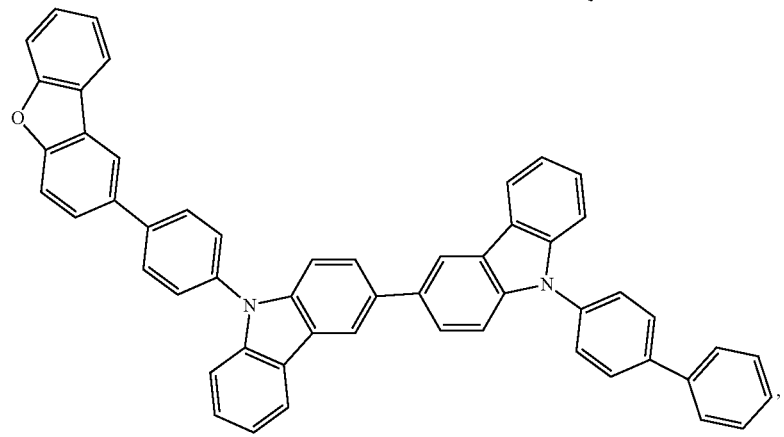
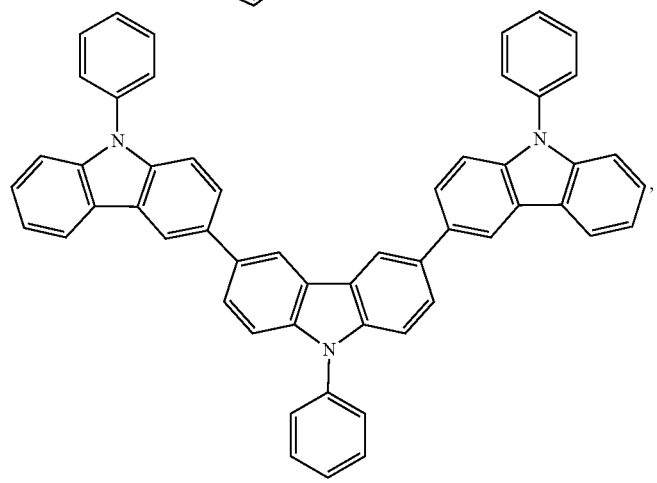
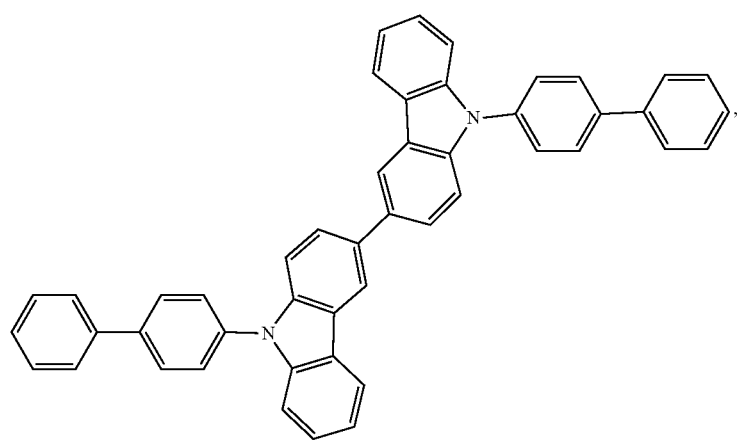

-continued
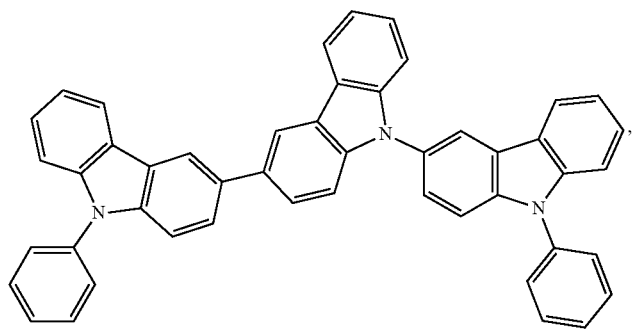
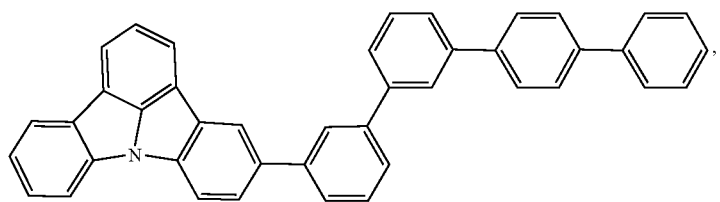
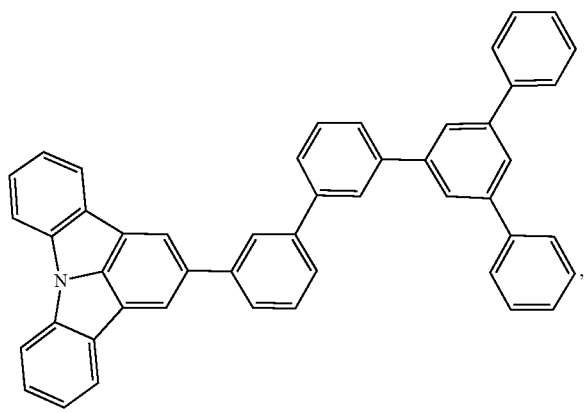
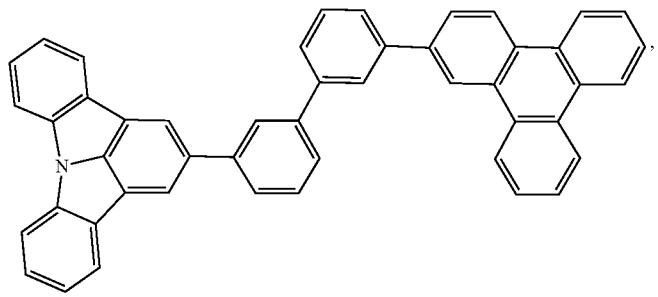
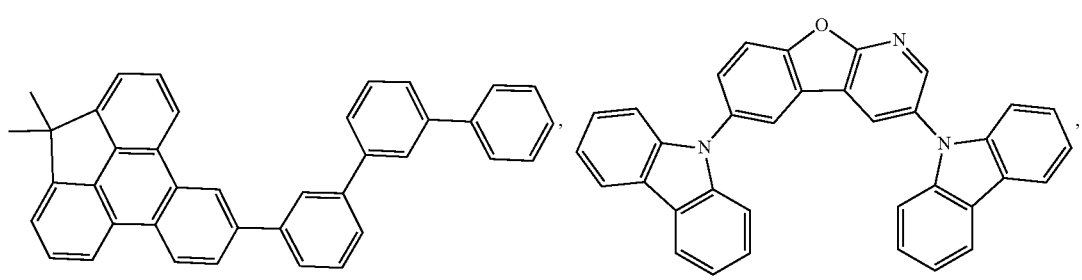

-continued
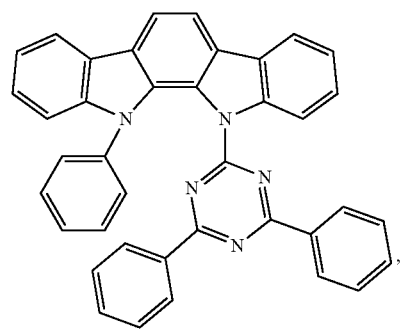
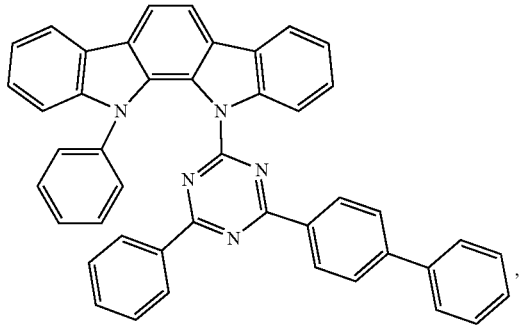
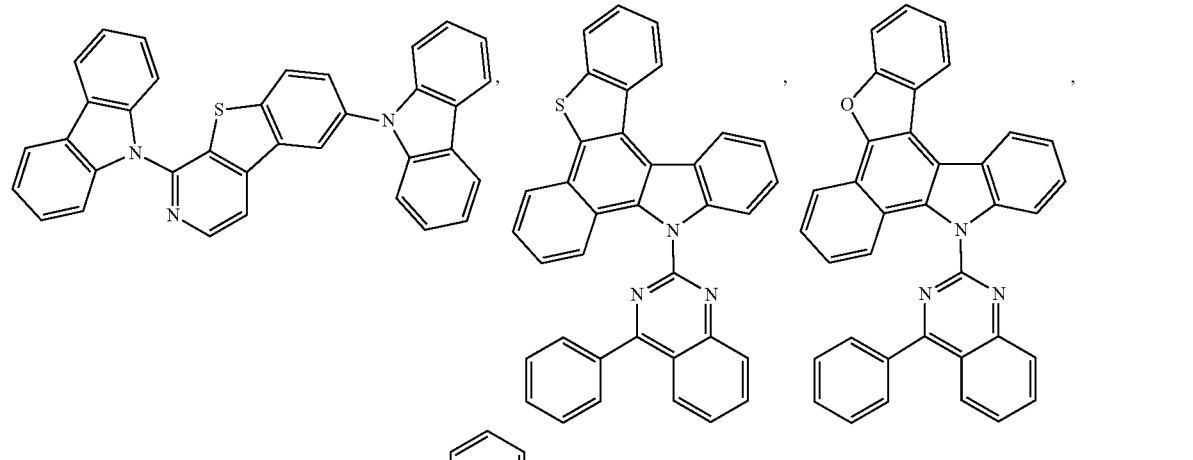
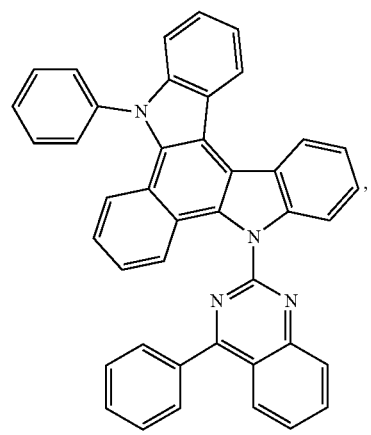
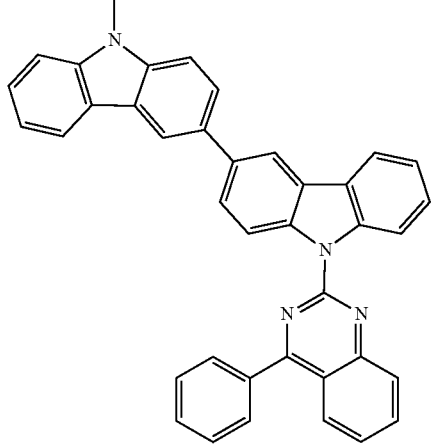
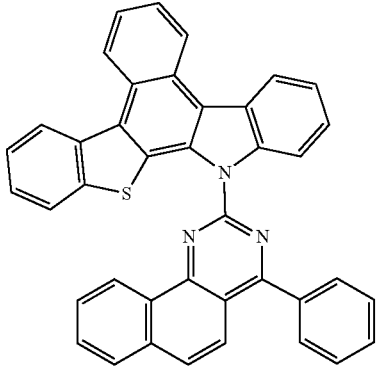
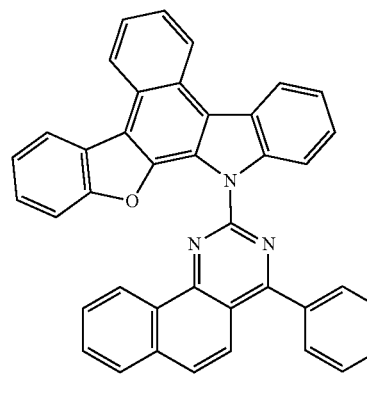
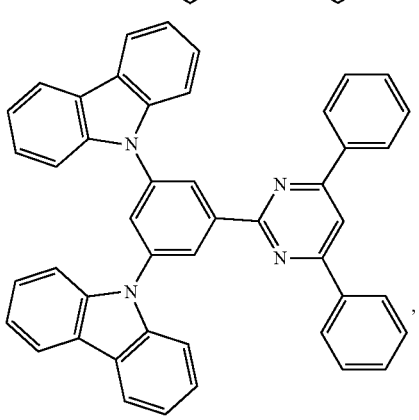

-continued
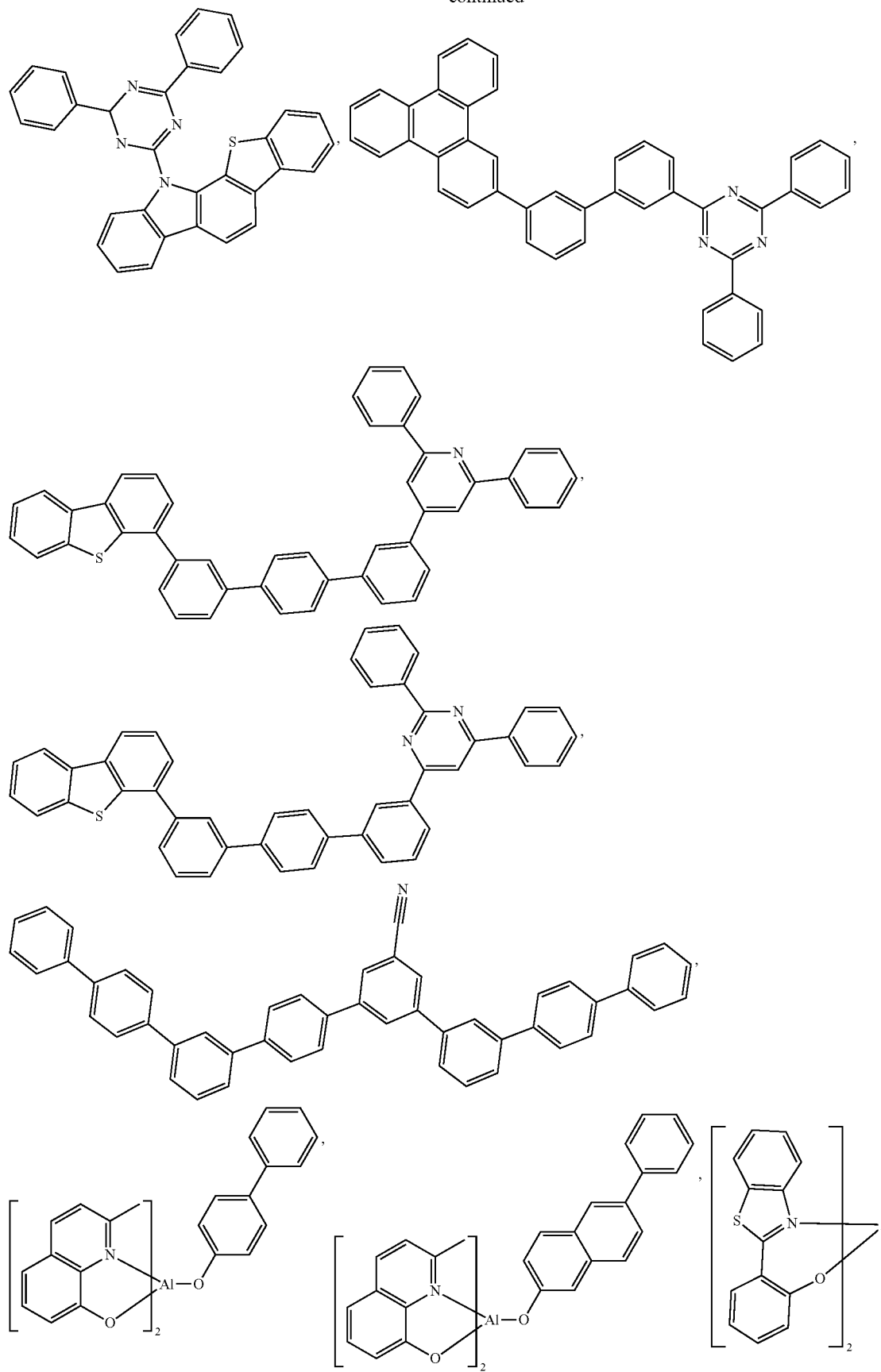

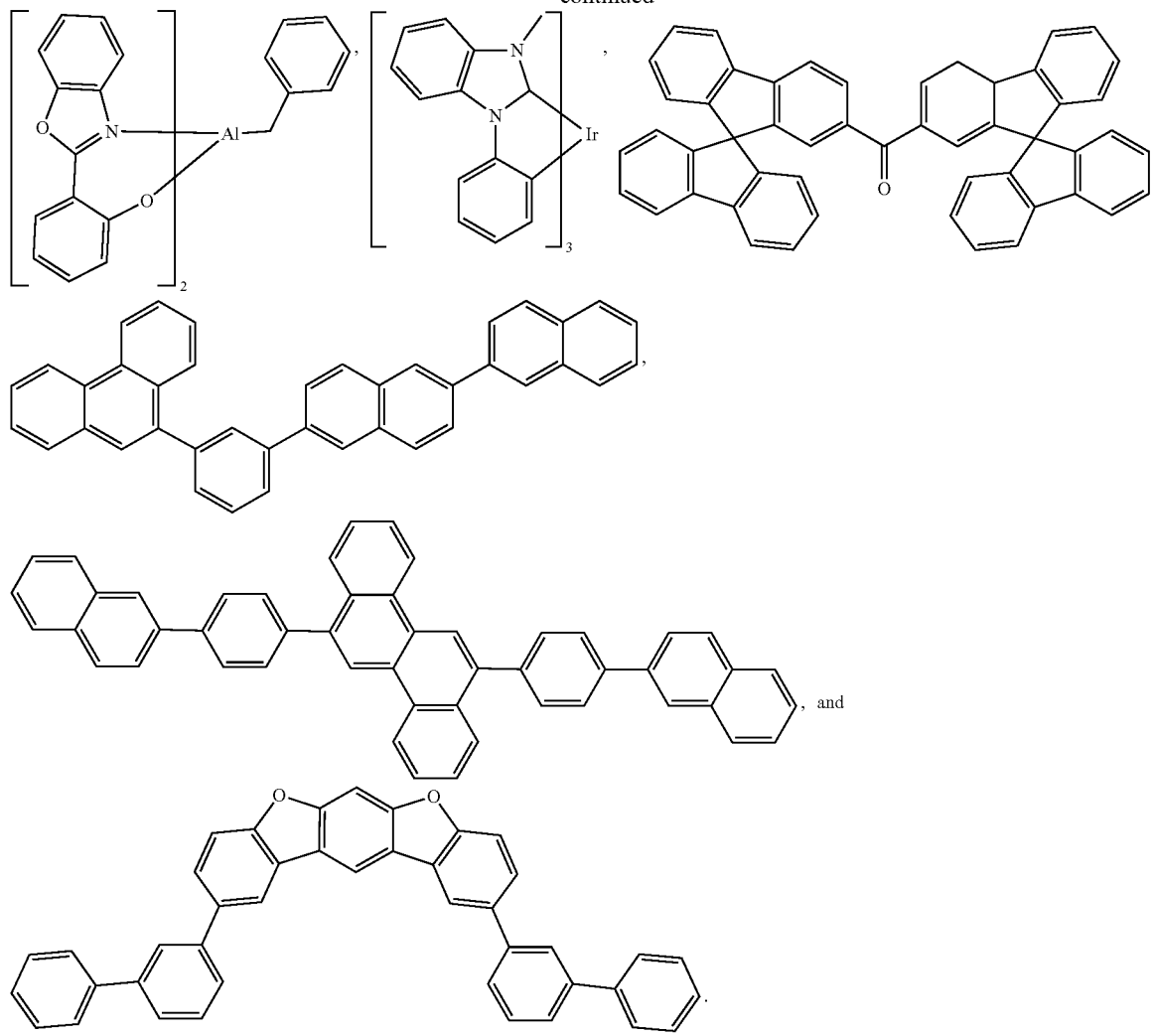

Emitter:

An emitter example is not particularly limited, and any compound may be used as long as the compound is typically used as an emitter material. Examples of suitable emitter materials include, but are not limited to, compounds which can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981,

| 125 | 126 |
|---|---|
| WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450, | -continued |
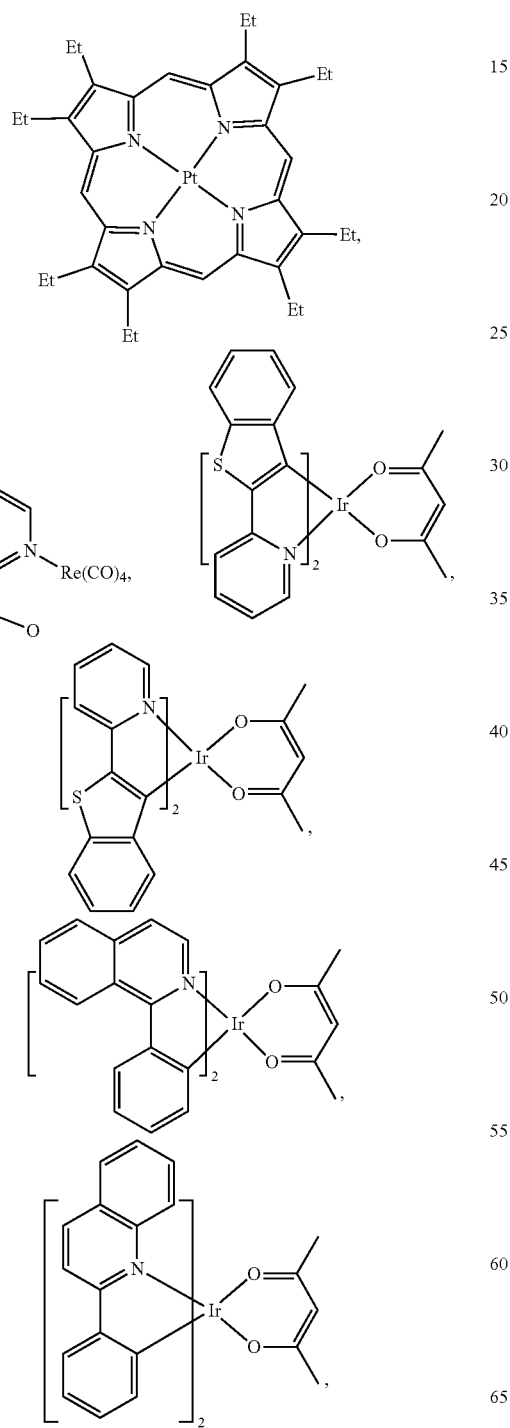
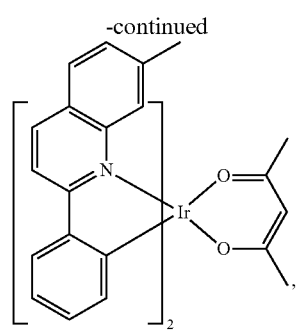
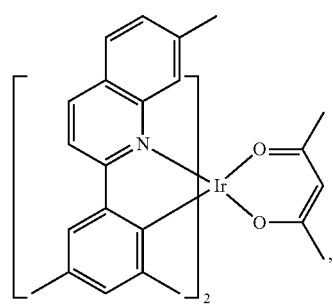
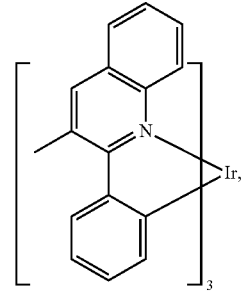
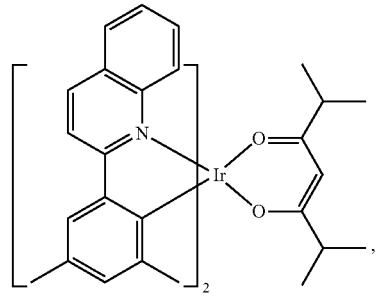
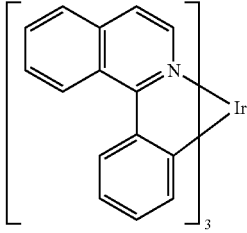

127
-continued
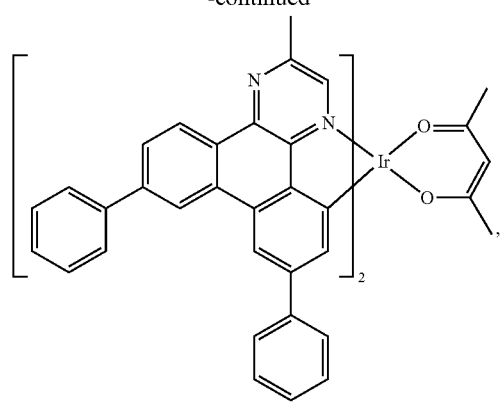
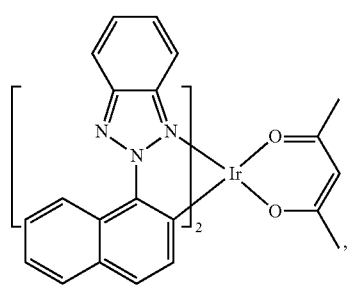
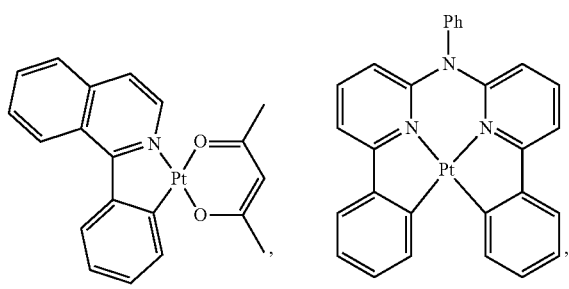
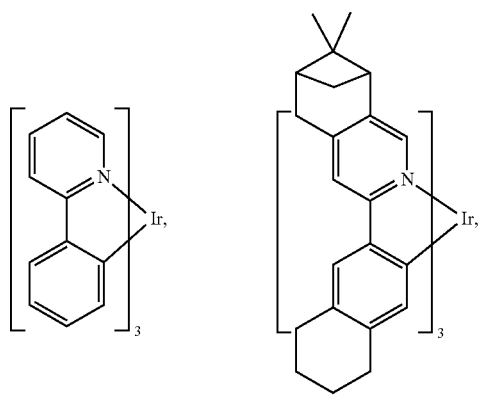
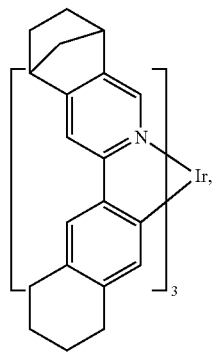
128
-continued
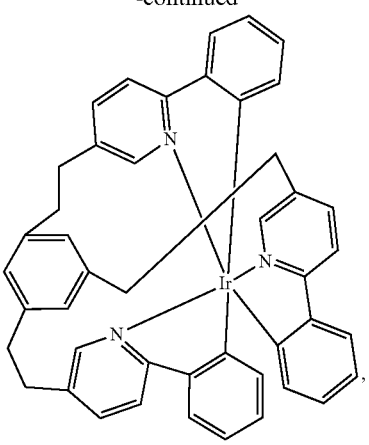
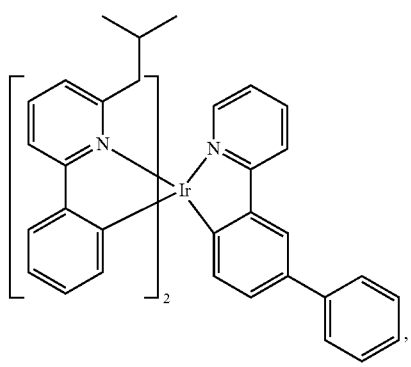
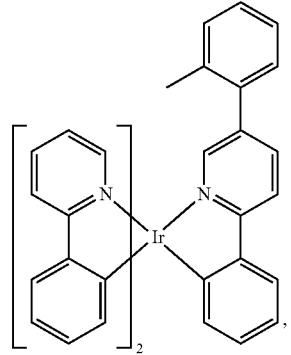
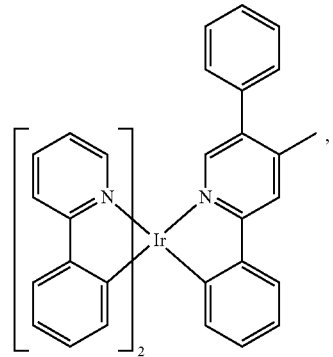

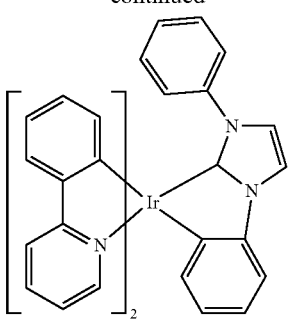
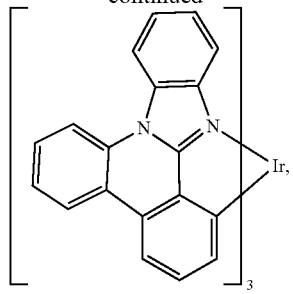
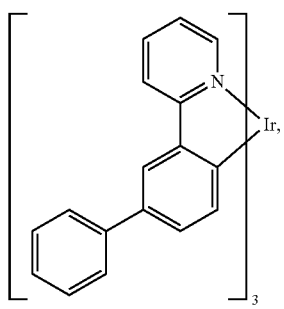
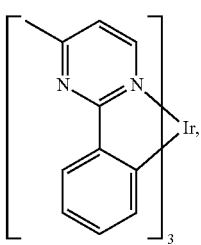
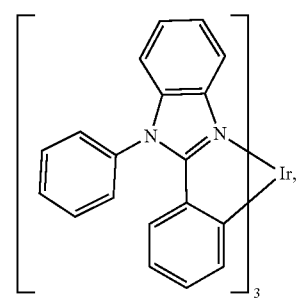
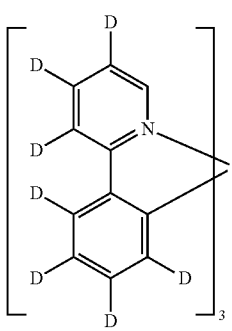
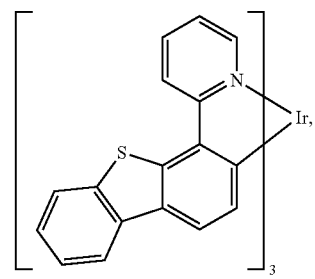
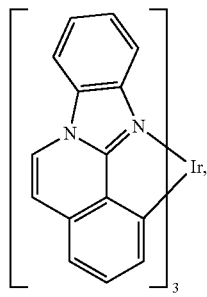
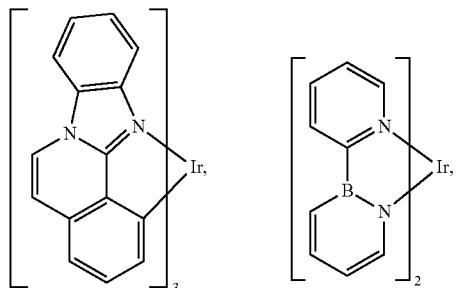
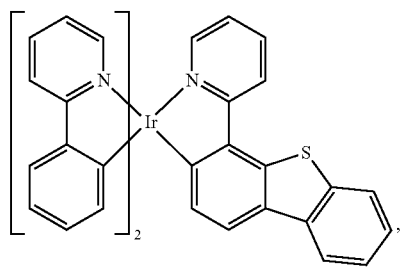
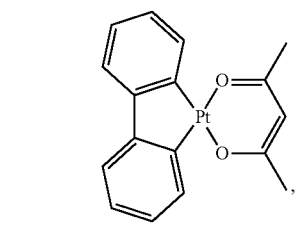
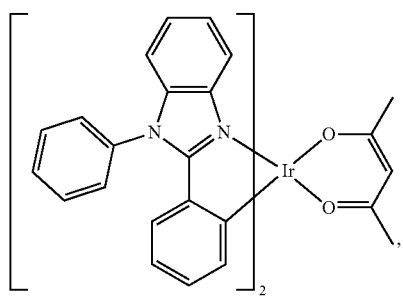
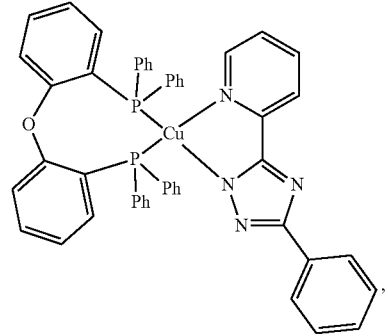

131
-continued
132
-continued
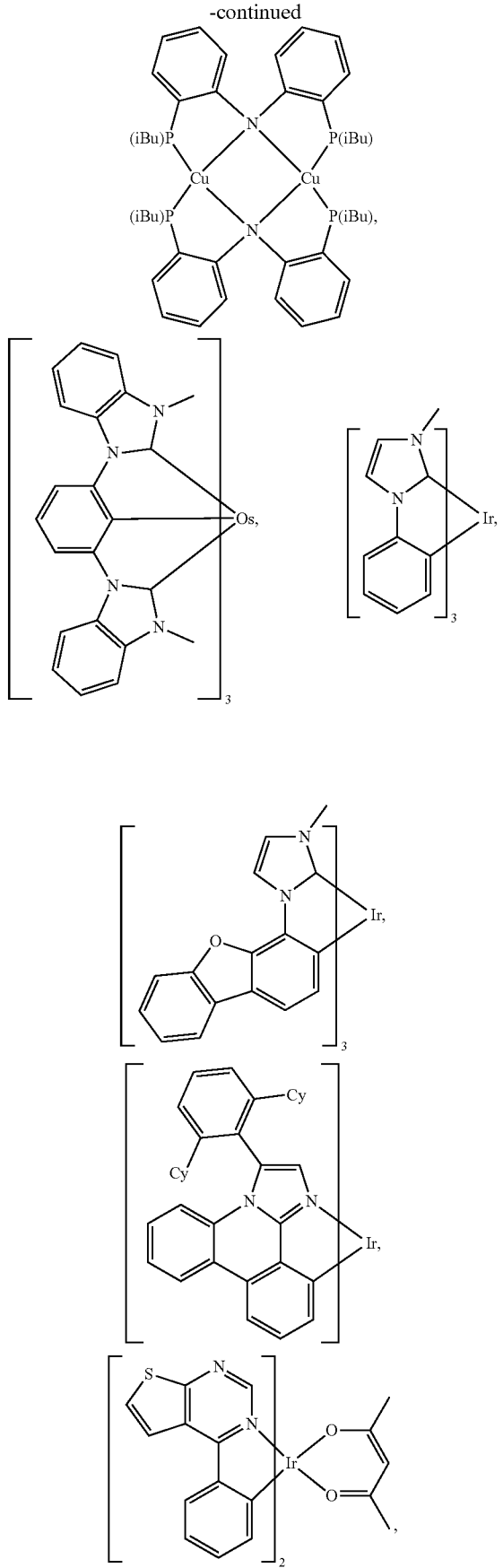
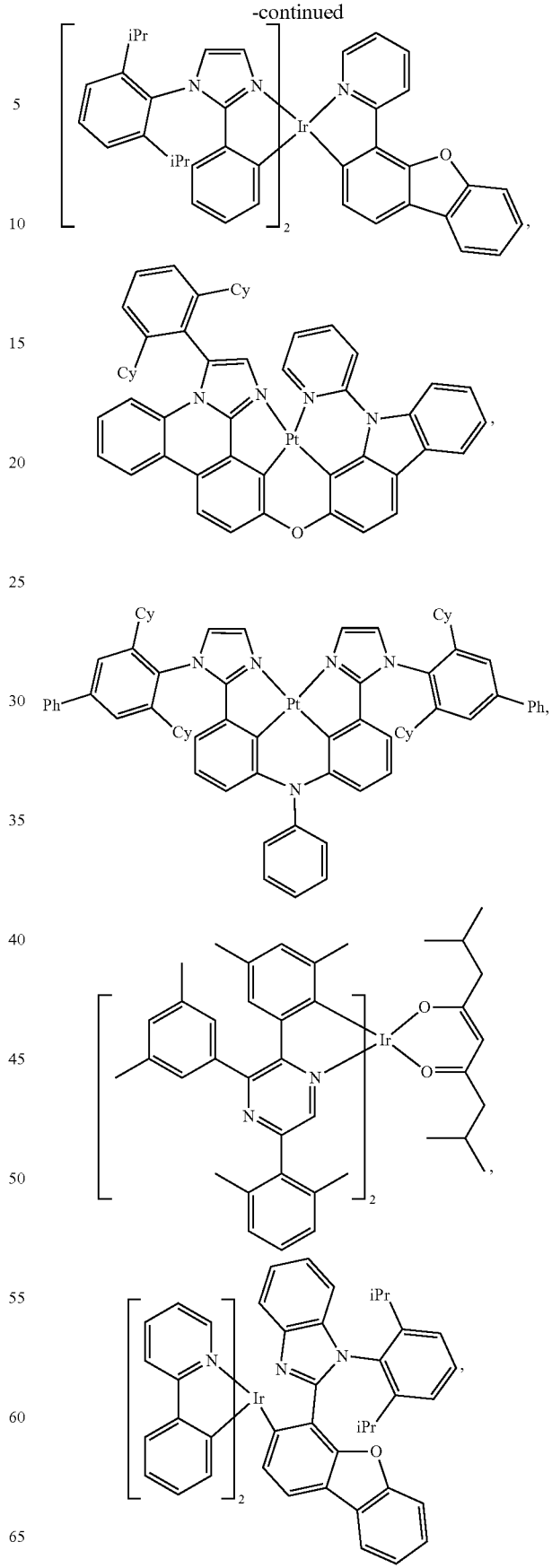

-continued
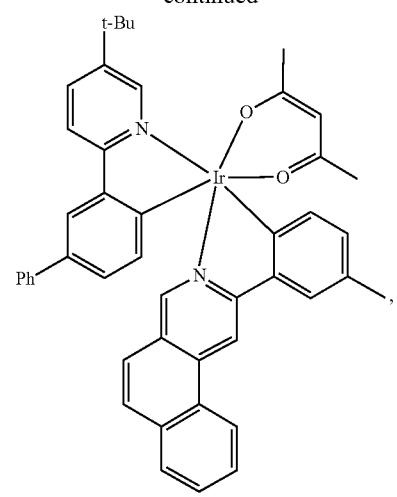
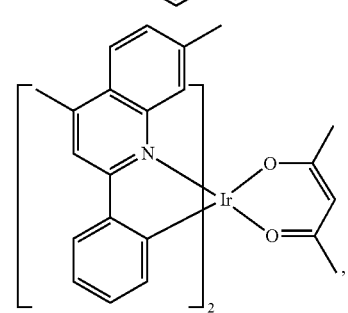
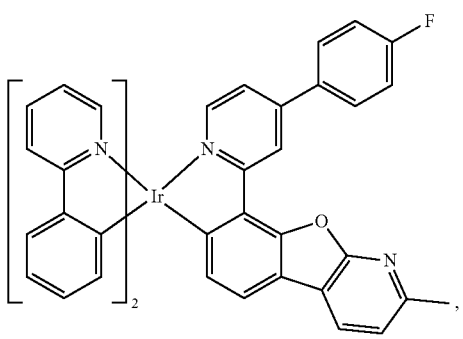
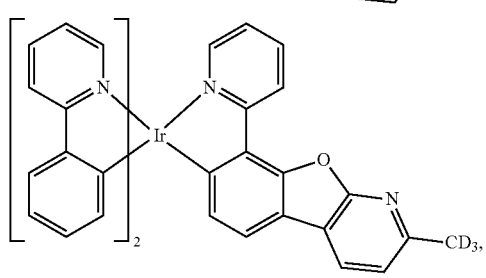
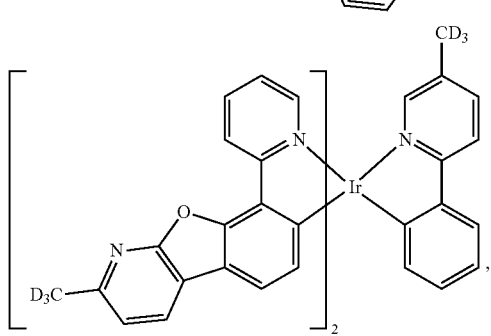
-continued
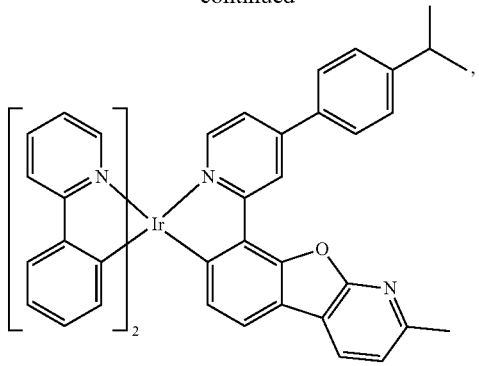
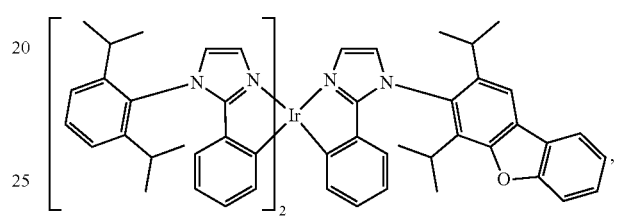
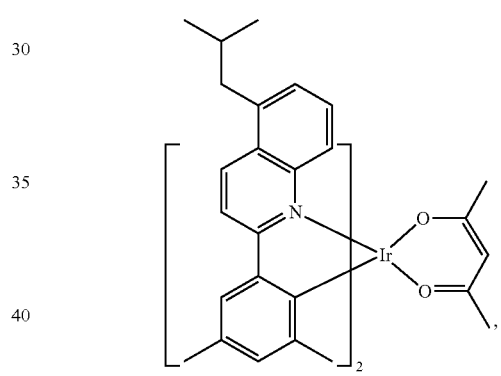
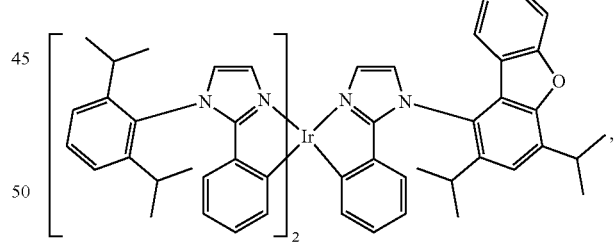
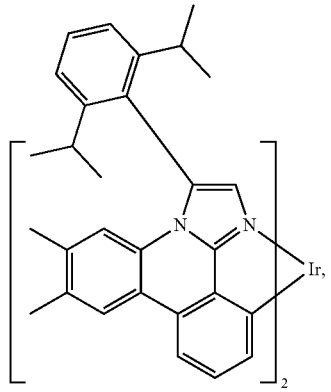

135
-continued
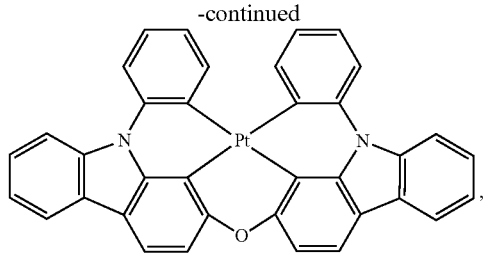
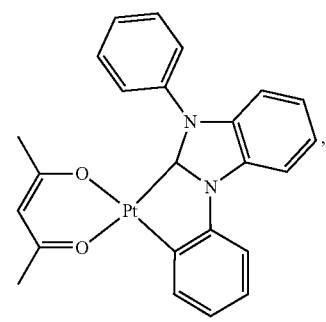
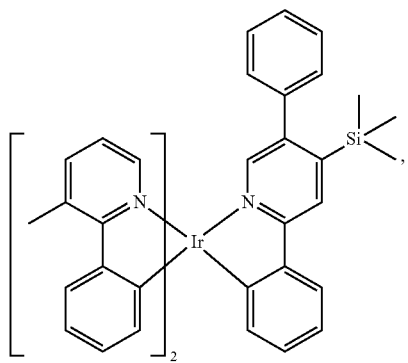
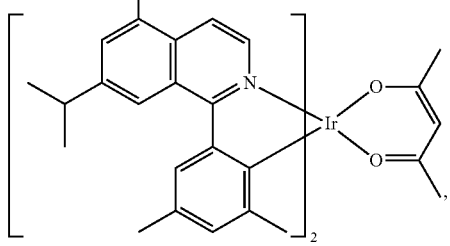
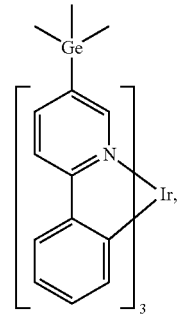
136
-continued
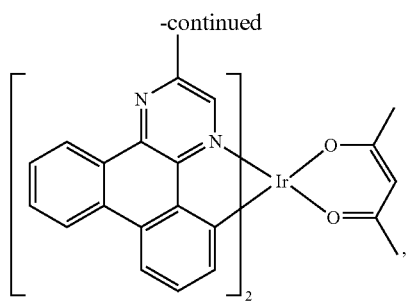
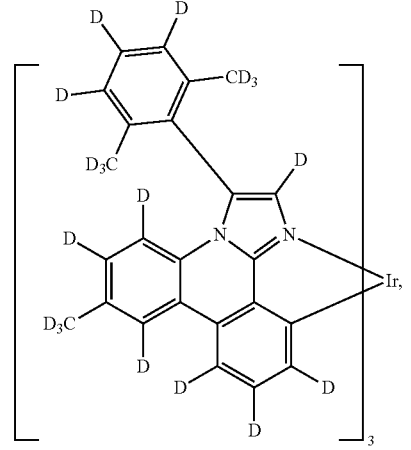
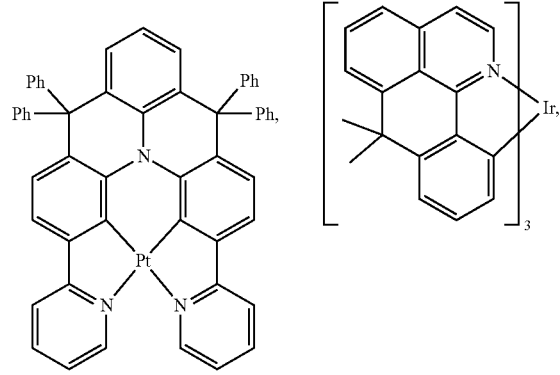
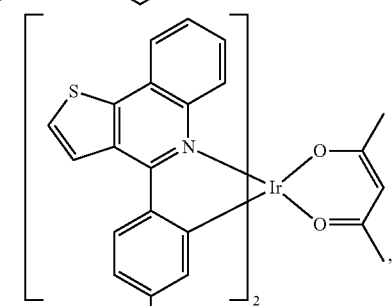
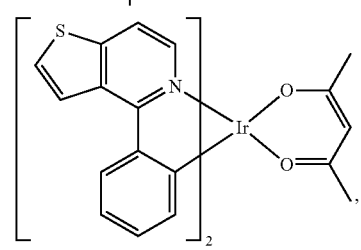

-continued
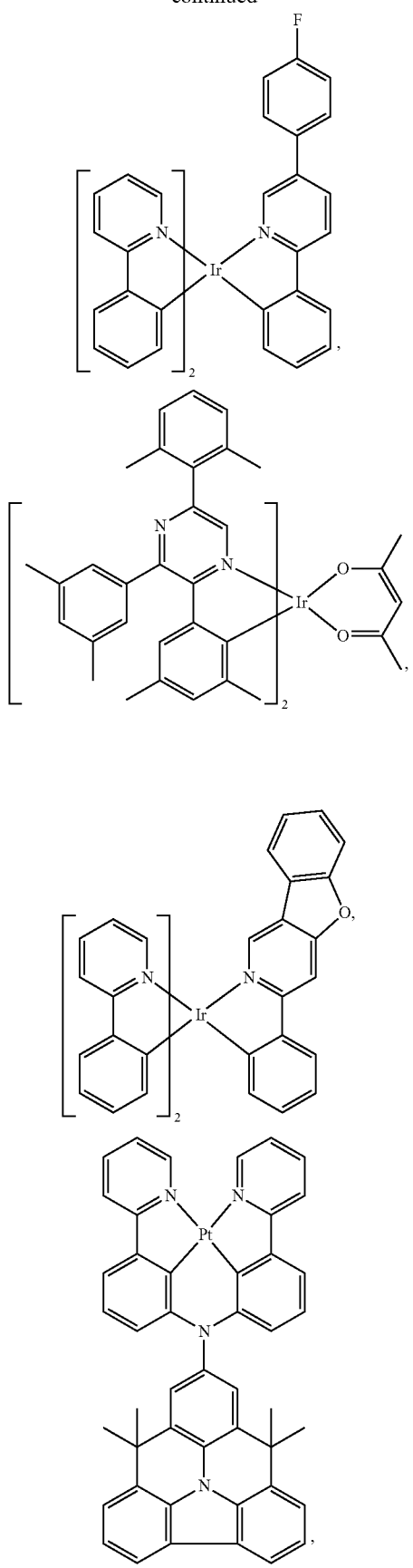
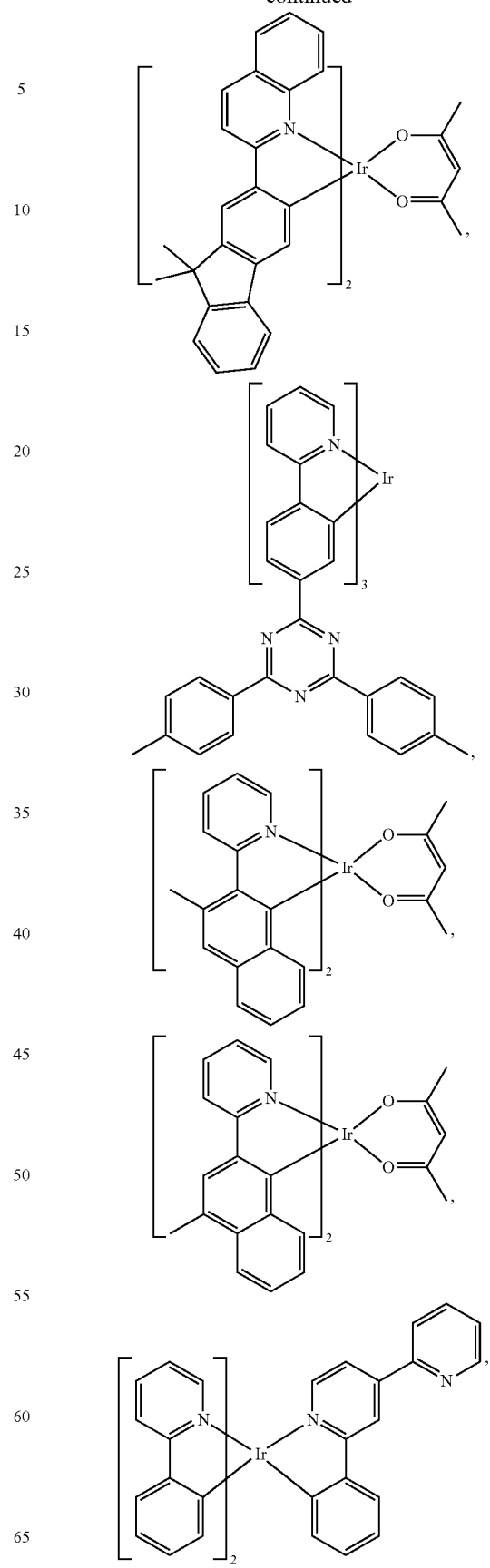

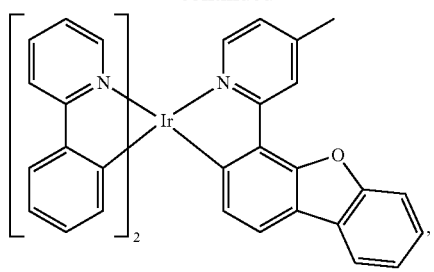
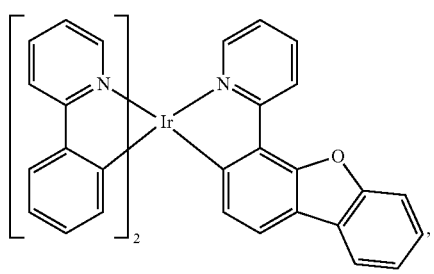
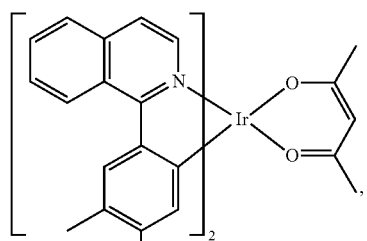
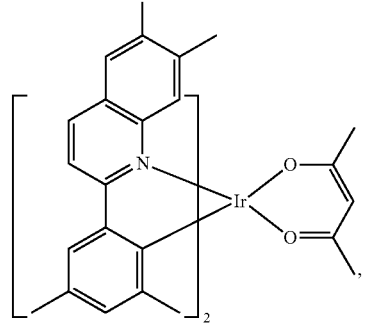
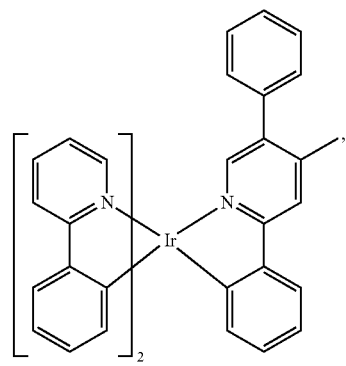
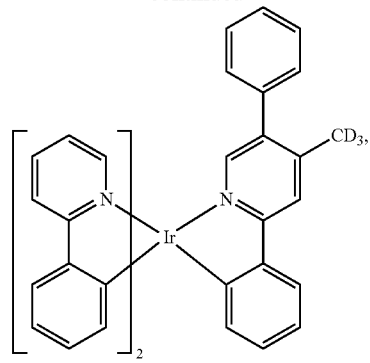
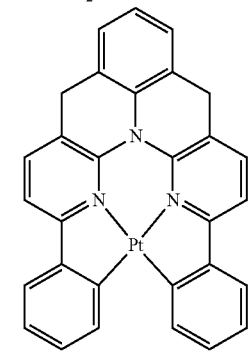
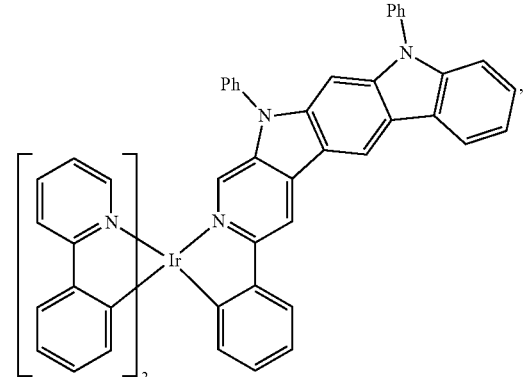
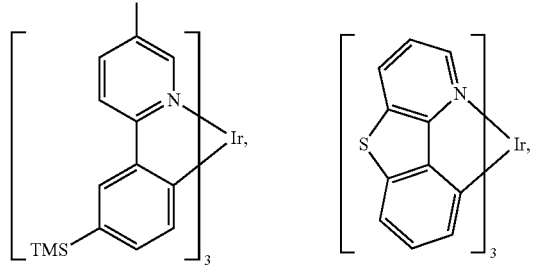
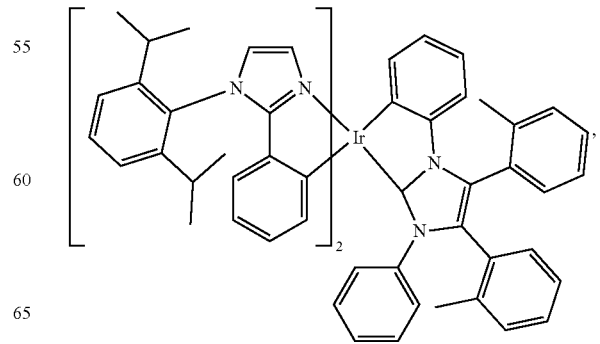

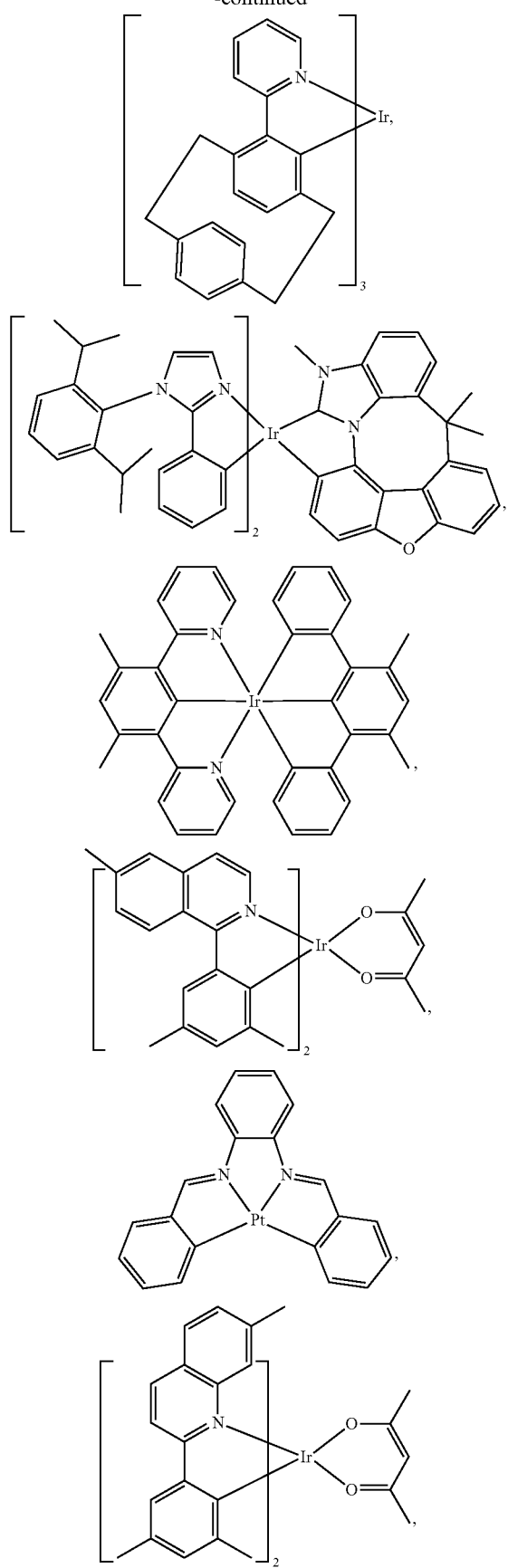
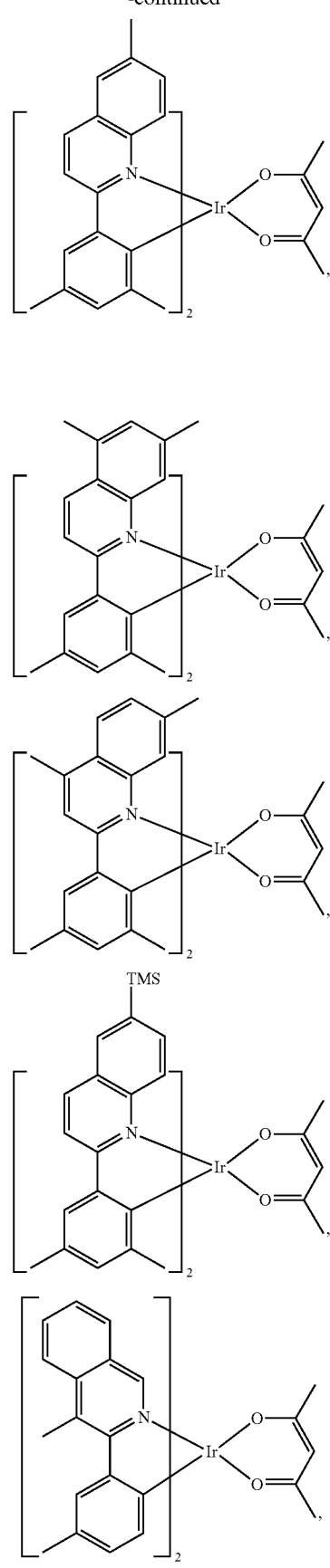

143
-continued
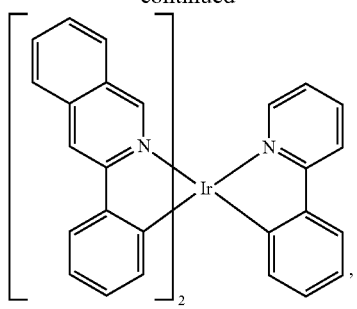
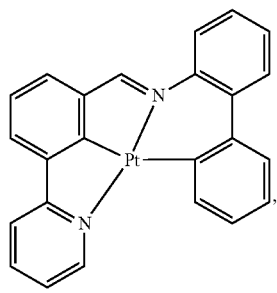
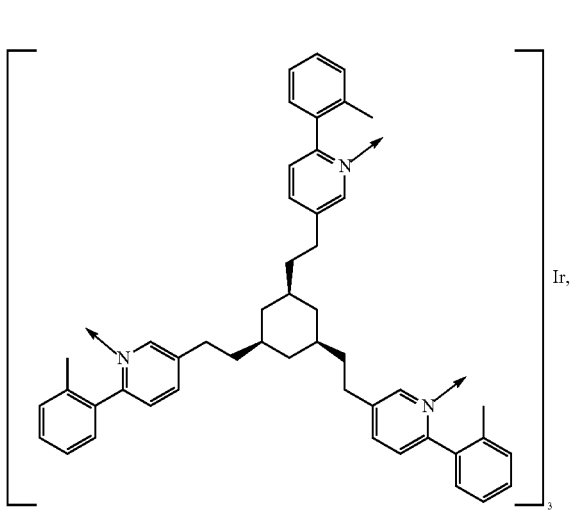
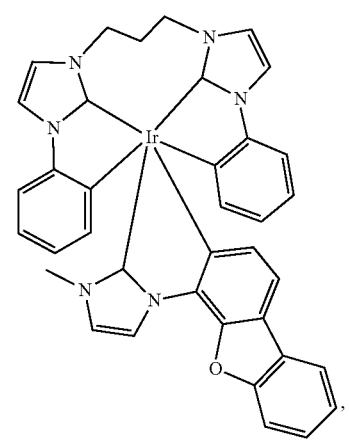
144
-continued
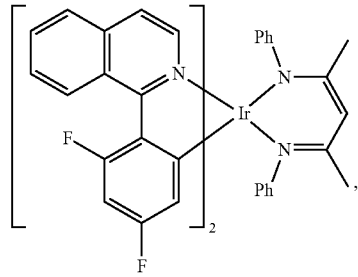
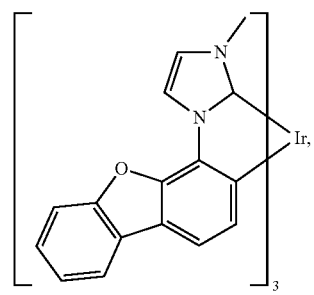
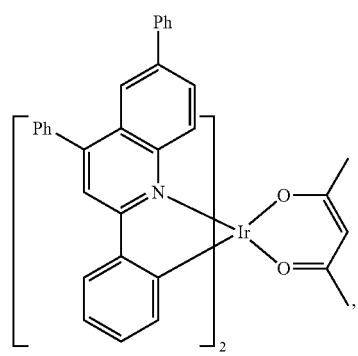
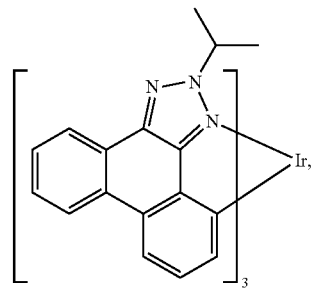
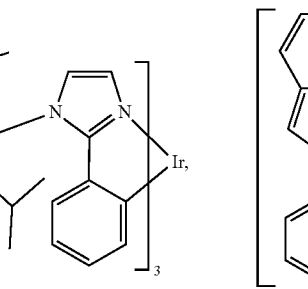

-continued

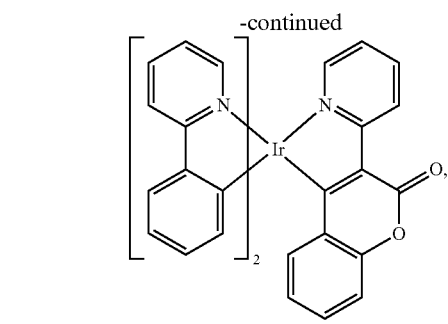
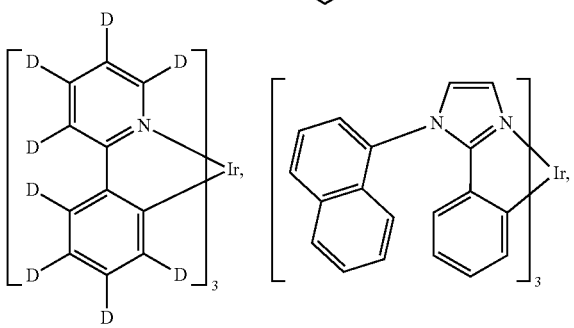
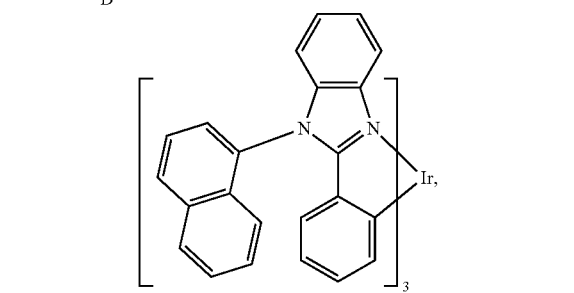
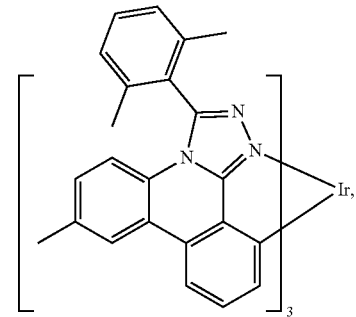
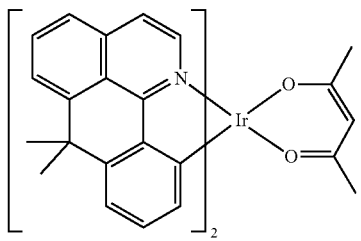
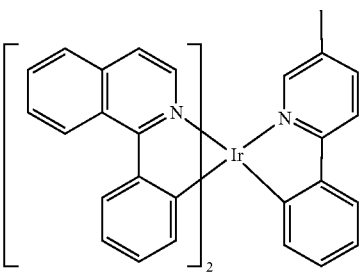

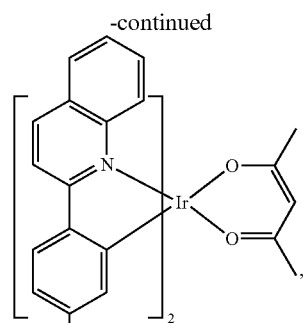
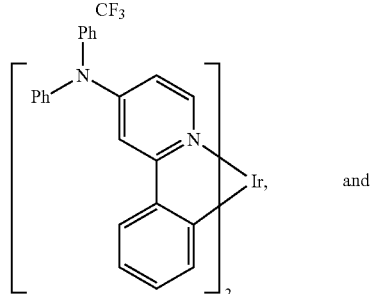
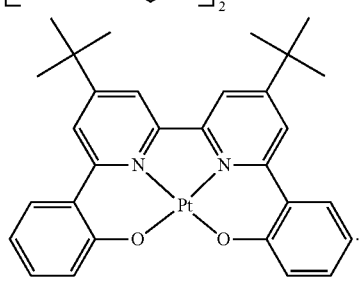

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

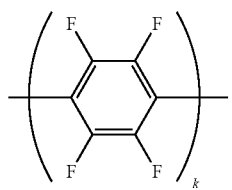
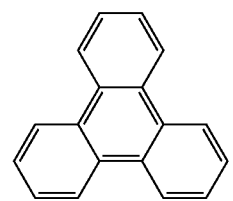

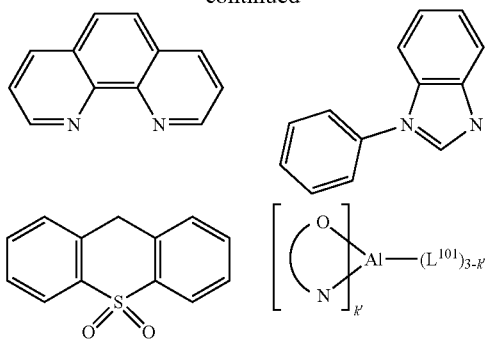

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

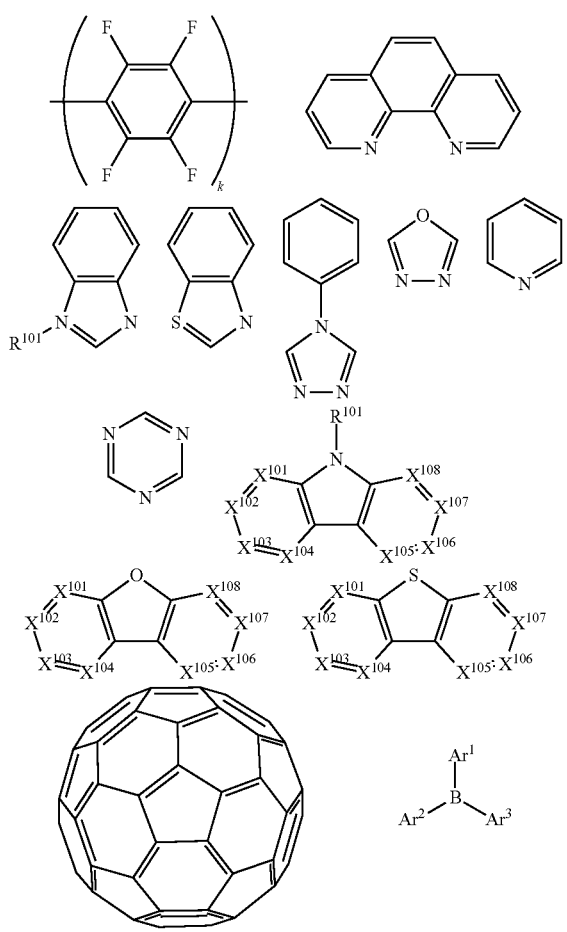

wherein $R^{101}$ is selected from the group consisting of hydrogen, deuterium, halide, alkyl, cycloalkyl, heteroalkyl, aryl-alkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL include, but are not limited to the following general formula:

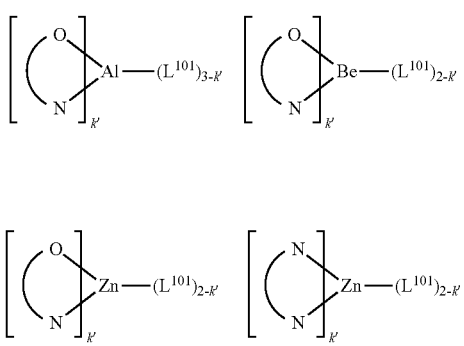

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

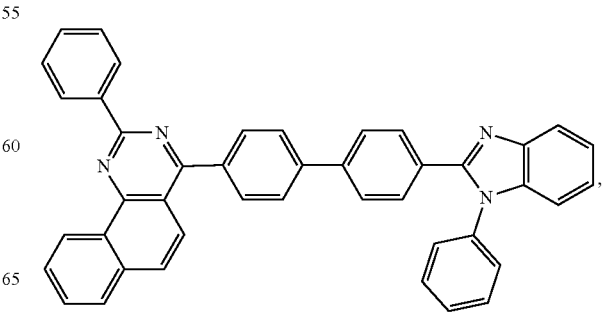

149
-continued
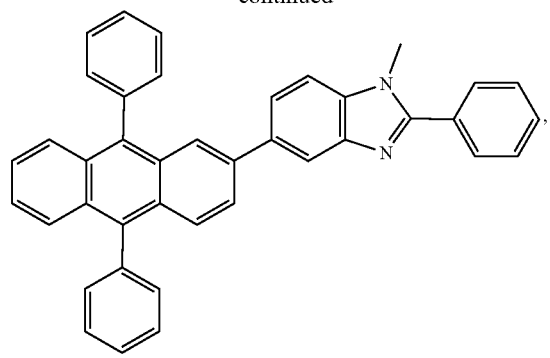
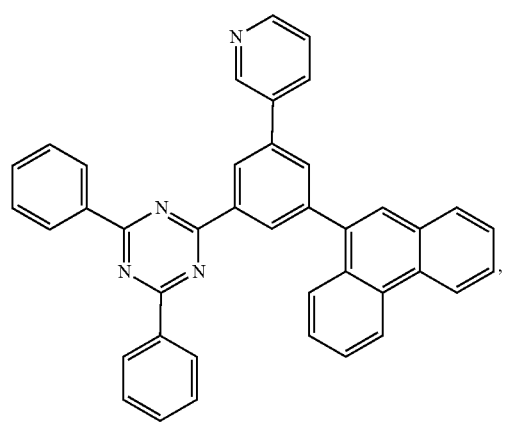
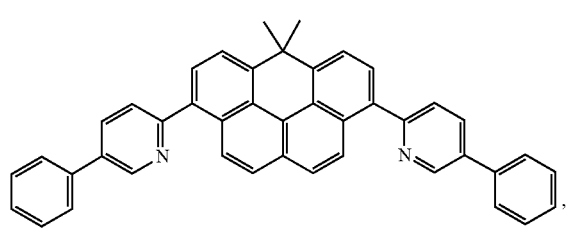
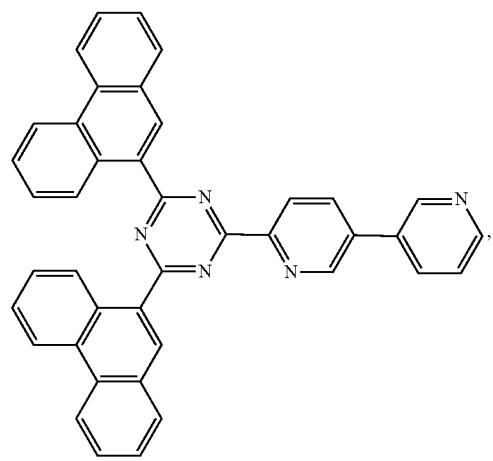
150
-continued
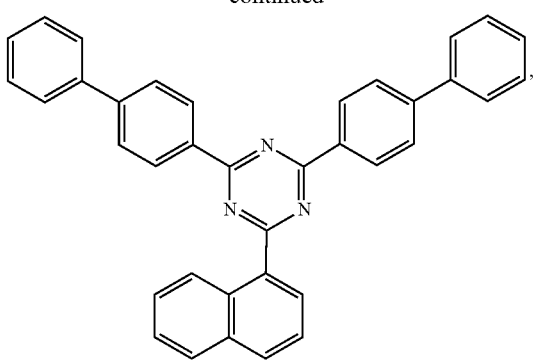
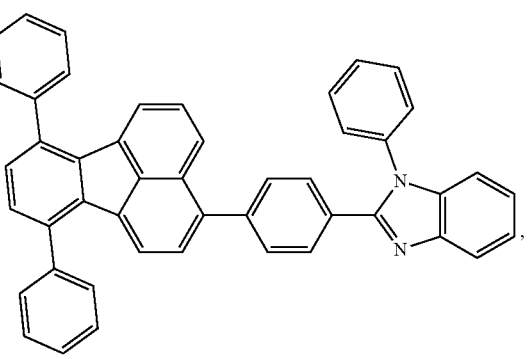
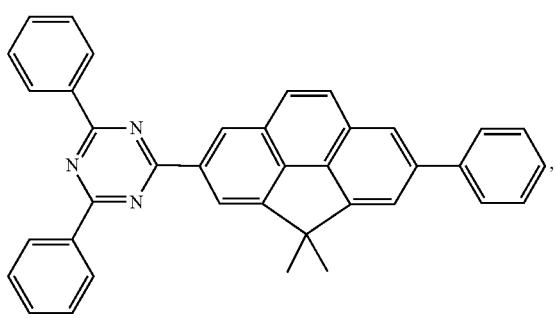
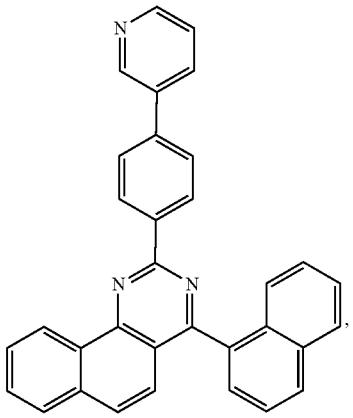

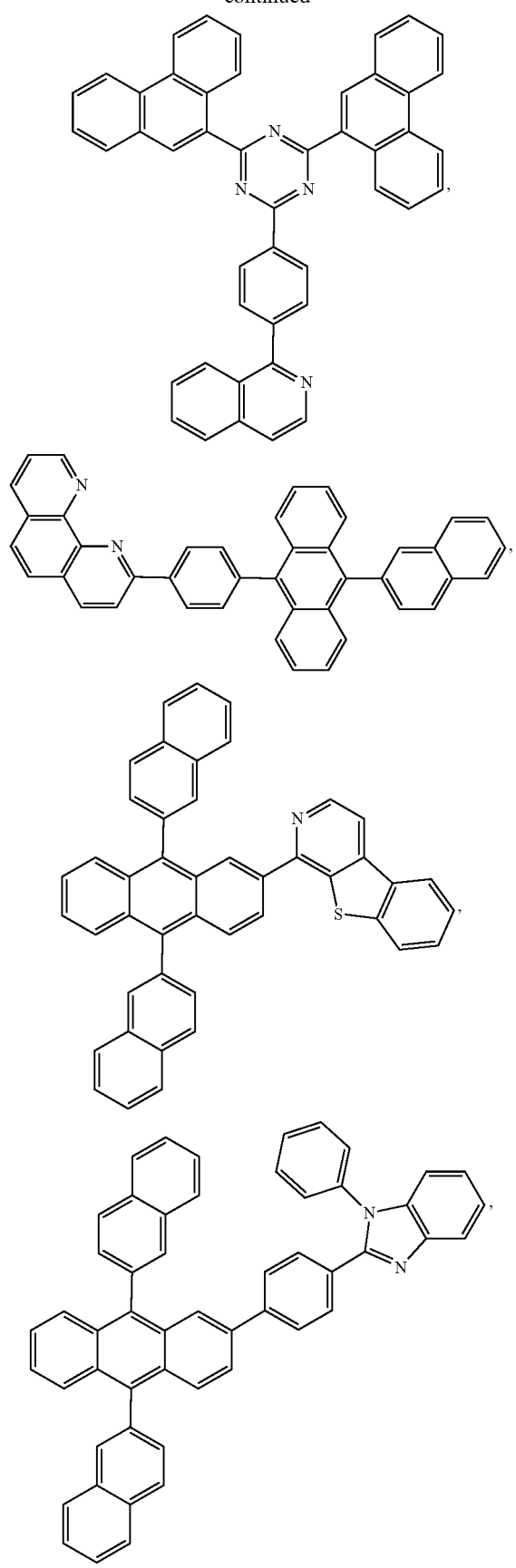

153
-continued
154
-continued
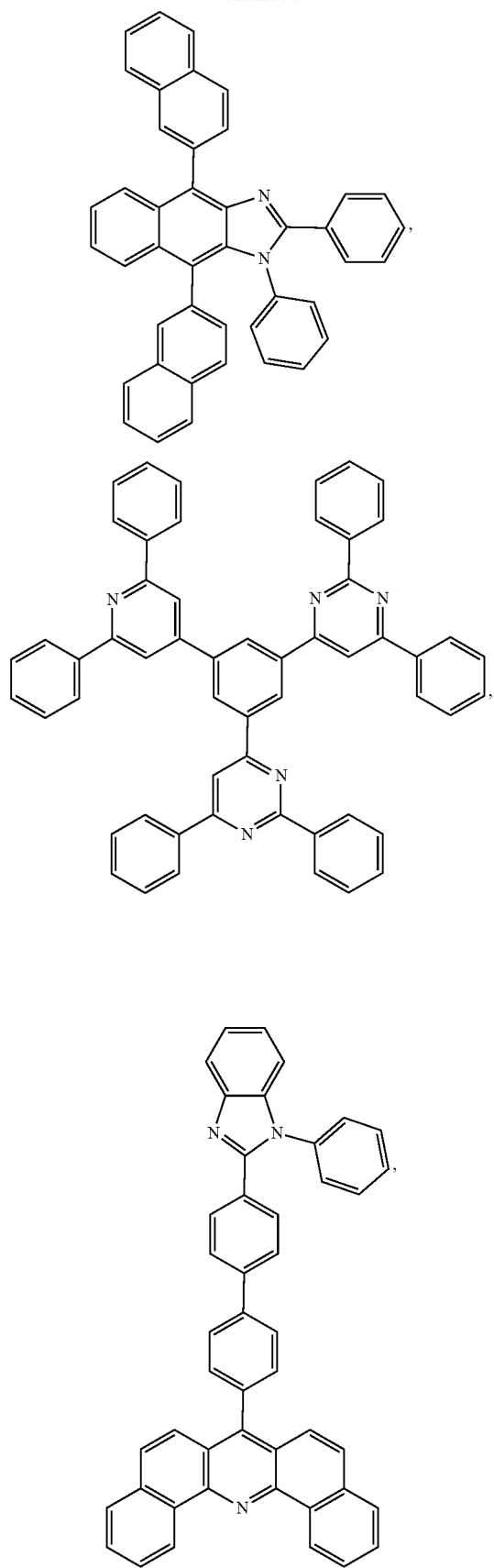
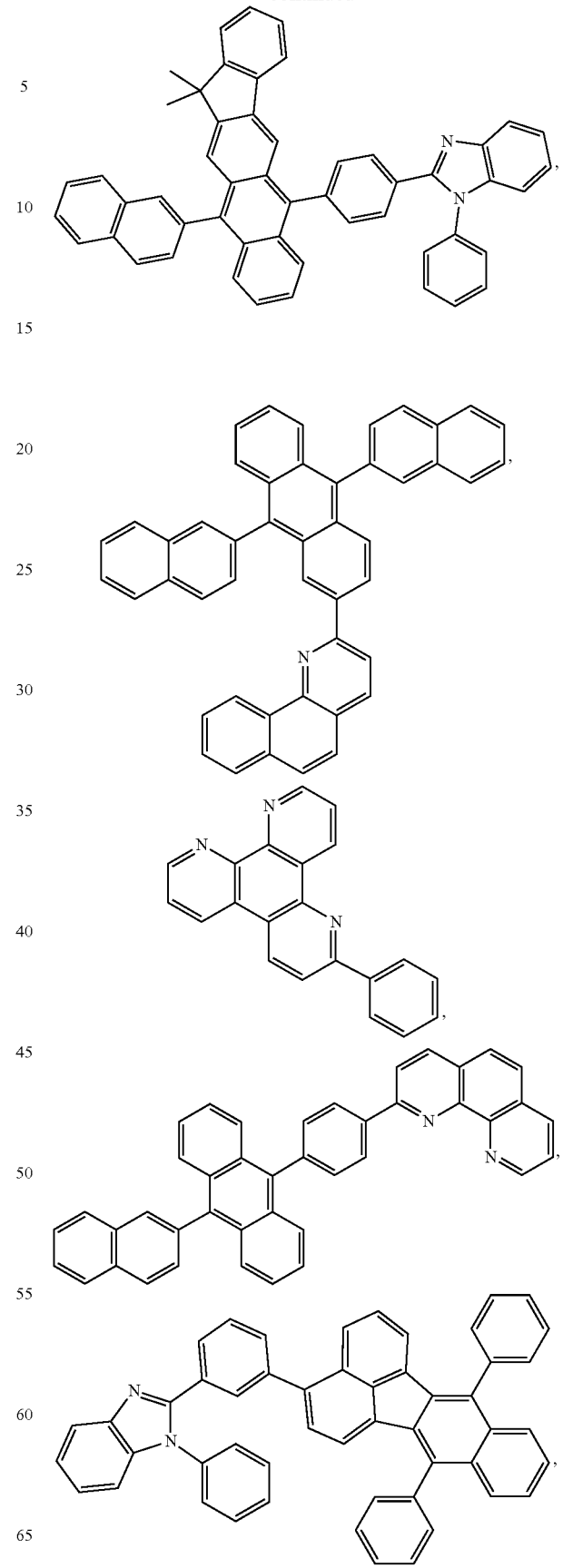

155
-continued
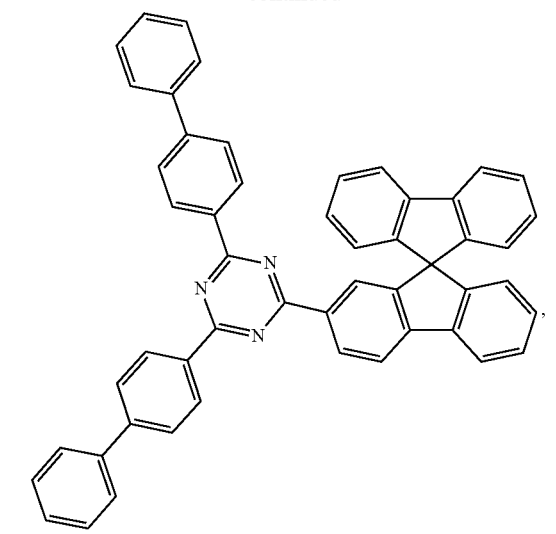
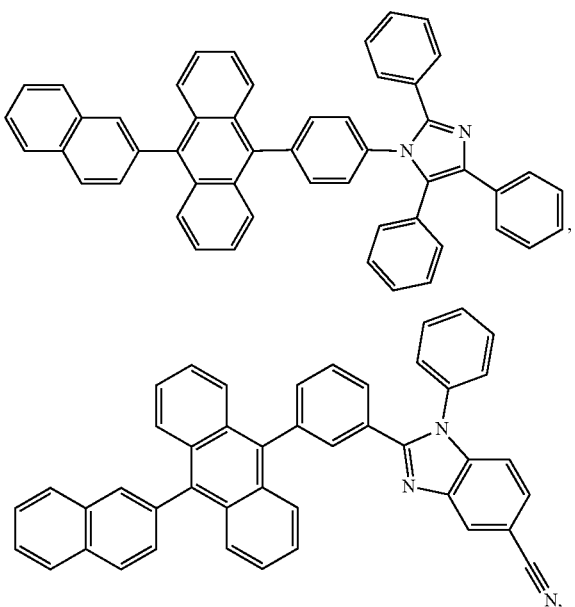
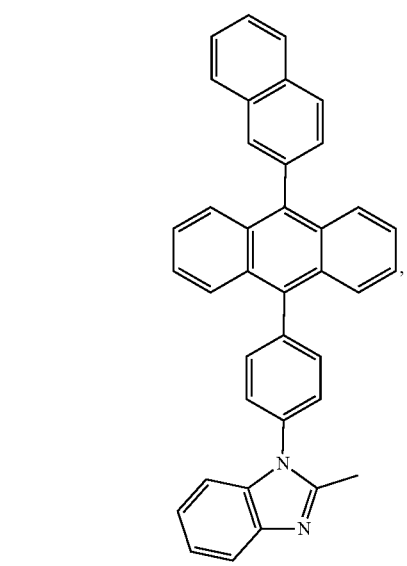
156
-continued
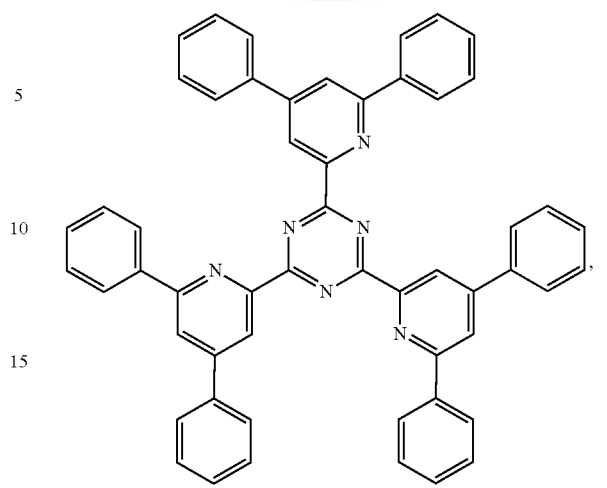
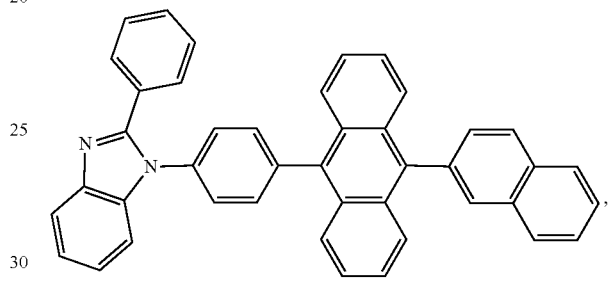
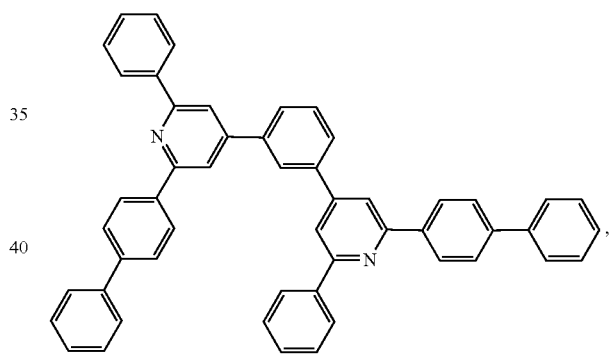
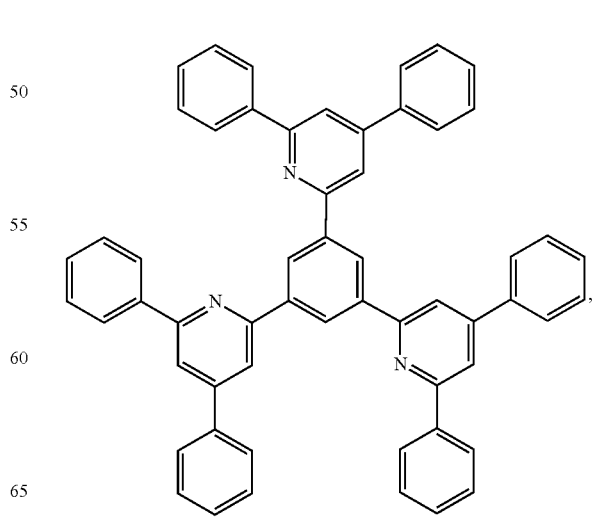

-continued

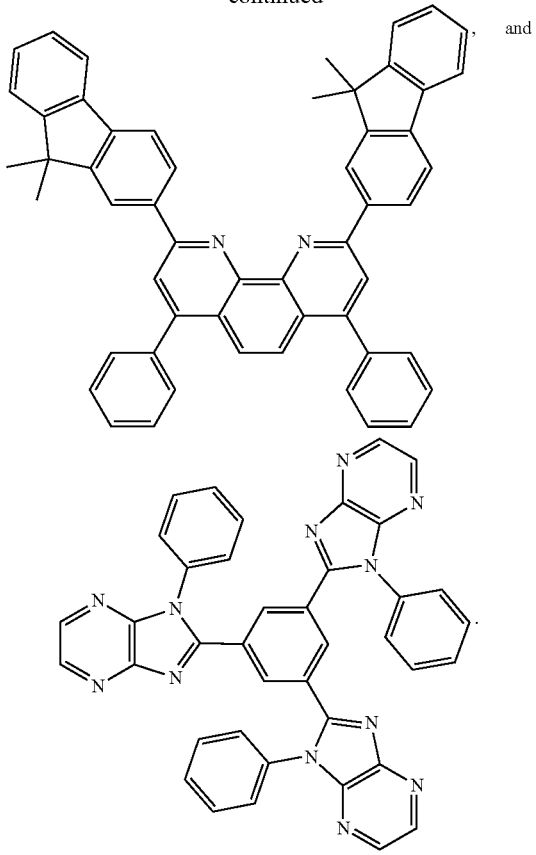, and

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic light emitting device (OLED), comprising:
   an anode;
   a cathode; and
   an organic emissive layer disposed between the anode and the cathode, the organic emissive layer comprising:
      a first host having a highest occupied molecular orbital (HOMO) energy, a lowest unoccupied molecular orbital (LUMO) energy, and a $T_1$ triplet energy, wherein the first host is an electron transporting host; and
      an emitter having a highest occupied molecular orbital (HOMO) energy, a lowest unoccupied molecular orbital (LUMO) energy, and a $T_1$ triplet energy, wherein the emitter is a blue emitter;
   wherein the emitter is a phosphorescent metal complex;
   wherein $E_{H1T}$, the $T_1$ triplet energy of the first host, is higher than $E_{ET}$, the $T_1$ triplet energy of the emitter;
   wherein $E_{ET}$ is at least 2.50 eV;
   wherein the LUMO energy of the first host is higher than the HOMO energy of the emitter;
   wherein the absolute value of the difference between the HOMO energy of the emitter and the LUMO energy of the first host is $\Delta E1$;
   wherein $a \leq \Delta E1 - E_{ET} \leq b$;
   wherein $a \geq 0.05$ eV, and $b \leq 0.60$ eV;
   wherein the emitter is selected from the group consisting of:

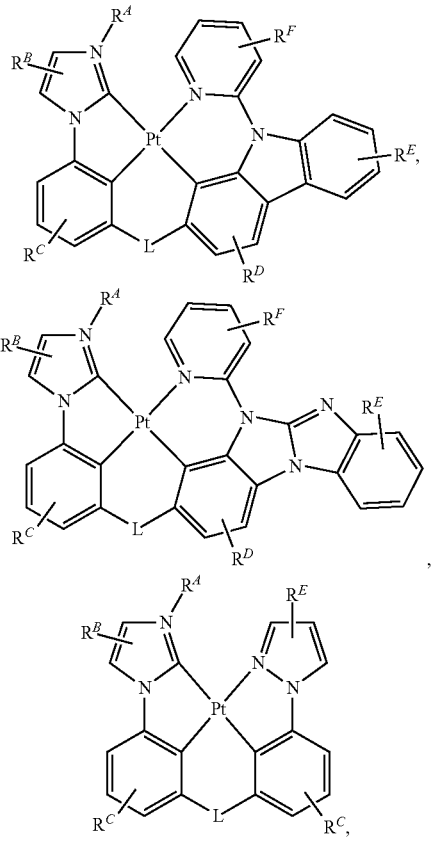

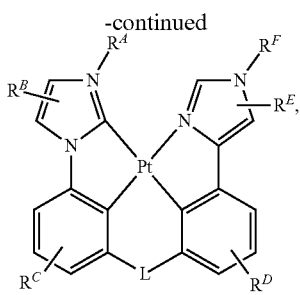

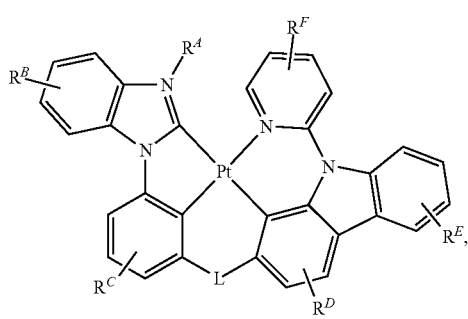

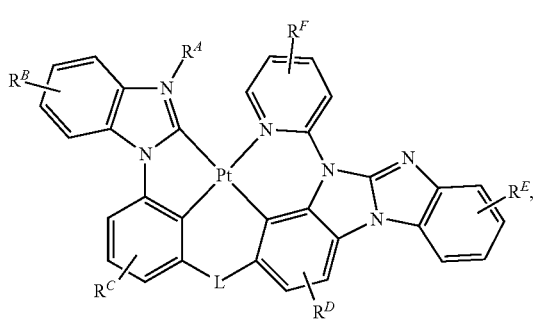

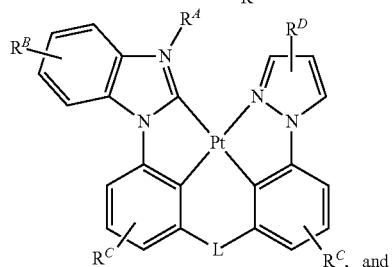

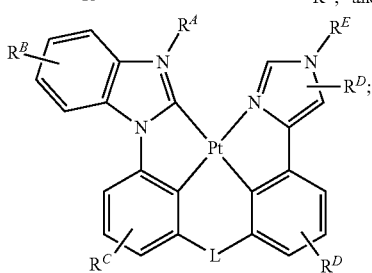

wherein L is selected from the group consisting of BR, NR, PR, O, S, CRR''', SiRR''', alkyl, cycloalkyl, aryl, and heteroaryl, wherein each $R^A$ to $R^F$ can represent from mono substitution to the possible maximum number of substitutions, or no substitution;

wherein R, R''', $R^B$ to $R^F$ are each independently a hydrogen or a substitution selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, boryl, and combinations thereof;

wherein $R^A$ is aryl, which can be further substituted by one or more substitutions, each independently selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, boryl, and combinations thereof;

wherein any two R, R''', $R^A$ to $R^F$ can be fused or joined to form a ring or form a multidentate ligand.

2. The OLED of claim 1, wherein R, R''', and $R^B$ to $R^F$ are each independently a hydrogen or a substituent selected from the group consisting of deuterium, fluorine, alkyl, cycloalkyl, alkoxy, aryloxy, amino, silyl, aryl, heteroaryl, sulfanyl, nitrile, and combinations thereof.

3. The OLED of claim 1, wherein at least one of R, R''', $R^A$ to $R^F$ comprises a chemical group containing at least three 6-membered aromatic rings that are not fused next to each other.

4. The OLED of claim 1, wherein the absolute value of the difference between the highest HOMO energy and the lowest LUMO energy among all components in the emissive layer is larger than $E_{ET}$ by at least a.

5. The OLED of claim 1, wherein the OLED further comprises a second host;
wherein $E_{H2T}$, the $T_1$ triplet energy of the second host, is higher than $E_{ET}$.

6. The OLED of claim 5, wherein the HOMO energy of the second host is lower than the HOMO energy of the first host, the LUMO energy of the second host is higher than the LUMO energy of the first host.

7. The OLED of claim 5, wherein the HOMO energy of the second host is higher than the HOMO energy of the first host, the LUMO energy of the second host is higher than the LUMO energy of the first host.

8. The OLED of claim 5, wherein the second host is a hole transporting host.

9. The OLED of claim 1, wherein the first host comprises at least one chemical group selected from the group consisting of pyridine, pyrimidine, pyrazine, triazine, imidazole, aza-triphenylene, aza-carbazole, aza-dibenzothiophene, aza-dibenzofuran, and aza-dibenzoselenophene.

10. The OLED of claim 1, wherein the first host comprises at least one chemical group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group.

11. The OLED of claim 1, wherein the emitter is selected from the group consisting of:

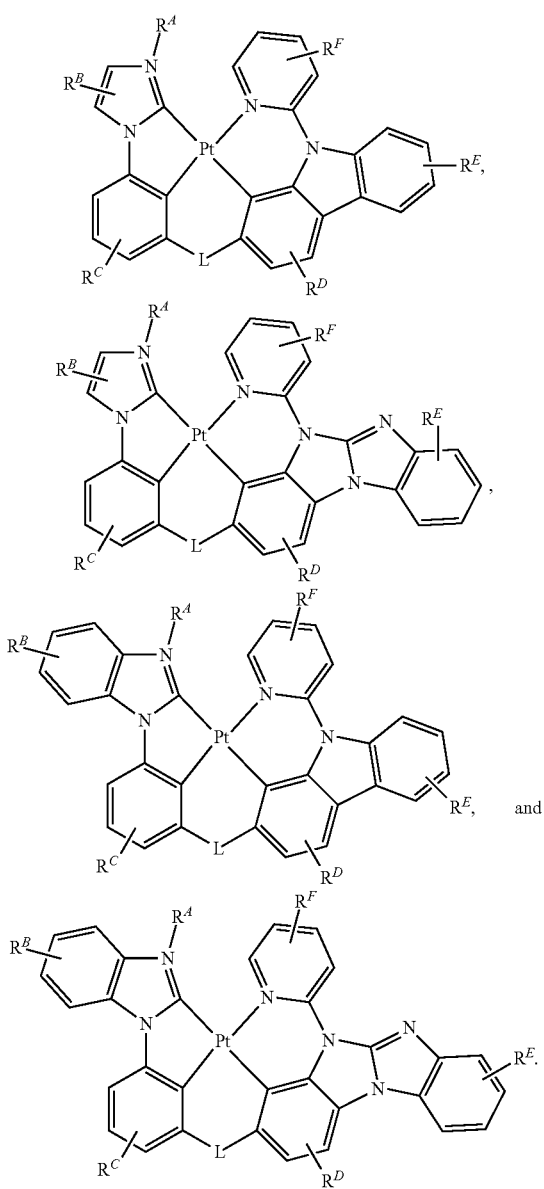

12. The OLED of claim 1, wherein $R^A$ comprises a chemical group containing at least three 6-membered aromatic rings that are not fused next to each other.

13. The OLED of claim 1, wherein a is 0.1 eV, and b is 0.50 eV.

14. The OLED of claim 1, wherein $E_{ET}$ is at least 2.60 eV.

15. The OLED of claim 1, wherein L is O.

16. The OLED of claim 1, wherein the OLED further comprises a delayed fluorescent emitter.

17. An organic light emitting device (OLED), comprising:
an anode;
a cathode; and
an organic emissive layer disposed between the anode and the cathode, the organic emissive layer comprising:
 a first host having a highest occupied molecular orbital (HOMO) energy, a lowest unoccupied molecular orbital (LUMO) energy, and a $T_1$ triplet energy, wherein the first host is an electron transporting host; and an emitter having a highest occupied molecular orbital (HOMO) energy, a lowest unoccupied molecular orbital (LUMO) energy, and a $T_1$ triplet energy;

wherein the emitter is a delayed fluorescent emitter;

wherein $E_{H1T}$, the $T_1$ triplet energy of the first host, is higher than $E_{ET}$, the $T_1$ triplet energy of the emitter;

wherein $E_{ET}$ is at least 2.50 eV;

wherein the LUMO energy of the first host is higher than the HOMO energy of the emitter;

wherein the absolute value of the difference between the HOMO energy of the emitter and the LUMO energy of the first host is $\Delta E1$;

wherein $a \leq \Delta E1 - E_{ET} \leq b$;

wherein $a \geq 0.05$ eV, and $b \leq 0.60$ eV.

18. The OLED of claim 17, wherein the first host comprises at least one chemical group selected from the group consisting of pyridine, pyrimidine, pyrazine, triazine, imidazole, aza-triphenylene, aza-carbazole, aza-dibenzothiophene, aza-dibenzofuran, aza-dibenzoselenophene, and a group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group.

19. The OLED of claim 17, wherein the OLED further comprises a phosphorescent metal complex.

20. A consumer product comprising an organic light emitting device (OLED) comprising:
an anode;
a cathode; and
an organic emissive layer disposed between the anode and the cathode, the organic emissive layer comprising:
 a first host having a highest occupied molecular orbital (HOMO) energy, a lowest unoccupied molecular orbital (LUMO) energy, and a $T_1$ triplet energy, wherein the first host is an electron transporting host; and an emitter having a highest occupied molecular orbital (HOMO) energy, a lowest unoccupied molecular orbital (LUMO) energy, and a $T_1$ triplet energy, wherein the emitter is a blue emitter;

wherein the emitter is selected from the group consisting of a phosphorescent metal complex, and a delayed fluorescent emitter;

wherein $E_{H1T}$, the $T_1$ triplet energy of the first host, is higher than $E_{ET}$, the $T_1$ triplet energy of the emitter;

wherein $E_{ET}$ is at least 2.50 eV;

wherein the LUMO energy of the first host is higher than the HOMO energy of the emitter;

wherein the absolute value of the difference between the HOMO energy of the emitter and the LUMO energy of the first host is $\Delta E1$;

wherein $a \leq \Delta E1 - E_{ET} \leq b$;

wherein $a \geq 0.05$ eV, and $b \leq 0.60$ eV;

wherein the phosphorescent metal complex is selected from the group consisting of:

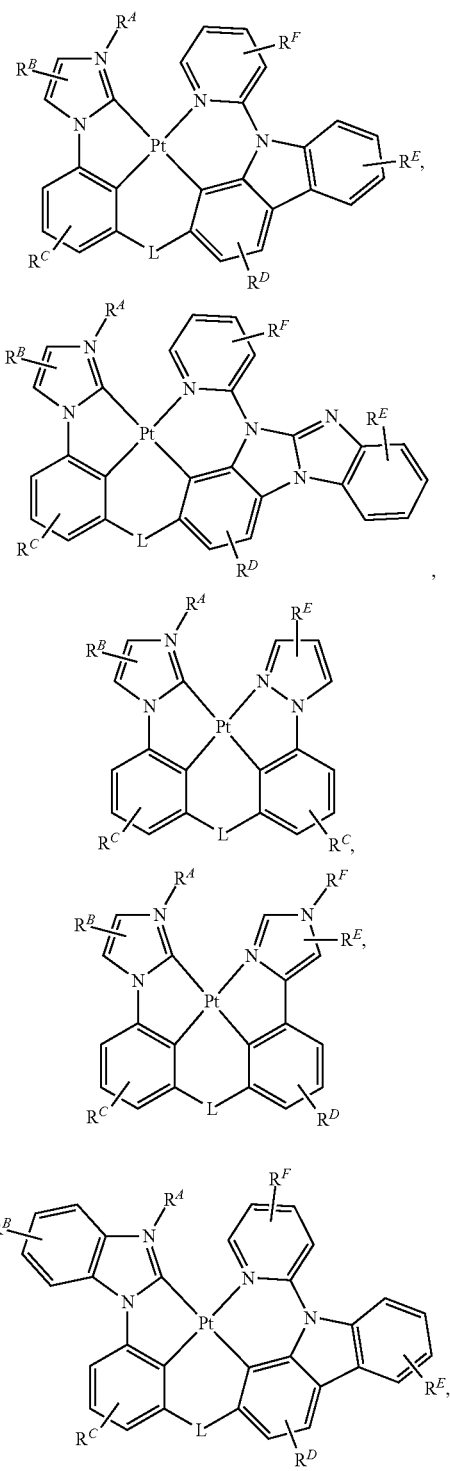
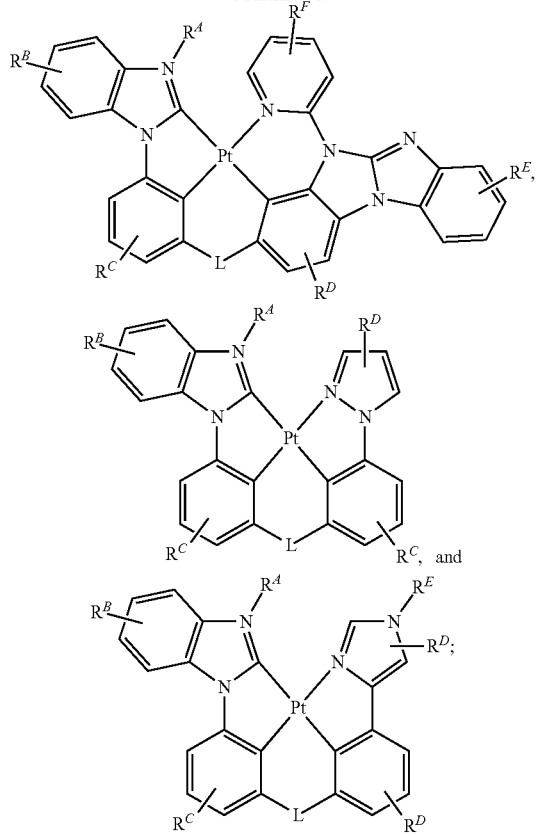

wherein L is selected from the group consisting of BR, NR, PR, O, S, CRR''', SiRR''', alkyl, cycloalkyl, aryl, and heteroaryl, wherein each $R^A$ to $R^F$ can represent from mono substitution to the possible maximum number of substitutions, or no substitution;

wherein R, R'''', $R^B$ to $R^F$ are each independently a hydrogen or a substitution selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, boryl, and combinations thereof;

wherein $R^A$ is aryl, which can be further substituted by one or more substitutions, each independently selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, boryl, and combinations thereof; and wherein any two R, R''', $R^A$ to $R^F$ can be fused or joined to form a ring or form a multidentate ligand.

* * * * *